(12) United States Patent
Hwang

(10) Patent No.: US 8,808,038 B2
(45) Date of Patent: Aug. 19, 2014

(54) SPRING CONTACT AND A SOCKET EMBEDDED WITH SPRING CONTACTS

(75) Inventor: Dong Weon Hwang, Seoul (KR)

(73) Assignees: Hicon Co., Ltd., Gyeonggi-do (KR); Dong Weon Hwang, Seoul (KR)

( * ) Notice: Subject to any disclaimer, the term of this patent is extended or adjusted under 35 U.S.C. 154(b) by 91 days.

(21) Appl. No.: 13/509,496

(22) PCT Filed: Oct. 28, 2010

(86) PCT No.: PCT/KR2010/007459
§ 371 (c)(1),
(2), (4) Date: May 11, 2012

(87) PCT Pub. No.: WO2011/059192
PCT Pub. Date: May 19, 2011

(65) Prior Publication Data
US 2012/0238136 A1    Sep. 20, 2012

(30) Foreign Application Priority Data
Nov. 11, 2009  (KR) .................. 10-2009-0108375

(51) Int. Cl.
*H01R 13/24* (2006.01)
(52) U.S. Cl.
USPC ............................. 439/700; 439/66; 439/824
(58) Field of Classification Search
USPC ............... 439/607.01, 700, 824, 482, 66, 931
See application file for complete search history.

(56) References Cited

U.S. PATENT DOCUMENTS

| 7,025,602 | B1* | 4/2006 | Hwang ........................... 439/66 |
| 8,157,601 | B2* | 4/2012 | Lin et al. ....................... 439/700 |
| 8,535,093 | B1* | 9/2013 | Mason ..................... 439/607.05 |
| 2006/0046527 | A1* | 3/2006 | Stone et al. ..................... 439/66 |
| 2006/0073710 | A1* | 4/2006 | Hwang ........................... 439/66 |
| 2007/0141877 | A1 | 6/2007 | Lee et al. |
| 2009/0183908 | A1 | 7/2009 | Kazama et al. |
| 2011/0014814 | A1* | 1/2011 | Chang et al. ............. 439/607.05 |
| 2013/0012076 | A1* | 1/2013 | Hwang .......................... 439/824 |

FOREIGN PATENT DOCUMENTS

| KR | 10-2006-0127960 A | 12/2006 |
| KR | 10-2007-0075699 A | 7/2007 |
| KR | 10-2008-0015512 A | 2/2008 |

* cited by examiner

*Primary Examiner* — Hae Moon Hyeon
(74) *Attorney, Agent, or Firm* — Rabin & Berdo, P.C.

(57) ABSTRACT

A spring contact and a socket embedded with spring contacts. The spring contact includes an upper contact pin having a contact portion, two spring holding protrusions and a body, a lower contact pin coupled to the upper contact pin, and a spring fitted over the assembly of the upper and lower contact pins, wherein the body has two symmetric elastic portions with both an oblique surface and a locking protrusion, in which a moving slit is formed between the elastic portions so as to provide a moving space for an opposite contact pin, with moving grooves being formed to movably receive the locking protrusions of an opposite contact pin and to be in electric contact with the locking protrusions.

22 Claims, 75 Drawing Sheets

SPRING CONTACT AND A SOCKET EMBEDDED WITH SPRING CONTACTS

TECHNICAL FIELD

The present invention relates, in general, to a spring contact and a socket embedded with spring contacts and relates, more particularly, to a spring contact and a socket embedded with spring contacts, in which the spring contacts are embedded in a test socket that is used to test the performance of an integrated circuit (IC) and connect a plurality of leads of the IC to a plurality of pads of a Printed Circuit Board (PCB), respectively, and relates to a spring contact and a socket embedded with spring contacts, in which the spring contacts electrically connect the leads of an IC of a Central Processing Unite (CPU) to a PCB of an electronic appliance, such as a personal computer (PC) or a mobile phone, and relates, more widely, to a spring contact and a socket embedded with spring contacts, in which the spring contact electrically connects one side to another side.

BACKGROUND ART

As shown in FIGS. 1 through 4b, a conventional spring contact 100 is an important element of an IC test socket, in which the spring contact functions to electrically connect a lead of the IC to a PCB.

Hereinbelow, the construction, operational function and problems of the conventional spring contact will be described in detail with reference to FIGS. 1 through 4b.

The conventional spring contact 100 includes: an upper contact pin 110 which is provided with a contact portion 111 that has a predetermined shape and is brought into contact with a lead of a separate semiconductor IC to be inspected, two holding protrusions 112 and 113 that are provided in left and right sides of the spring contact and limit a length of an assembled spring and prevent the assembled spring from being displaced, a spring holding surface 150 that is formed by the two spring holding protrusions, and a body 118; a lower contact pin 130 that is coupled to the upper contact pin 110 in such a way that the two contact pins cross each other at right angles; and a spring 190 that is fitted over an assembly of the upper and lower contact pins at a position between the upper and lower contact pins. Here, the body 118 has two symmetric elastic portions 119 each of which has an oblique surface 122, a contact surface 123 and a locking protrusion 121 on an end thereof. A moving slit 120 is formed between the two elastic portions 119 and forms a moving space in which the lower contact pin can move; a stop surface 140 is formed on an end of the moving slit 120, so that the moving slit 120 movably receives the locking protrusions 121 of the lower contact pin 130. The body 118 further has a moving opening 116 and side walls 115, which make electric contact with the contact surfaces 123 and side contact portions 124 of the locking protrusions 121 of the lower contact pin 130. Here, one end of the moving opening 116 forms a stop bridge 117 and the other end extends to the spring holding surface 150 which is formed by the two left and right spring holding protrusions that function to limit the length of the assembled spring and to prevent the spring from being undesirably displaced.

Hereinbelow, the operational relationship of the spring contact will be described with reference to FIGS. 4a and 4b.

FIG. 4a is a view illustrating the operation of the conventional spring contact, and FIG. 4b is a view illustrating the maximum compressed distance of the conventional spring contact.

Here, in FIG. 4a, the left-sided figure illustrates an initial assembled state of the conventional spring contact and the right-sided figure illustrates a state in which the spring contact has been compressed by a distance S.

Further, a distance Smax, by which the stop surfaces 140 of the upper and lower contact pins are moved from the initial assembled state that is shown in the left-sided figure of FIG. 4a to a state in which the stop surfaces 140 come into contact with each other as shown in FIG. 4b, is the maximum operating distance of the spring contact. In the above state, the stop surfaces of the upper and lower contact pins come into contact with each other, each of the contact surfaces 123 of the bodies of the upper and lower contact pins is placed in the moving opening 116 of an opposite contact pin, and each of the ends 149 of the bodies of the upper and lower contact pins reaches the holding protrusions 112 and 113 that are formed in an opposite contact pin so as to limit the length of the assembled spring and to prevent the spring from being displaced.

DISCLOSURE

Technical Problem

Accordingly, the present invention has been made keeping in mind the above problems occurring in the related art, and is intended to provide a spring contact and a socket embedded with spring contacts, in which the contact springs can solve the problem of the general construction of a conventional spring contact and the construction of a socket embedded with conventional spring contacts not being able to be efficiently used in test sockets for testing ICs that have been rapidly improved and greatly diversified, nor can these constructions be used in a variety of sockets that are installed in electronic appliances, and to provide a spring contact and a socket which can be efficiently adapted to various applications and can be efficiently used in special cases and under specific conditions.

In detail, in order to solve the problems of the conventional spring contact which cannot efficiently perform superhigh-speed signal processing, the present invention serves to provide a spring contact and a socket embedded with spring contacts, which can provide a construction for the spring contact and a construction for the socket embedded with spring contacts that can realize a spring contact having a minimum length (1.0 mm or less) and an electromagnetic wave shielding type socket, and which can be efficiently used to test target items having lead arrays of fine pitches (0.4 mm or less), such as leads of ICs or LCDs, and which can provide a variety of soldered spring contacts and a socket embedded with soldered spring contacts.

Technical Solution

In an aspect, the present invention provides a spring contact and a socket embedded with spring contacts, in which the spring contact includes: a lower contact pin that has a plate shape and a predetermined body thickness t, and is provided with a contact portion of a predetermined shape, two spring holding protrusions that are provided in left and right sides of the contact pin so as to limit a length of an assembled spring and prevent the spring from being undesirably displaced, and a body; an upper contact pin that is coupled to the lower contact pin in such a way that the upper and lower contact pins cross each other at right angles, the upper contact pin having a construction that is the same as or similar to that of the lower contact pin; and a spring that is fitted over an assembly of the upper and lower contact pins at a position between the upper and lower contact pins, wherein the body of each of the upper and lower contact pins includes: two symmetric elastic portions, an end of each of which has a thickness t1 that is less than a body thickness, with an oblique surface, a locking protrusion and a locking protrusion contact surface being provided in an end of each of the two symmetric elastic portions; a moving slit that is defined between the two elastic portions so as to form a moving space when the upper contact pin and the lower contact pin are assembled with each other, with a stop surface being formed on an end of the moving slit and having left and right oblique surfaces so that, when the upper contact pin is in contact with the lower contact pin and compressed to the maximum, the stop surfaces of the two contact pins come into contact with each other and stop the compression; and moving grooves that are formed in each of the lower and upper contact pins so that the locking protrusions of the lower and upper contact pins can be moved along and stopped by the moving grooves and the locking protrusion contact surfaces of the lower and upper contact pins can be brought into electric contact with the moving grooves, the moving grooves being formed on upper and lower surfaces of each of the lower and upper contact pins, in which first ends of the moving grooves of each of the upper and lower contact pins have a stop hole that forms a stop bridge for stopping the locking protrusions of an opposite contact pin, and second ends extend in directions toward the contact portion or extend to an end of the contact portion after passing spring holding surfaces of the two spring holding protrusions that function to limit the length of the assembled spring and to prevent the spring from being undesirably displaced.

Advantageous Effects

As described above, the present invention provides the construction for a spring contact and the construction for a socket embedded with spring contacts, which can realize a spring contact having a minimum length (1.0 mm or less) capable of efficiently performing superhigh-speed signal processing, and which can realize an electromagnetic wave shielding type socket, and which can realize an eccentric spring contact and a socket embedded with eccentric spring contacts that can be efficiently used to test target items having lead arrays of fine pitches (0.4 mm or less), such as leads of ICs or LCDs, and which can provide a variety of soldered spring contacts and a socket embedded with soldered spring contacts.

DESCRIPTION OF DRAWINGS

FIG. 3b is a sectional view taken along the arrow-line 3b in FIG. 3a;

FIG. 5b is a sectional view taken along the arrow-line 5b in FIG. 5a;

FIG. 6b is a sectional view taken along the arrow-line 6b in FIG. 6a;

FIG. 7b is a sectional view taken along the arrow-line 7b in FIG. 7a;

FIG. 7c is a perspective view of FIG. 7a;

FIG. 8b is a perspective view of FIG. 8a;

FIG. 9b is a sectional view taken along the arrow-line 9b in FIG. 9a;

FIG. 11b is a sectional view taken along the arrow-line 11b in FIG. 11a;

FIG. 11c is sectional view taken along the arrow-line 11c in FIG. 11a;

FIG. 13b is a right side view of FIG. 13a;

FIG. 13c is a sectional view taken along the arrow-line 13c in FIG. 13a;

FIG. 14b is a sectional view taken along the arrow-line 14b in FIG. 14a;

FIG. 15b is a sectional view taken along the arrow-line 15b in FIG. 15a;

FIG. 15c is a sectional view taken along the arrow-line 15c in FIG. 15a;

FIG. 16b is a sectional view taken along the arrow-line 16b in FIG. 16a;

FIG. 18b is a right side view of FIG. 18a;

FIG. 19b is a right side view of FIG. 19a;

FIG. 20b is a right side view of FIG. 20a;

FIG. 21b is a right side view of FIG. 21a;

FIG. 22b is a right side sectional view of FIG. 22a;

FIG. 22c is a front sectional view of FIG. 22a;

FIG. 22d is a bottom view of FIG. 22a;

FIG. 24b is a sectional view taken along the arrow-line 24b in FIG. 24a;

FIG. 25b is a sectional view taken along the arrow-line 25b in FIG. 25a;

FIG. 27b is a sectional view taken along the arrow-line 27b in FIG. 27a;

FIG. 27c is a sectional view taken along the arrow-line 27c in FIG. 27a;

FIG. 28b is a sectional view taken along the arrow-line 28b in FIG. 28a;

FIG. 29b is a sectional view taken along the arrow-line 29b in FIG. 29a;

FIG. 29c is a sectional view taken along the arrow-line 29c in FIG. 29a;

FIG. 32b is a sectional view taken along the arrow-line 32b in FIG. 32a;

FIG. 32c is a sectional view taken along the arrow-line 32c in FIG. 32a;

FIG. 34b is a sectional view taken along the arrow-line 34b in FIG. 34a;

Figure 1:
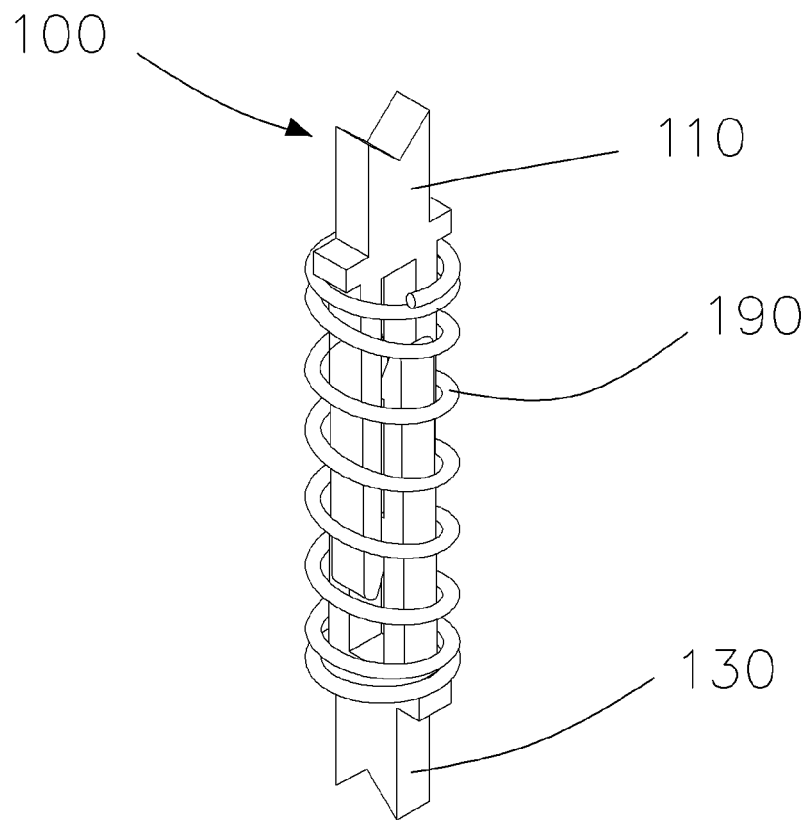
FIG. 1 is a view illustrating a conventional spring contact.
Figure 2:
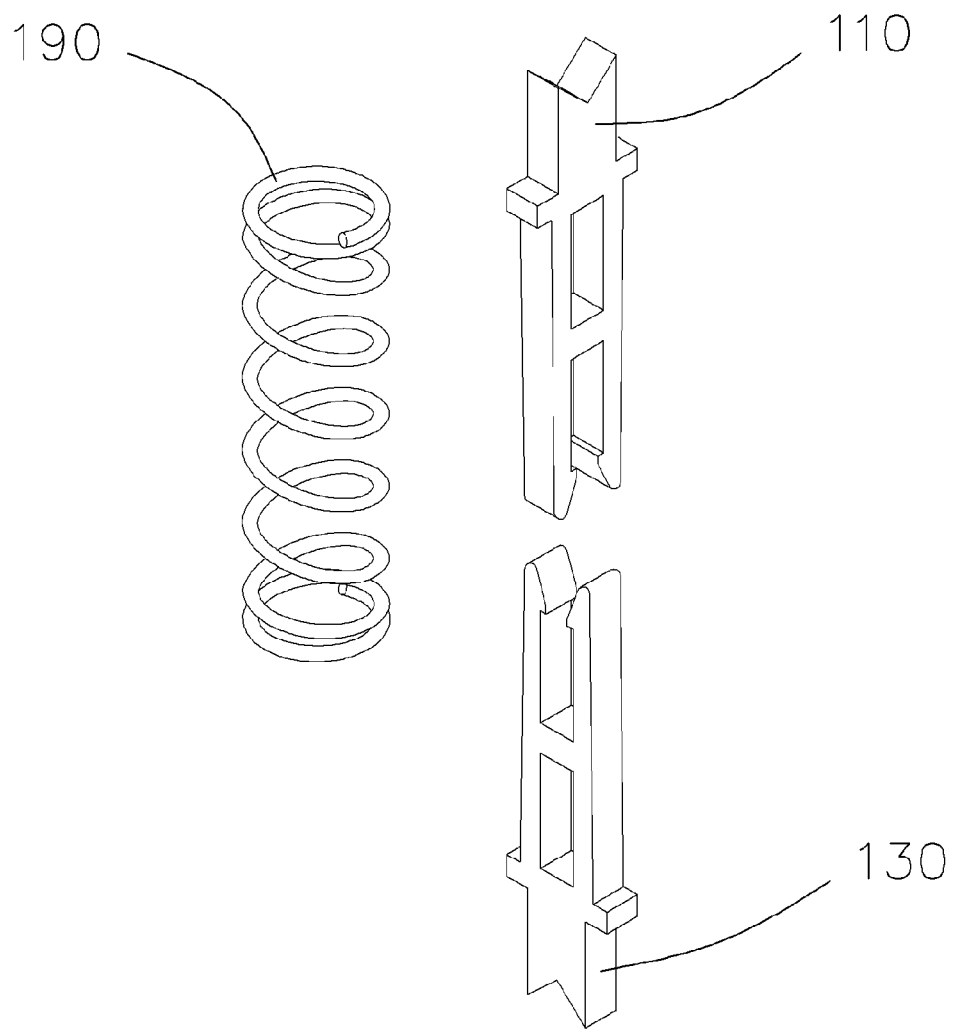
FIG. 2 is an exploded perspective view illustrating parts of the conventional spring contact.
Figure 3A:
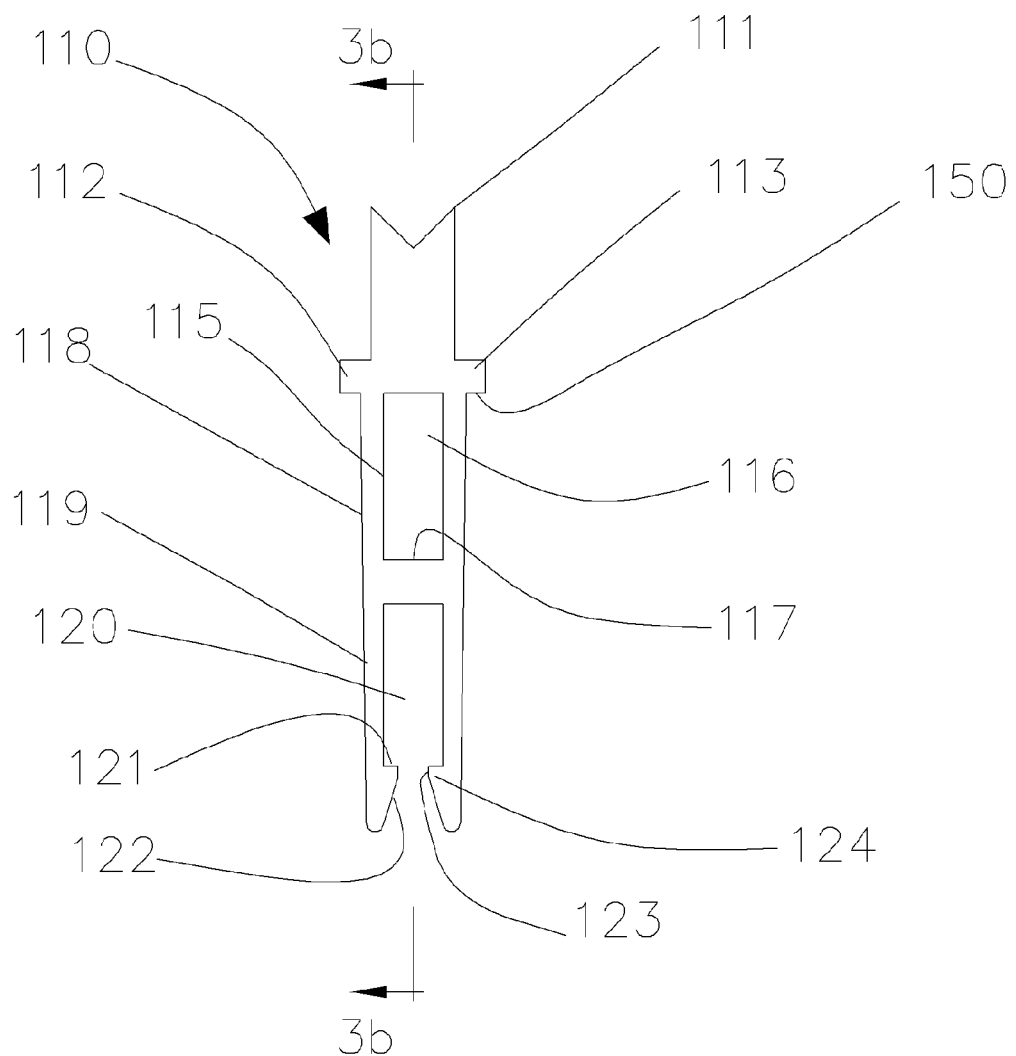
FIG. 3a is a plan view illustrating the construction of the conventional spring contact.
Figure 3B:
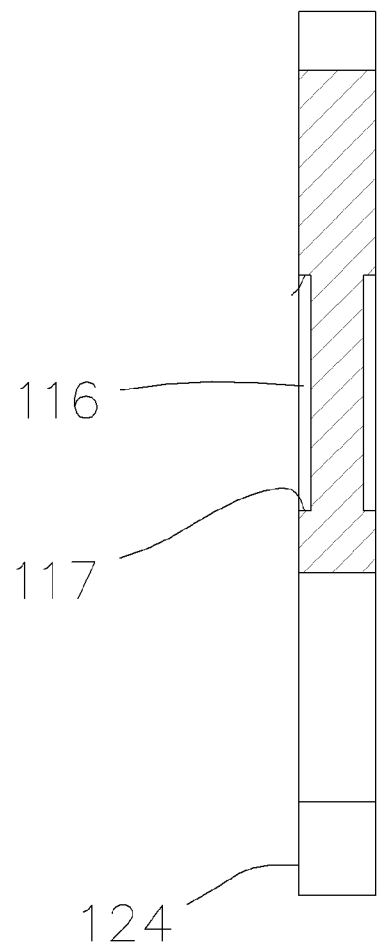
Figure 4A:
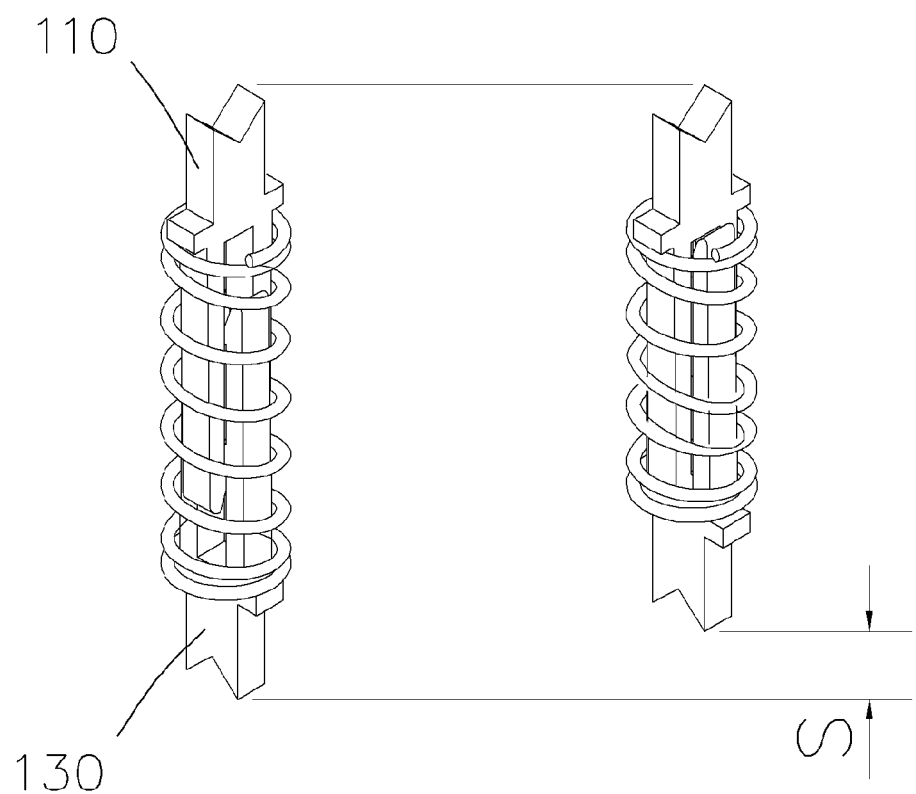
FIGS. 4a and 4b are views illustrating the operation and maximum compressed distance of the conventional spring contact.
Figure 4B:
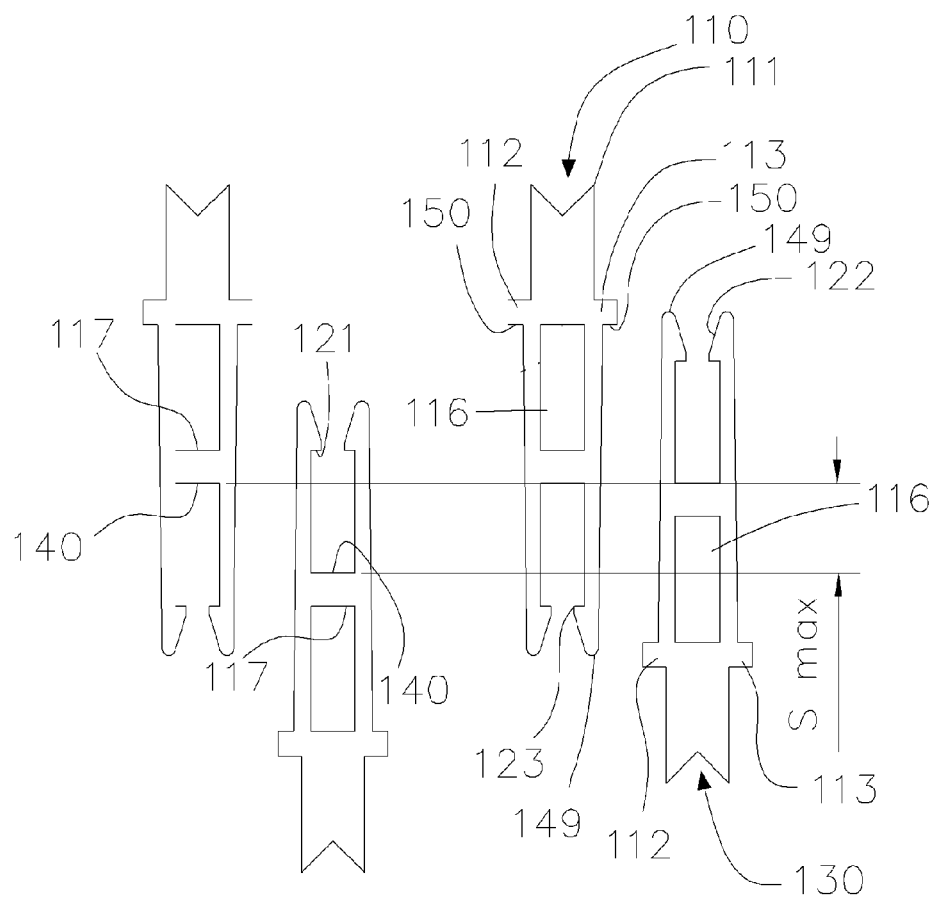

DESCRIPTION OF REFERENCE CHARACTERS
OF IMPORTANT PARTS 500, 505 630, 640, 700, 800, 810, 820, 920, 930: spring contact
560, 580, 660, 750, 751, 805, 815, 825, 925: socket
110, 510, 530, 600, 642, 705: upper contact pin
130, 510, 710, 801, 811, 821, 921, 931: lower contact pin
190, 501, 506, 601, 701: spring
111, 511, 531, 611, 641, 711, 735, 802, 812, 822, 922, 923, 932: contact portion
112, 113, 512, 513, 532, 533, 612, 712, 732: spring holding protrusion
150, 514, 534, 714, 734: spring holding surface
116, 516, 536, 616, 716: moving groove
117, 517, 537, 717: stop bridge
527, 547, 727: stop hole
118, 518, 538, 618, 718: body
529, 549: body end
119, 519, 539, 619, 719: elastic portion
120, 520, 540, 720: moving slit 140, 525, 545, 725: stop surface
121, 521, 541, 721: locking protrusion
122, 522, 542, 722: oblique surface
123, 523, 543, 723: contact surface
124, 544: side contact portion

BEST MODE

In order to accomplish the above-mentioned objects, the present invention provides a spring contact, including:

a lower contact pin that has a plate shape and a predetermined body thickness t, and is provided with a contact portion of a predetermined shape, two spring holding protrusions that are provided in left and right sides of the contact pin so as to limit a length of an assembled spring and prevent the spring from being undesirably displaced, and a body;

an upper contact pin that is coupled to the lower contact pin in such a way that the upper and lower contact pins cross each other at right angles, the upper contact pin having a construction that is the same as or similar to that of the lower contact pin; and a spring that is fitted over an assembly of the upper and lower contact pins at a position between the upper and lower contact pins, wherein the body of each of the upper and lower contact pins includes:

two symmetric elastic portions, an end of each of which has a thickness t1 that is less than a body thickness, with an oblique surface, a locking protrusion and a locking protrusion contact surface being provided in an end of each of the two symmetric elastic portions; a moving slit that is defined between the two elastic portions so as to form a moving space when the upper contact pin and the lower contact pin are assembled with each other, with a stop surface being formed on an end of the moving slit and having left and right oblique surfaces so that, when the upper contact pin is compressed against the lower contact pin with the maximum force, the stop surfaces of the two contact pins come into contact with each other and stop the compression; and moving grooves that are formed in each of the lower and upper contact pins so that the locking protrusions of the lower and upper contact pins can be moved along and stopped by the moving grooves and the locking protrusion contact surfaces of the lower and upper contact pins can be brought into electric contact with the moving grooves, the moving grooves being formed on upper and lower surfaces of each of the lower and upper contact pins, in which first ends of the moving grooves of each of the upper and lower contact pins have a stop hole that forms a stop bridge for stopping the locking protrusions of an opposite contact pin, and second ends extend in directions toward the contact portion or extend to an end of the contact portion after passing spring holding surfaces of the two spring holding protrusions that function to limit the length of the assembled spring and to prevent the spring from being undesirably displaced.

Hereinafter, the preferred embodiments of the present invention will be described in detail with reference to the accompanying drawings.

The terminologies or words used in the description and the claims of the present invention should not be interpreted as being limited merely to their common and dictionary meanings. On the contrary, they should be interpreted based on the meanings and concepts of the invention in keeping with the scope of the invention based on the principle that the inventor(s) can appropriately define the terms in order to describe the invention in the most appropriate way.

It is to be understood that the form of my invention shown and described herein is to be taken as a preferred embodiment of the present invention and that various changes and modifications may be made to the invention without departing from the spirit and scope thereof.

Hereinbelow, a first spring contact according to the present invention will be described with reference to FIGS. 5a through 10.

The spring contact 500 of this invention has an upper contact pin 510-1, a lower contact pin 510 having the same construction as that of the upper contact pin 510-1, and a spring 501. In the spring contact 500, the contact pins are made of an electric conductive metal material. Generally, each of the upper and lower contact pins has a plate-shaped structure made of a copper alloy and having a body thickness t, and is preferably formed by plating nickel and by plating gold on the contact pin, thereby maximizing the electric conductivity of the contact pin. Here, the lower contact pin 510 has a contact portion 511 of a predetermined shape, two spring holding protrusions 512 and 513 that are provided in left and right sides of the contact pin so as to limit the length of an assembled spring and prevent the spring from being undesirably displaced, and a body 518.

The upper contact pin 510-1 is coupled to the lower contact pin 510 in such a way that the two contact pins cross each other at right angles. This upper contact pin 510-1 has the same construction as that of the lower contact pin 510.

The spring 501 is fitted over an assembly of the lower contact pin 510 and the upper contact pin 510-1 at a position between the upper and lower contact pins. Here, the body 518 of each of the lower contact pin 510 and the upper contact pin 510-1 has two symmetric elastic portions 519, an end of each of which has a thickness t1 that is less than the body thickness t, with an oblique surface 522, a locking protrusion 521 and a locking protrusion contact surface 523 being provided in the end of each of the two symmetric elastic portions 519.

A moving slit 520, 540 is defined between the two elastic portions 519 so as to form a moving space when the upper contact pin 510-1 and the lower contact pin 510 are assembled with each other. A stop surface 525, 545 is formed on an end of the moving slit 520, 540 and has left and right oblique surfaces 526 so that, when the upper contact pin 510-1 is compressed against the lower contact pin 510 to the maximum, the stop surfaces 525 and 545 of the two contact pins 510 and 510-1 come into contact with each other and stop the compression.

Moving grooves 516 are formed in each of the lower and upper contact pins 510 and 510-1 so that the locking protrusions 521 of the lower and upper contact pins 510 and 510-1 can be moved and stopped. The moving grooves 516 of the lower and upper contact pins 510 and 510-1 are brought into electric contact with the locking protrusion contact surfaces 523 of the lower and upper contact pins 510 and 510-1. Here, the moving grooves 516 are formed on upper and lower surfaces of each of the lower and upper contact pins 510 and 510-1, respectively. In each of the lower and upper contact pins 510 and 510-1, first ends of the moving grooves 516 have a stop hole 527 that forms a stop bridge 517 for stopping the locking protrusions 521 of an opposite contact pin, and second ends may extend in directions toward the contact portion 511 or may extend to the end of the contact portion 511 after passing the spring holding surfaces 514 of the two spring holding protrusions 512 and 513 that function to limit the length of an assembled spring 501 and to prevent the spring from being undesirably displaced.

Figure 7A:
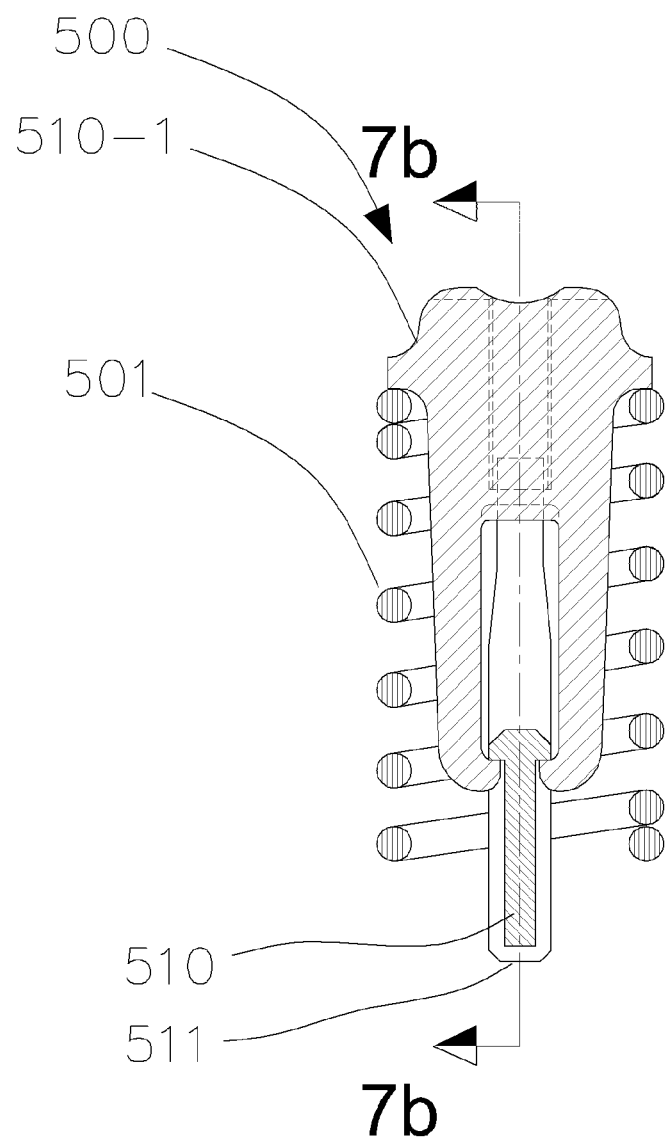
FIG. 7a is a front sectional view illustrating an assembled state of a first spring contact that has upper and lower contact pins having the same construction according to the present invention.
Figure 7B:
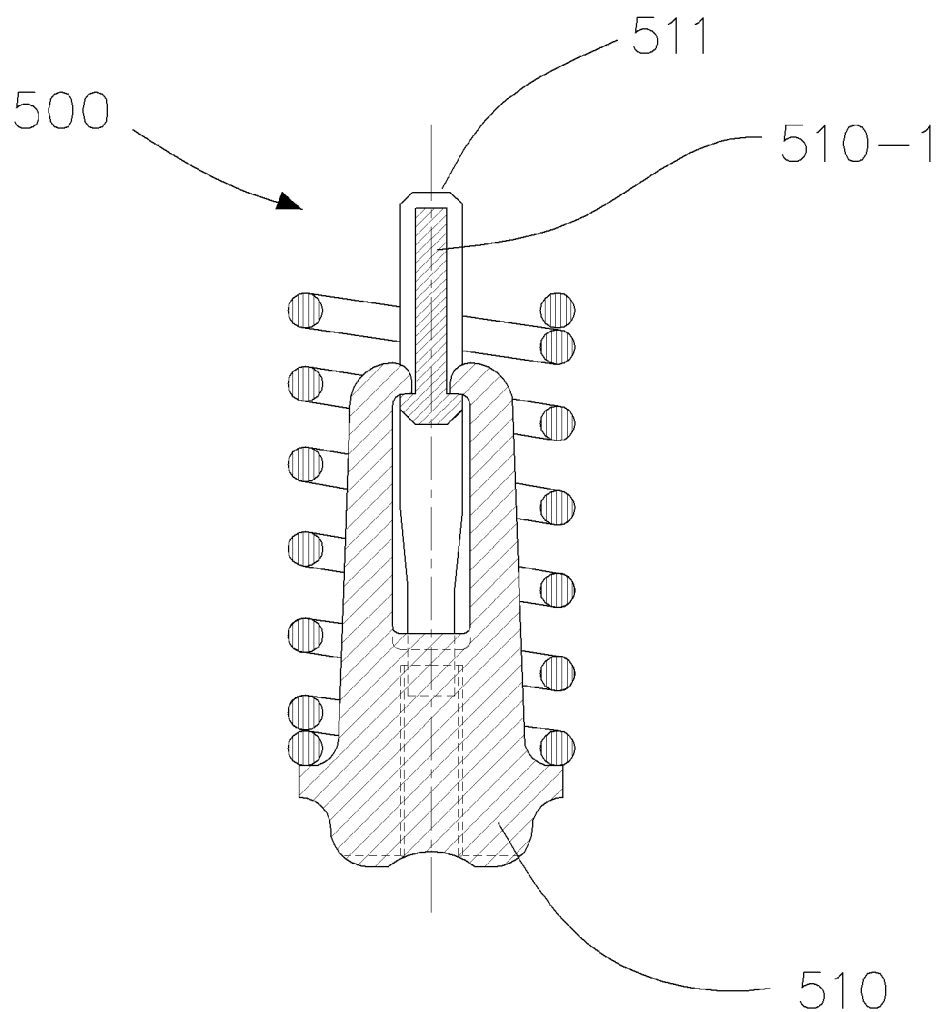

FIGS. 7a and 7b are a front sectional view and a side sectional view illustrating the first spring contact that includes the lower contact pin and the spring in the same manner as that described for the upper contact pin the present invention.

Figure 5A:
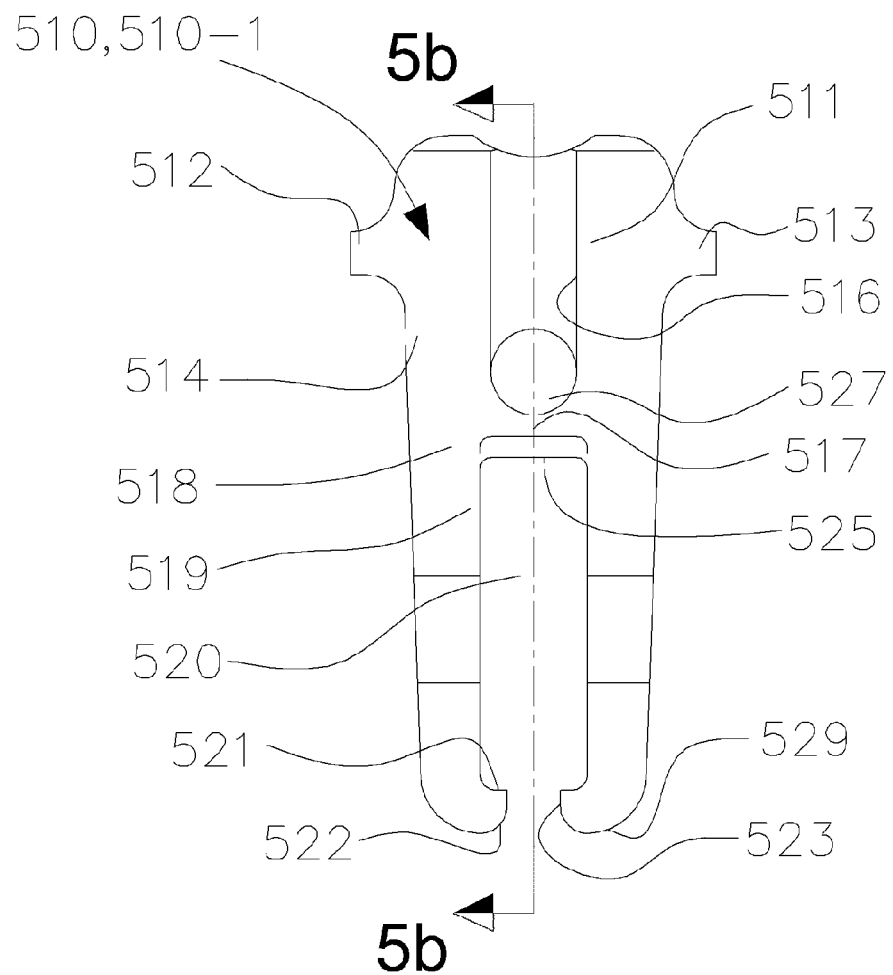
FIG. 5a is a plan view illustrating a contact pin of a first spring contact according to the present invention.
Figure 5B:
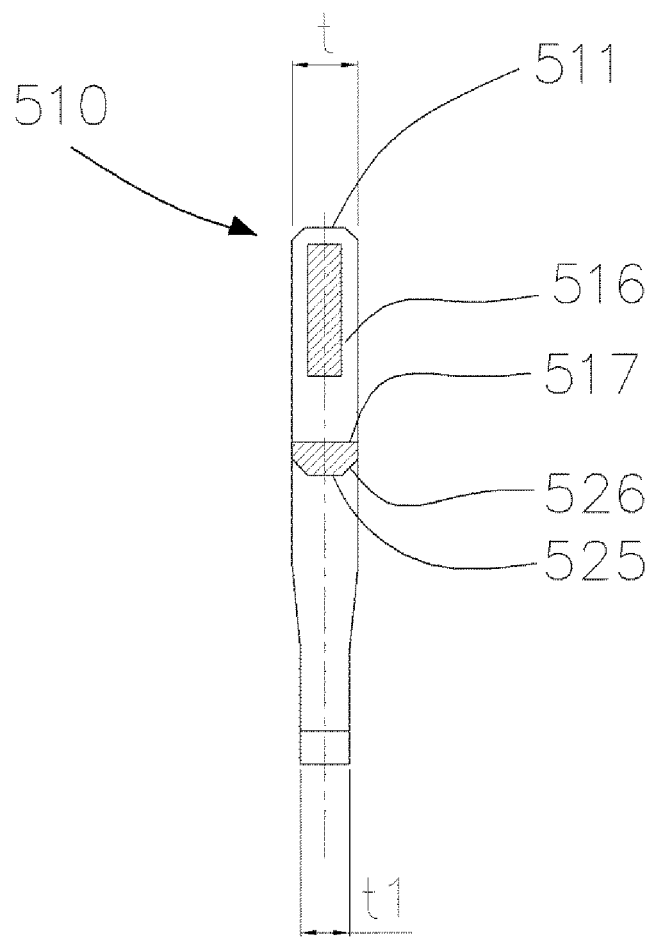
Figure 7C:
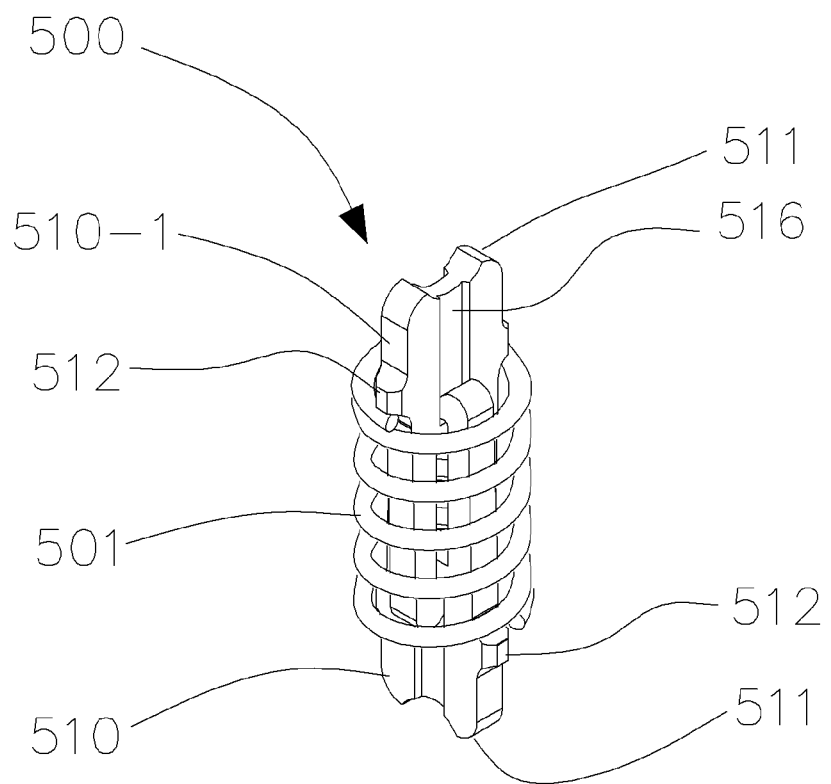

FIGS. 5a and 5b are views illustrating the characteristic construction of the upper and lower contact pins. FIG. 7c is a perspective view of the first spring contact of the present invention.

Described in detail, the upper and lower contact pins 510-1 and 510 have the same shape and the same size. As shown in FIGS. 5a and 5b, the first ends of the moving grooves 516 of each contact pin have the stop hole 527 that forms the stop bridge 517 for stopping the locking protrusions 521 of an opposite contact pin, and the second ends extend to the end of the contact portion 511 after passing the spring holding surfaces 514 of the two spring holding protrusions 512 and 513. Further, each of the moving grooves 516 has a predetermined depth. Also, the distance between the bottoms of the opposite moving grooves 516 of each contact pin may be equal to, slightly longer than or slightly shorter than the distance between the contact surfaces 523 of the locking protrusions 521 of the two elastic portions 519.

Figure 8A:
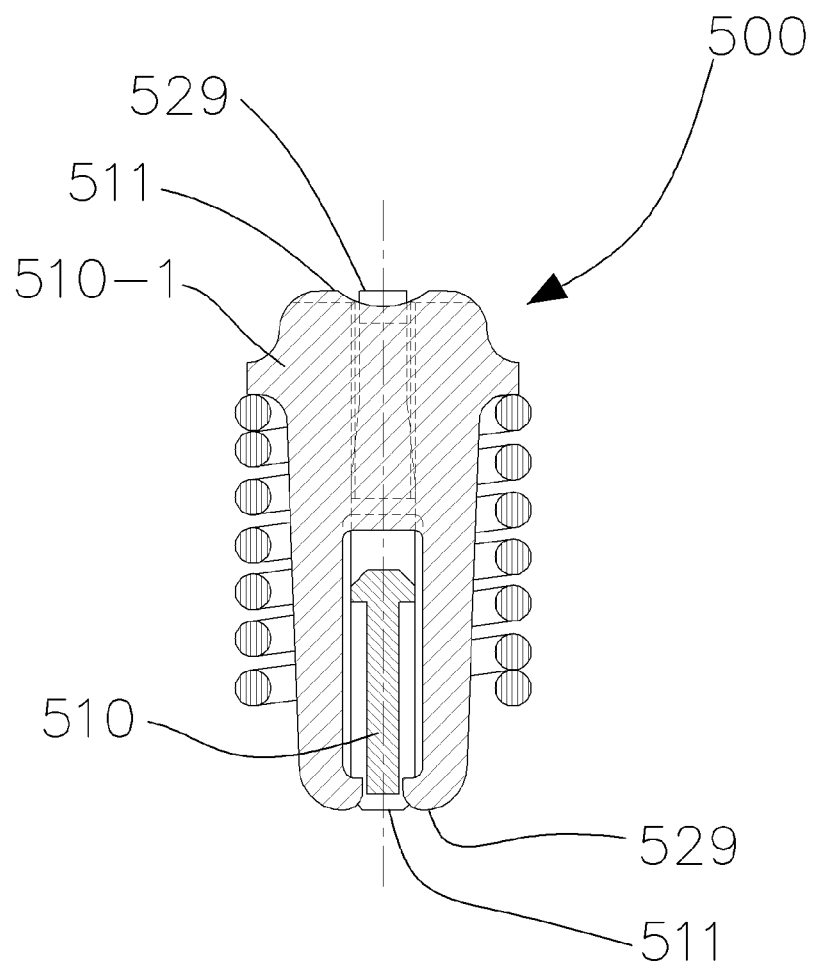
FIG. 8a is a view illustrating that, when the spring contact of FIG. 7a is compressed to the maximum, the length of the upper contact pin is equal to the length of the lower contact pins.
Figure 8B:
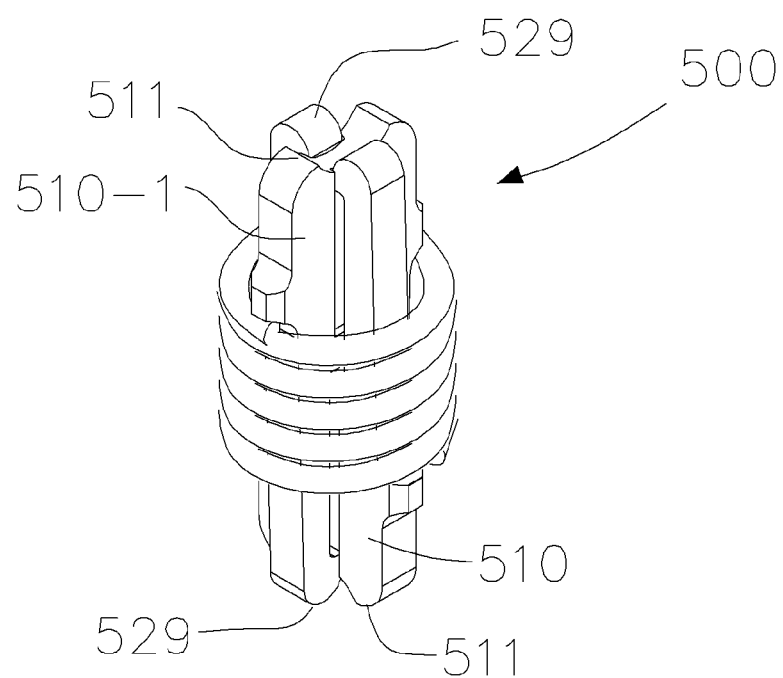

FIGS. 8a and 8b are a front sectional view and a perspective view illustrating a state in which the upper contact pin of the first spring contact of the present invention has been compressed against the lower contact pin to the maximum.

The spring contact 500 of the present invention is configured in such a way that, when the upper contact pin 510-1 is compressed downward, two body ends 529 that are connected to the bodies 518 of the upper contact pin 510-1 and the lower contact pin 510 may reach the ends of the contact portions 511 of the lower and upper contact pins 510 and 510-1 or may pass by the contact portions 511 of the lower and upper contact pin 510 and 510-1, so that the maximum compressed length of the spring contact is equal to the length of the upper contact pin 510-1 and the lower contact pin 510.

Figure 6A:
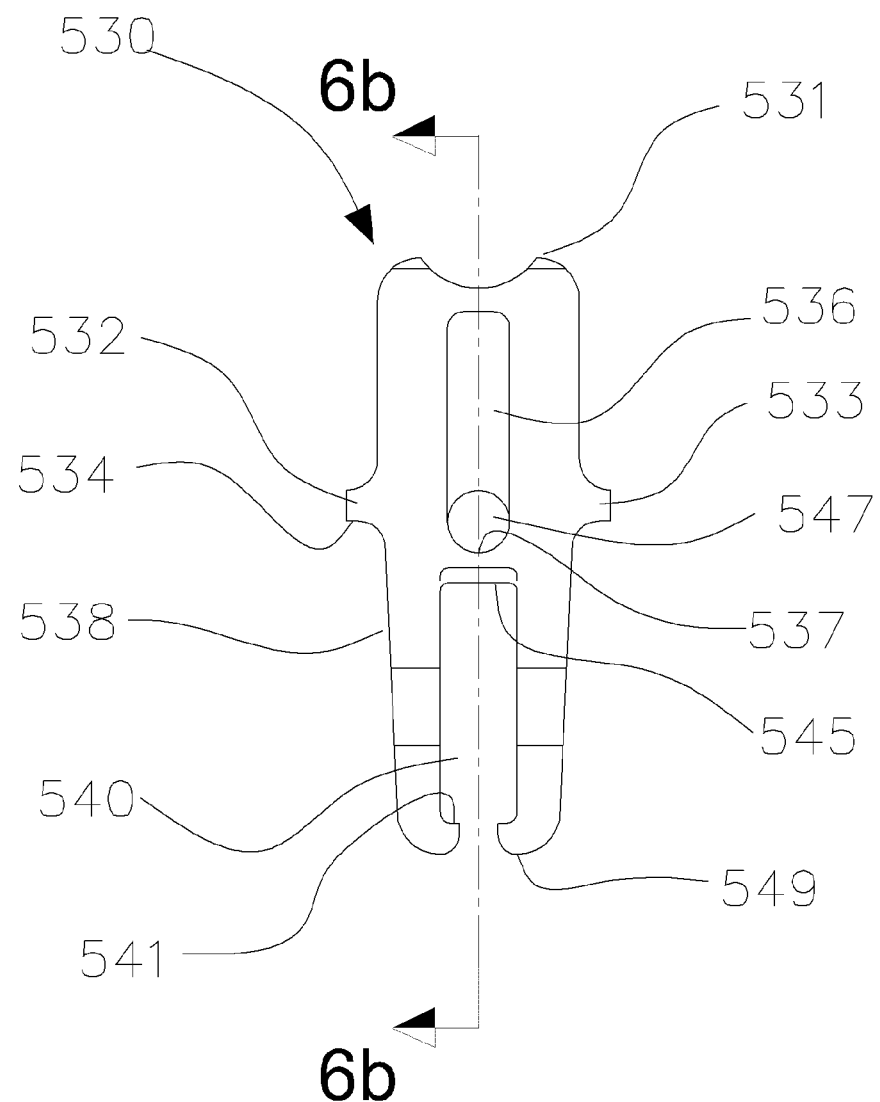
FIG. 6a is a plan view illustrating a contact pin of a first spring contact having a different shape of a contact portion according to the present invention.
Figure 6B:
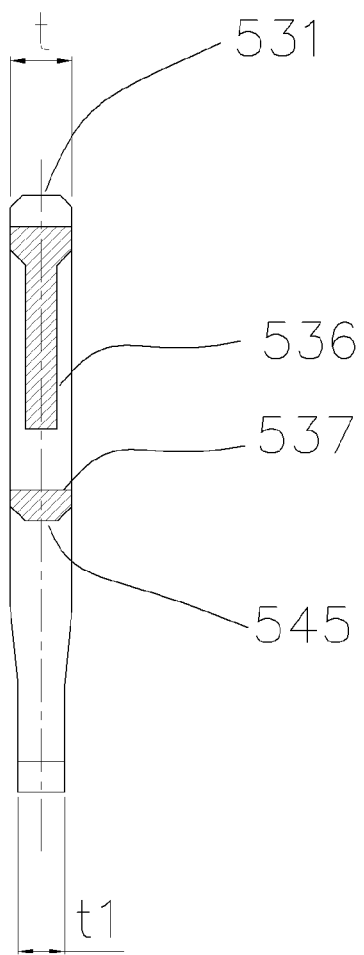

FIGS. 6a and 6b show a contact pin in which the length between the spring holding protrusions 532 and 533 and the contact portion 531 of the contact pin is increased compared to the contact pin of FIGS. 5a and 5b. Here, first ends of the moving grooves 536 of each contact pin have a stop hole 547 that forms a stop bridge 537 for stopping the locking protrusions 541 of an opposite contact pin, and the second ends extend in directions toward the contact portion 531 after passing the spring holding surfaces 534 of the two spring holding protrusions 532 and 533. Here, the second ends of the moving grooves 536 do not extend to the end of the contact portion 531.

Figure 9A:
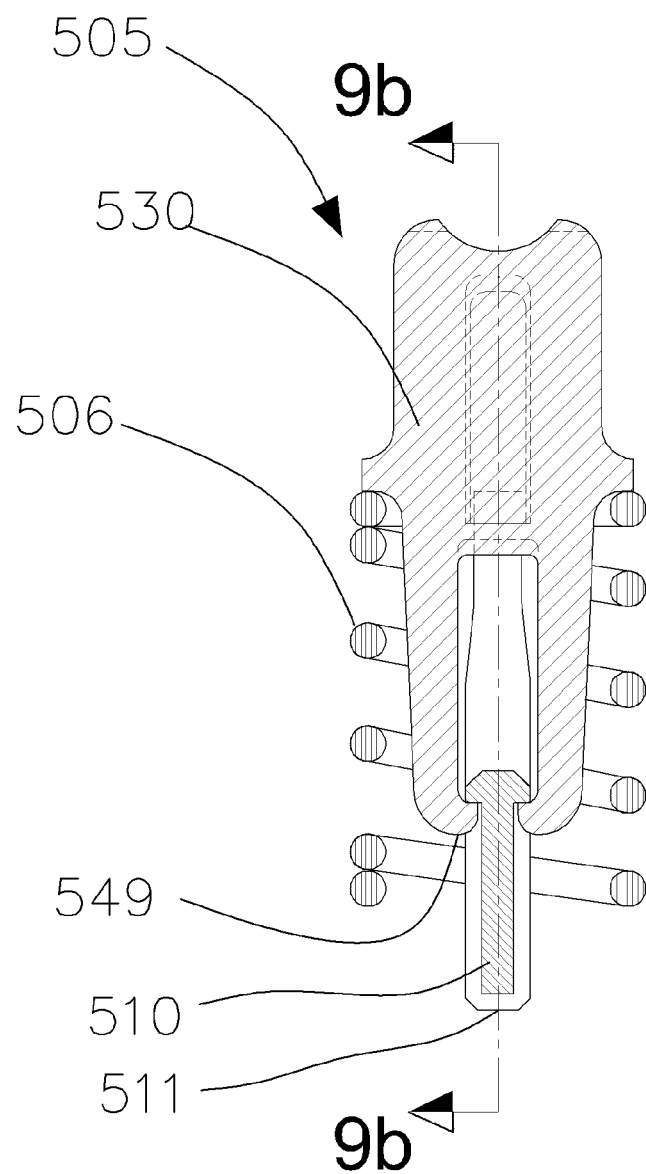
FIG. 9a is a front sectional view illustrating an assembled state of a first spring contact that has contact pins having upper and lower contact portions of different shapes according to the present invention.
Figure 9B:
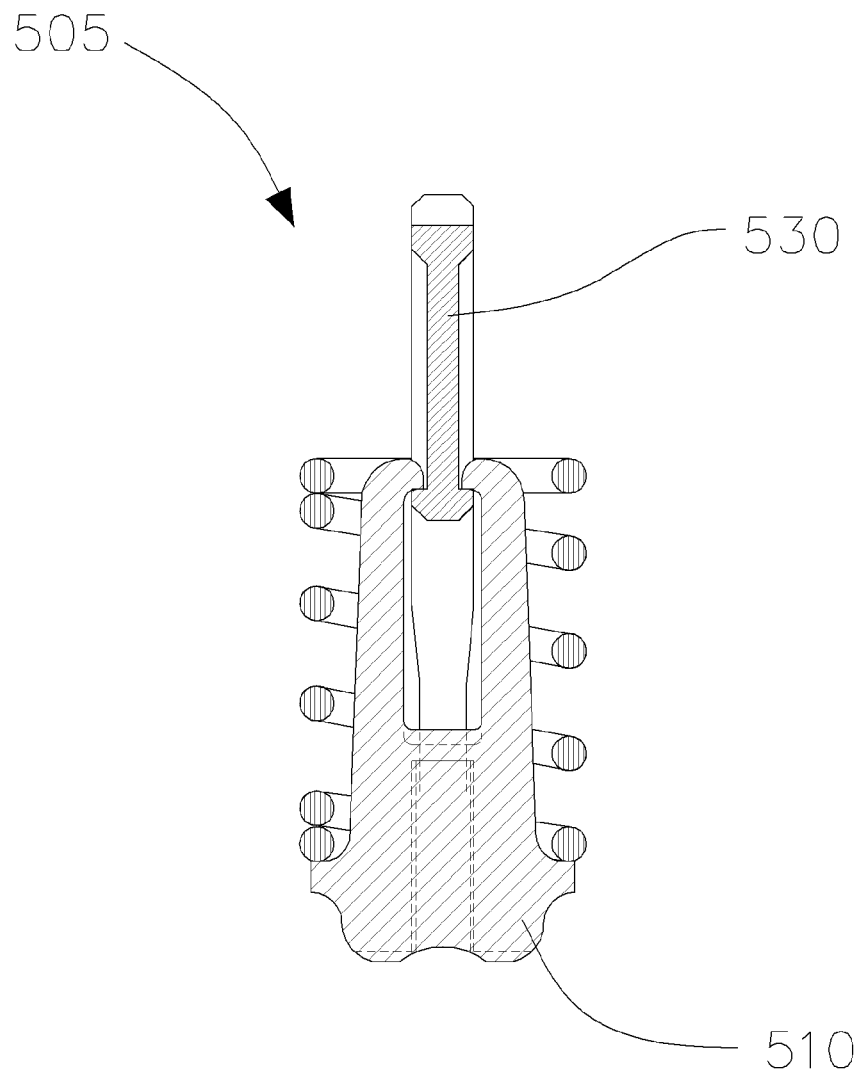
Figure 10:
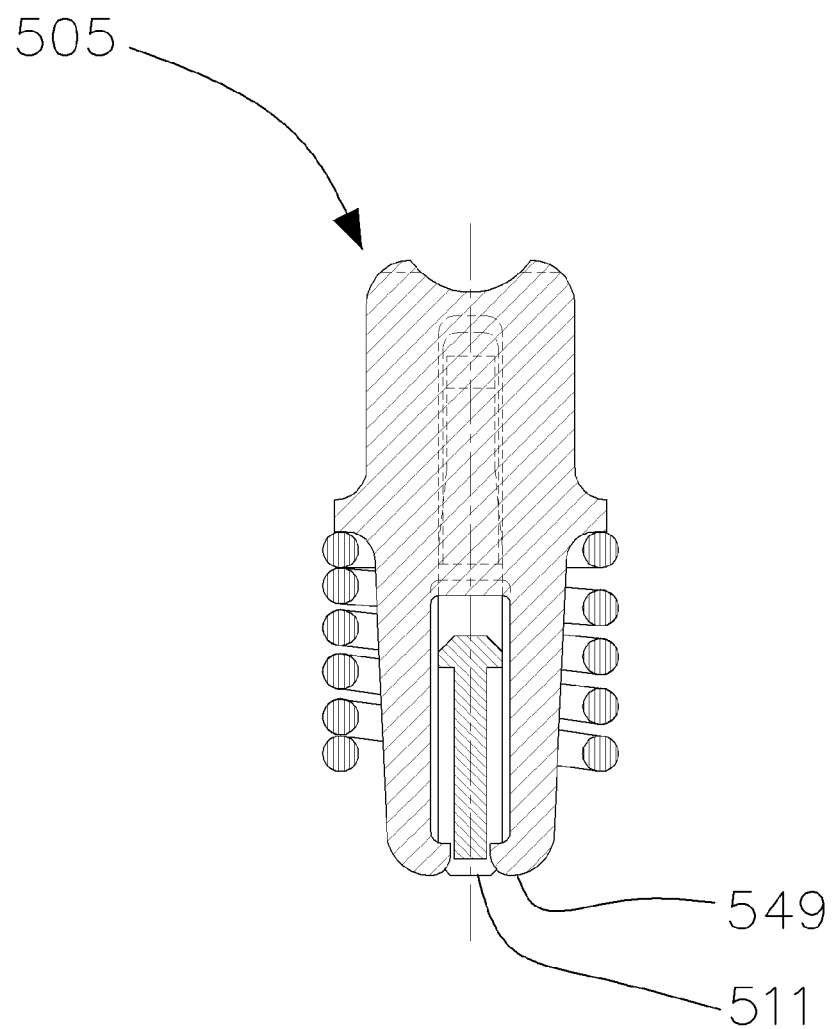
FIG. 10 is a view illustrating that, when the spring contact of FIG. 9a is compressed to the maximum, an end of the upper contact pin is compressed against the contact portion of the lower contact pin so that the compressed length of the spring contact is equal to the length of the upper contact pin.
Figure 11A:
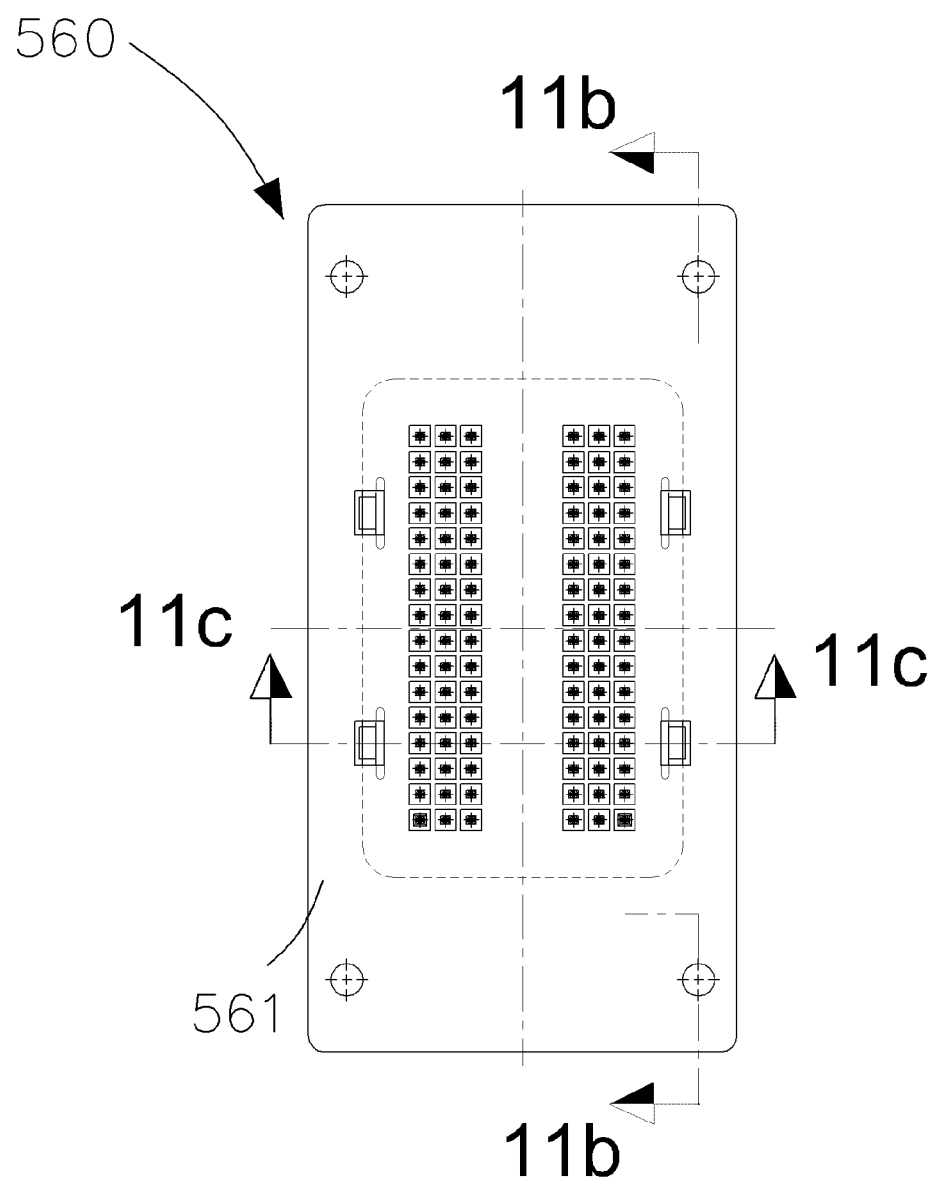
FIG. 11a is a plan view illustrating the assembled construction of a first socket embedded with first spring contacts according to the present invention.
Figure 11B:
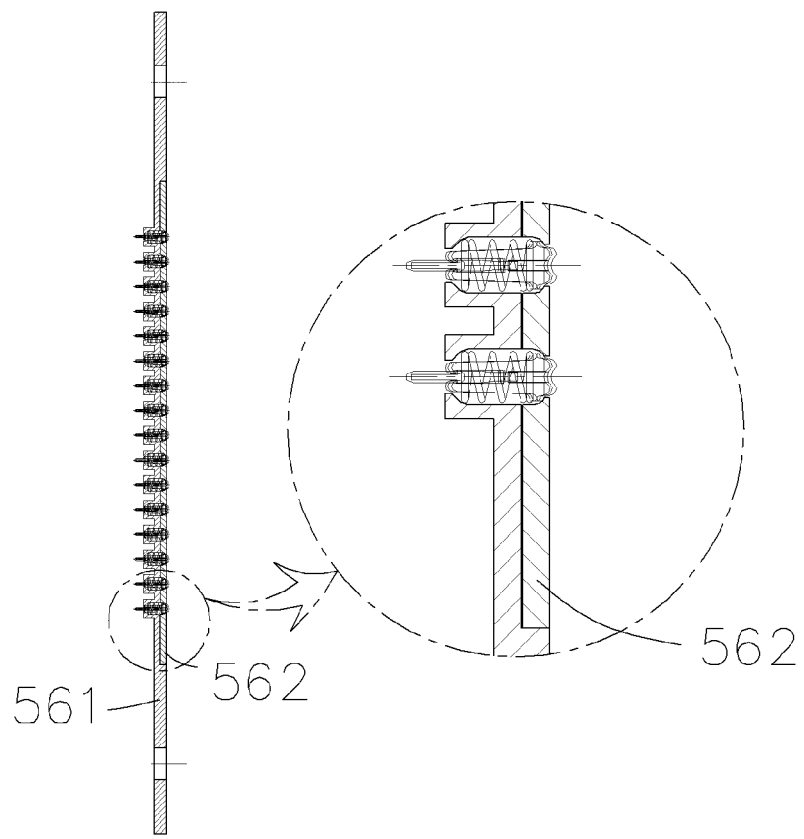
Figure 11C:
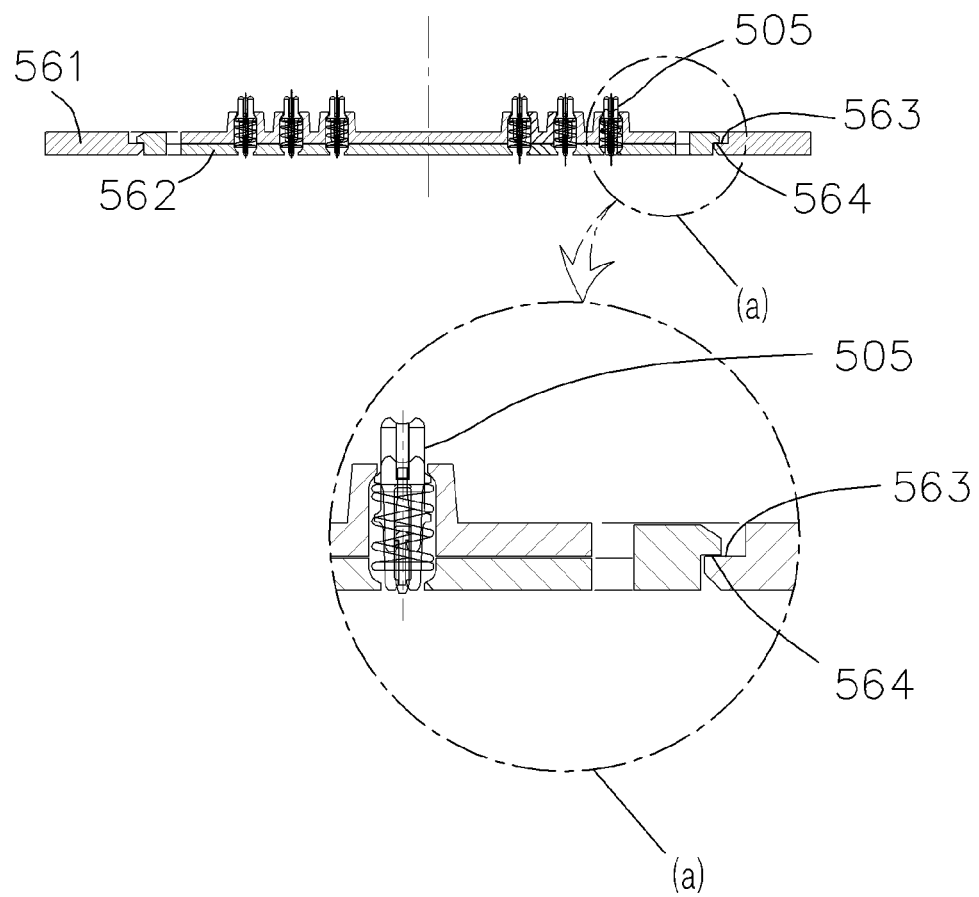
Figure 12:
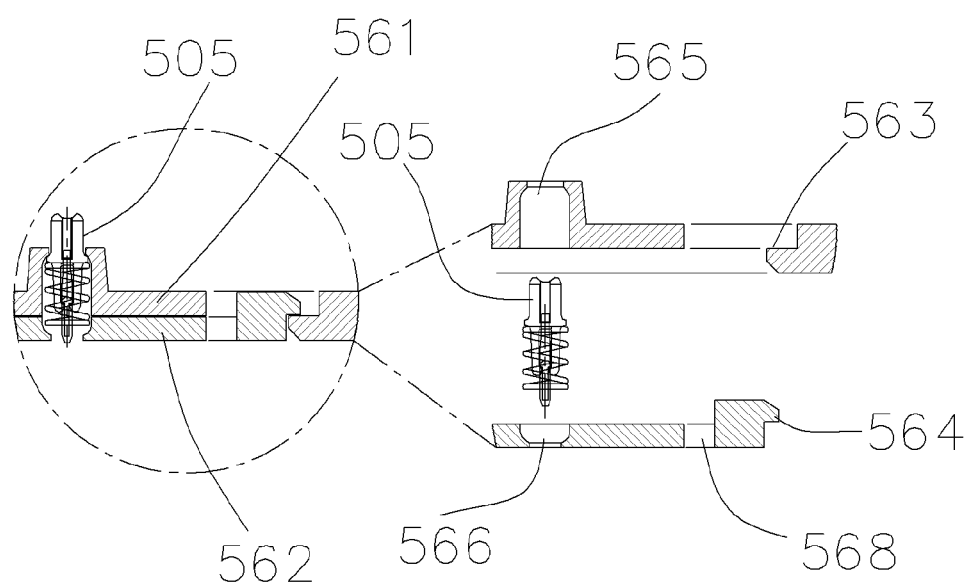
FIG. 12 is an enlarged and developed sectional view of portion (a) of FIG. 11c.
Figure 13A:
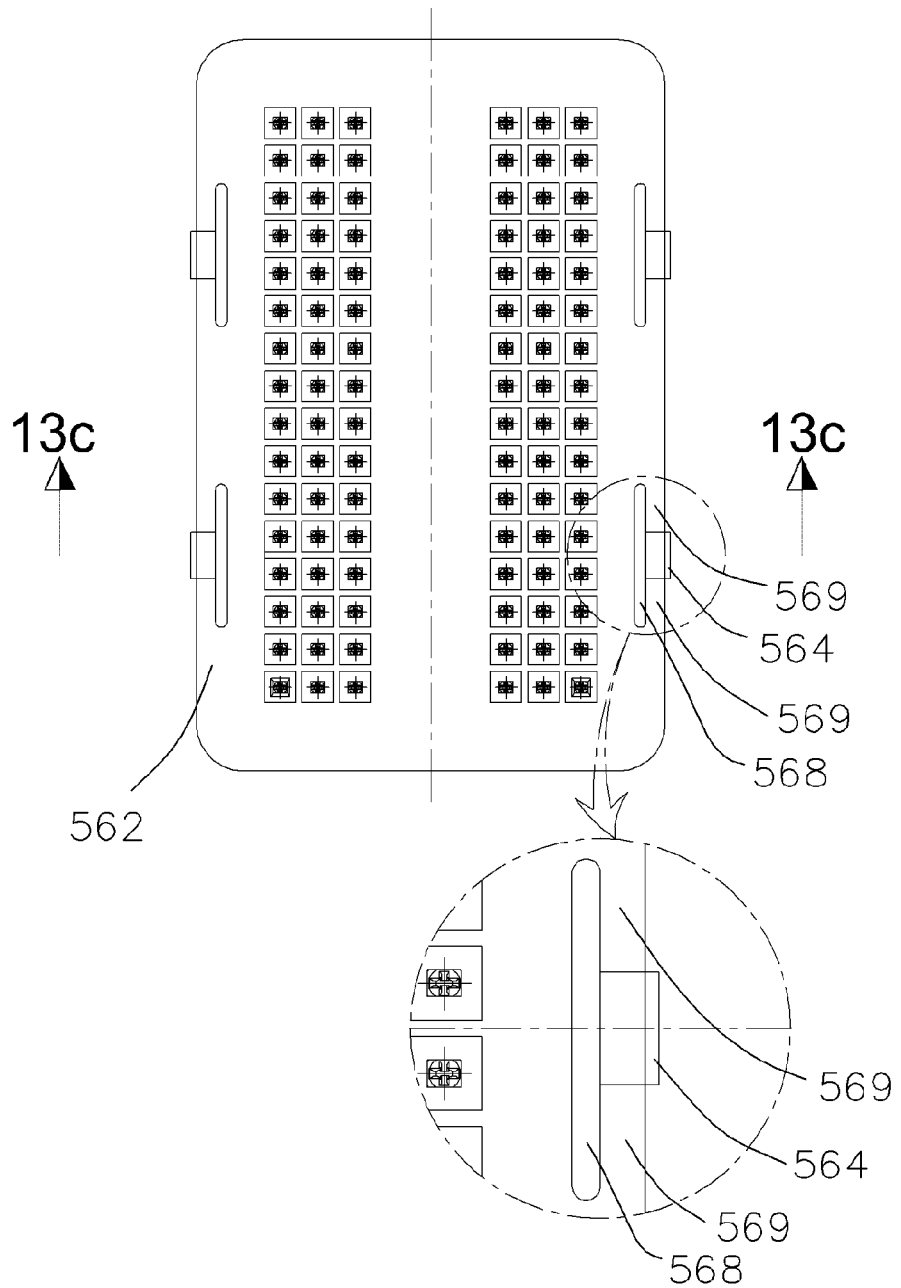
FIG. 13a is a plan view illustrating a lower plate of the socket of FIG. 11.
Figure 13B:
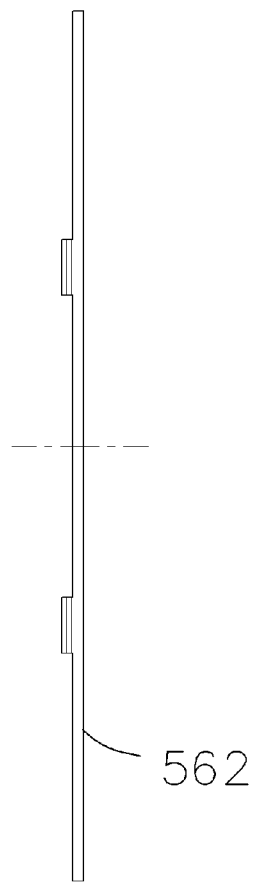
Figure 13C:
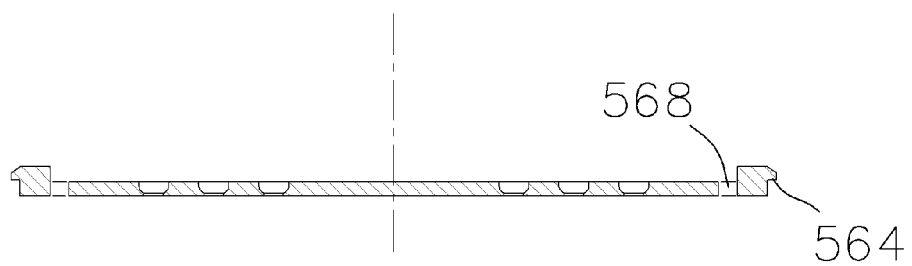
Figure 14A:
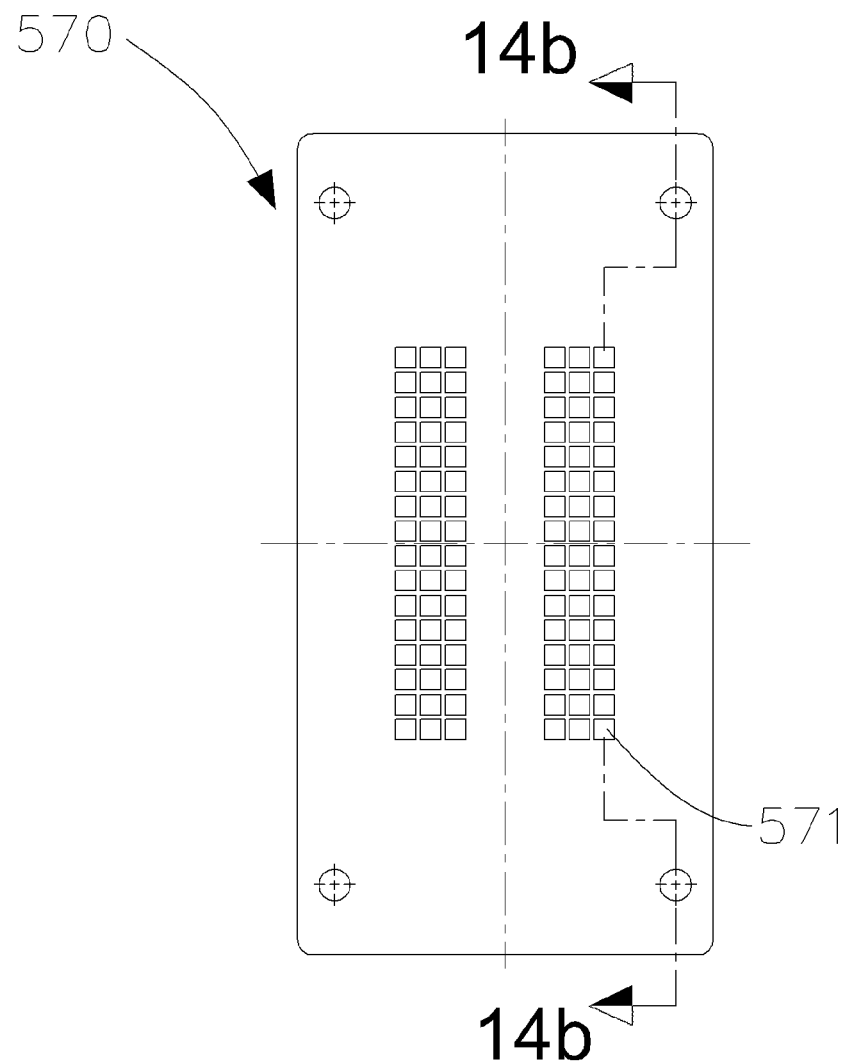
FIG. 14a is a plan view illustrating an electromagnetic shielding plate of the socket according to the present invention.
Figure 14B:
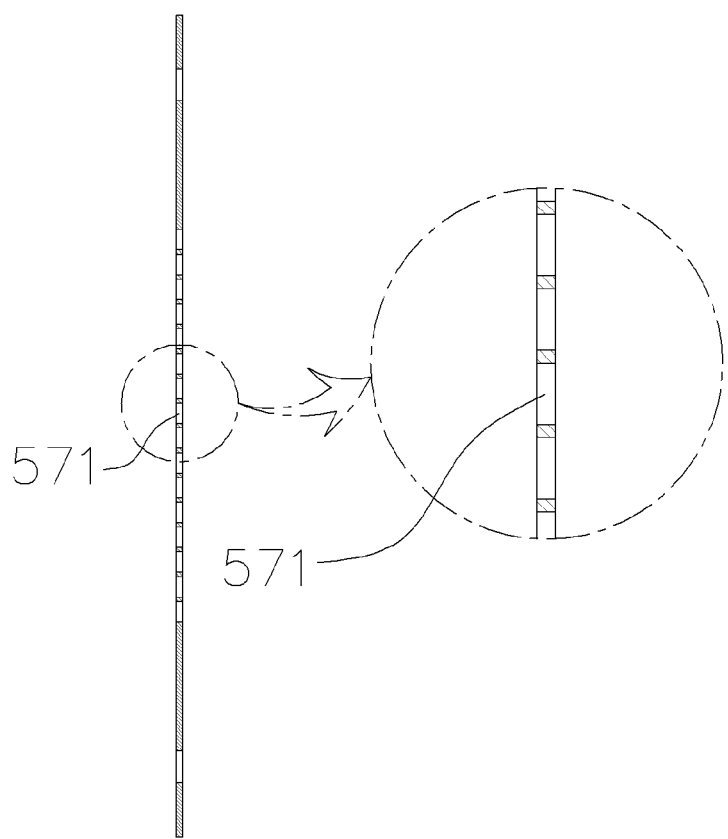
Figure 15A:
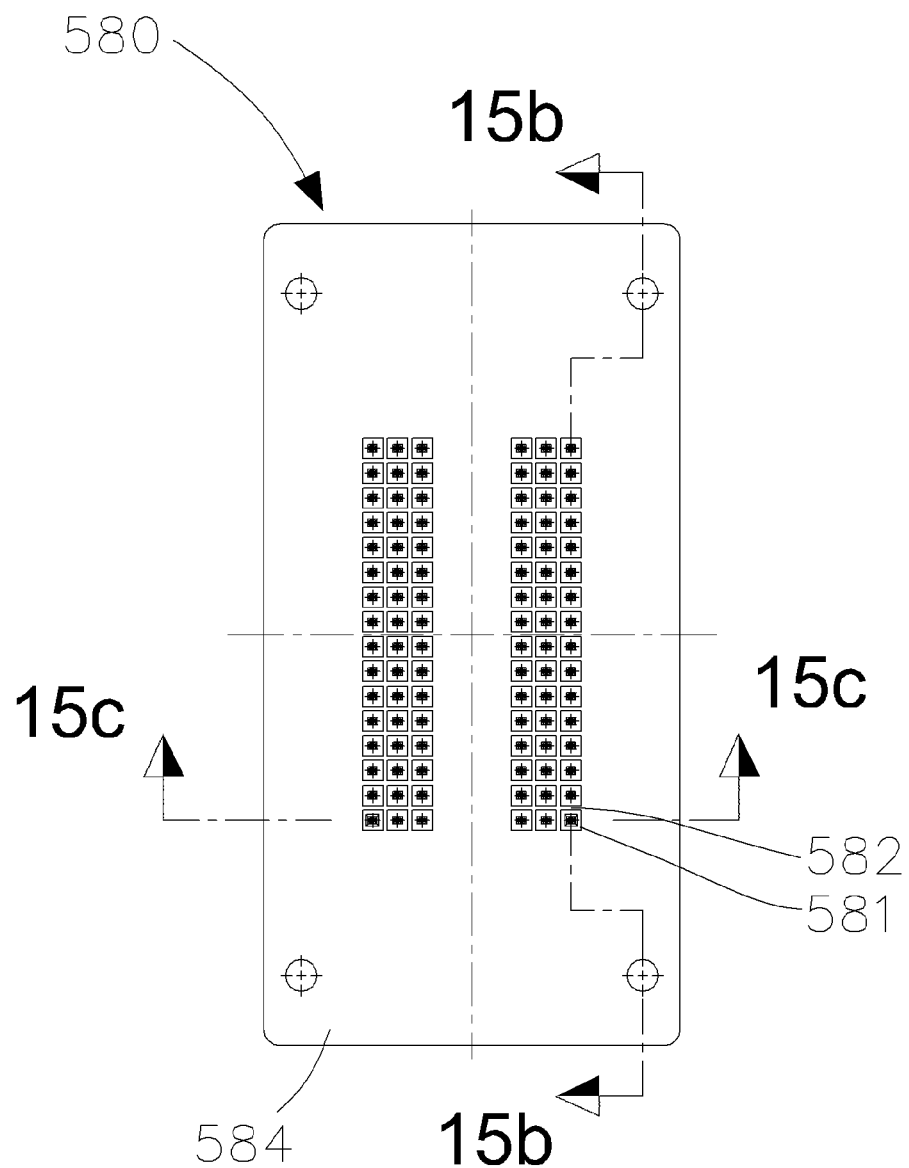
FIG. 15a is a plan view illustrating the construction of an electromagnetic shielding type second socket according to the present invention.
Figure 15B:
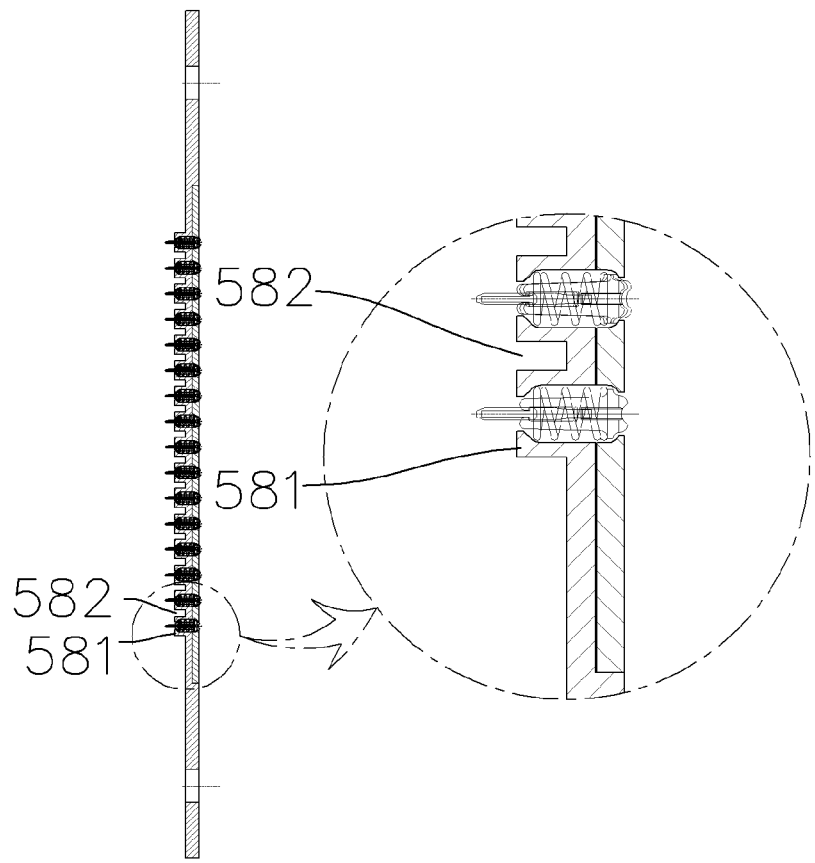
Figure 15C:
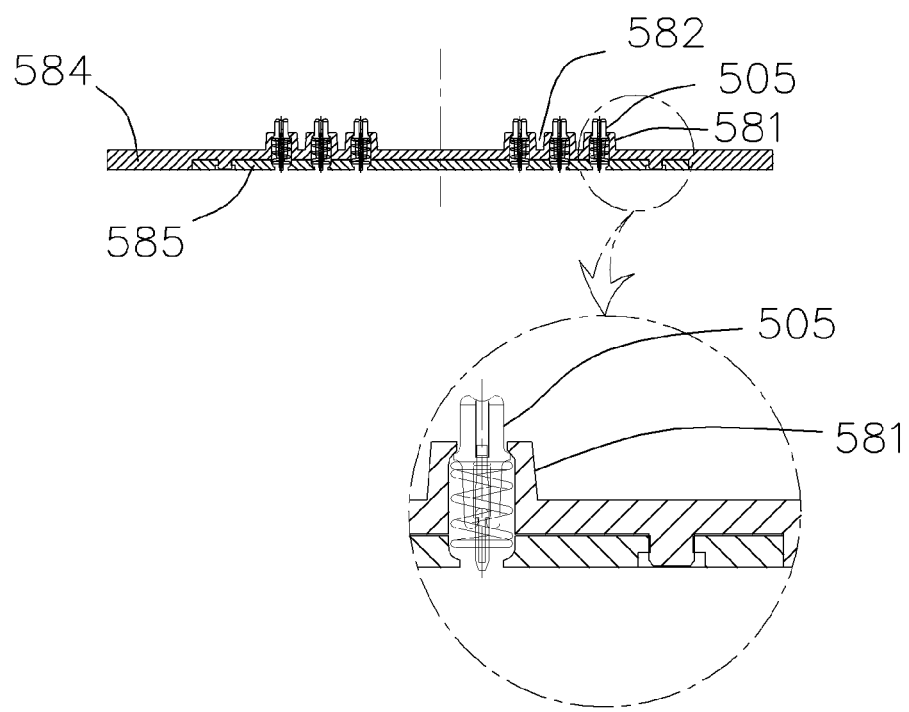
Figure 16A:
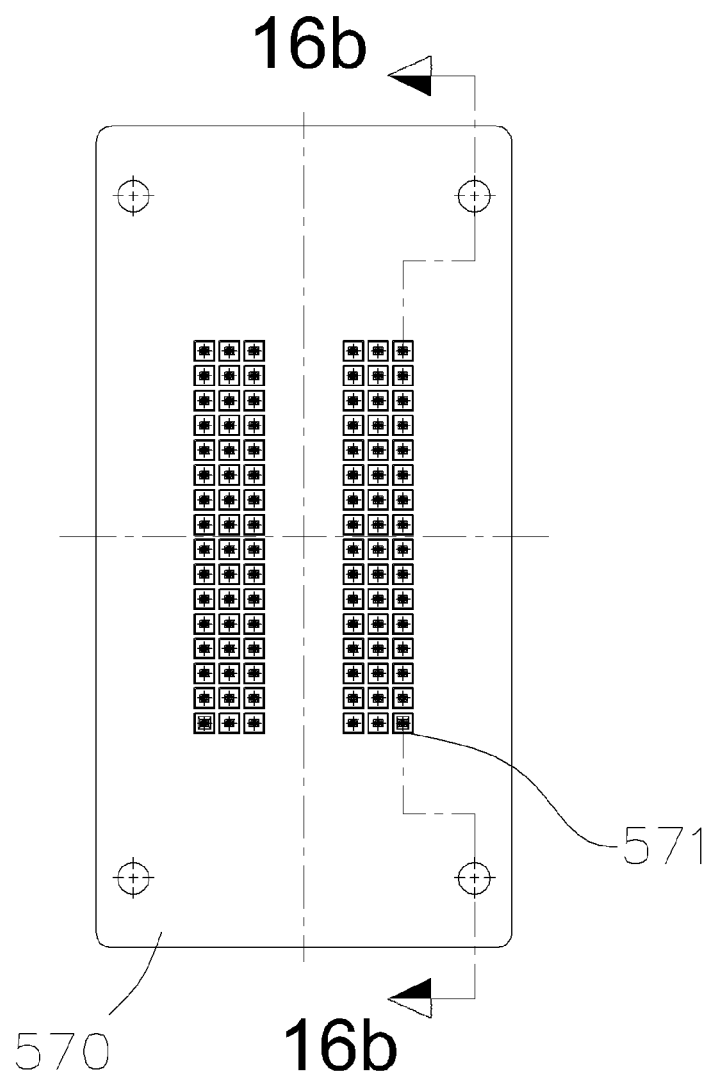
FIG. 16a is a plan view illustrating a state in which an electromagnetic shielding type socket according to the present invention is assembled with an electromagnetic shielding plate.
Figure 16B:
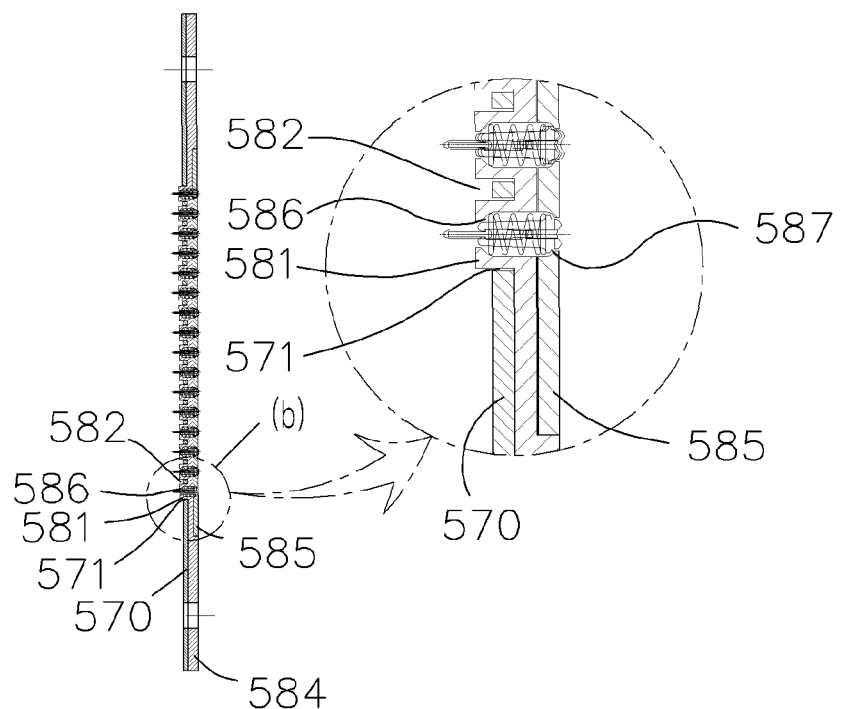
Figure 17:
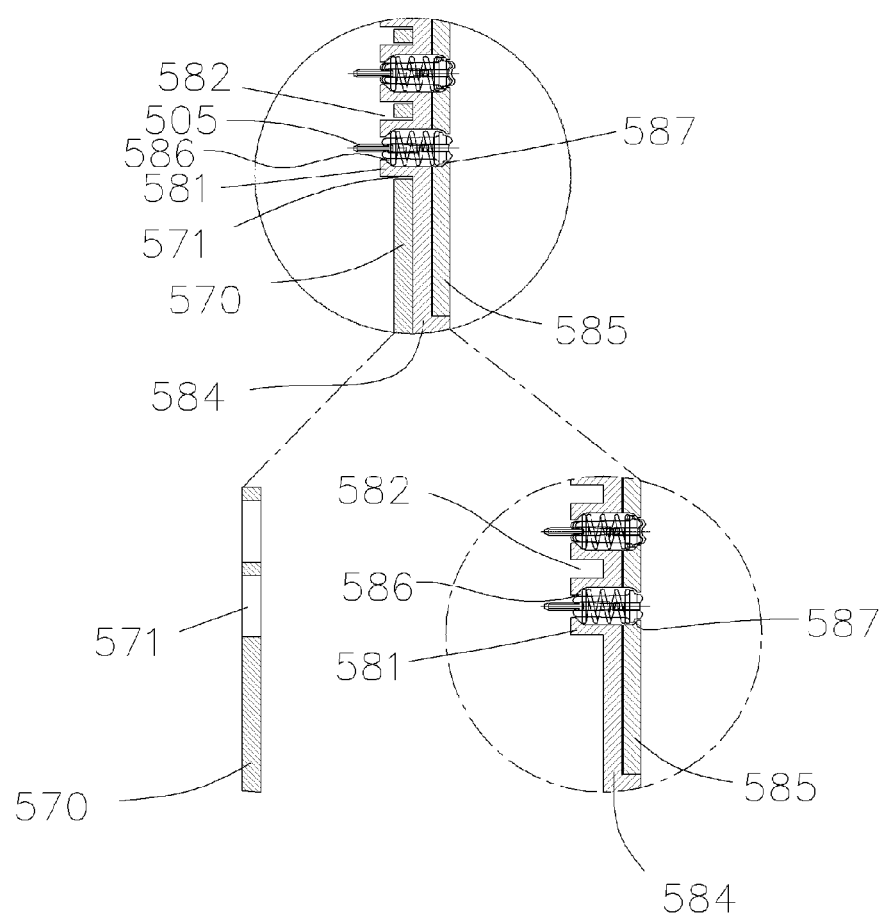
FIG. 17 is an enlarged and developed sectional view of portion (b) of FIG. 16d.
Figure 18A:
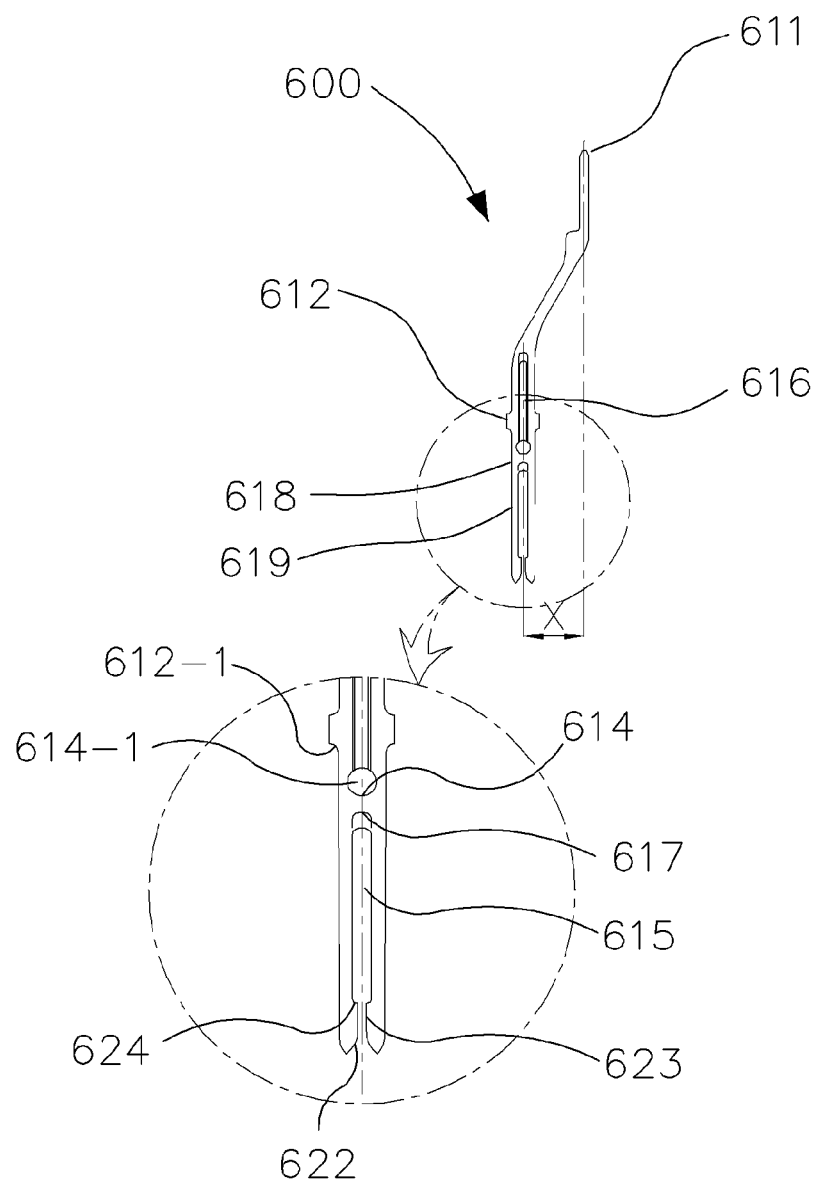
FIG. 18a is a plan view illustrating the eccentric structure of a contact portion of an upper contact pin of a second spring contact according to the present invention.
Figure 18B:
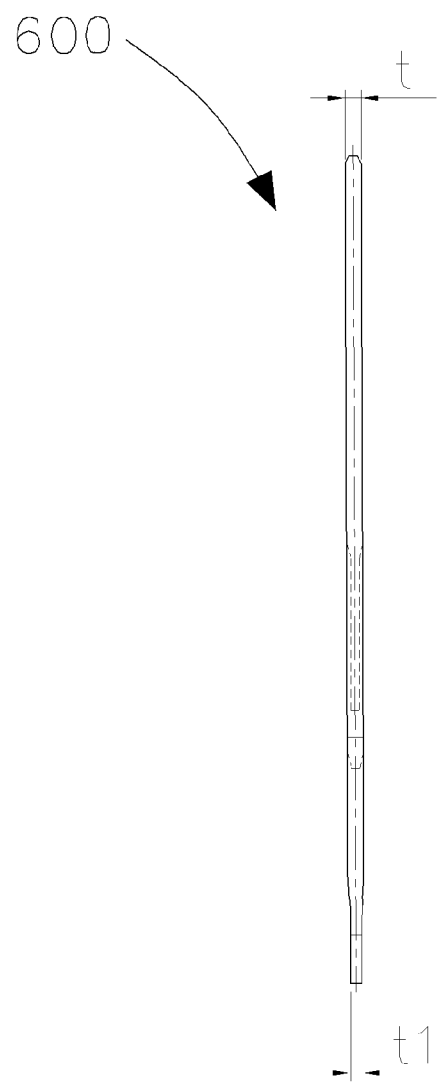
Figure 19A:
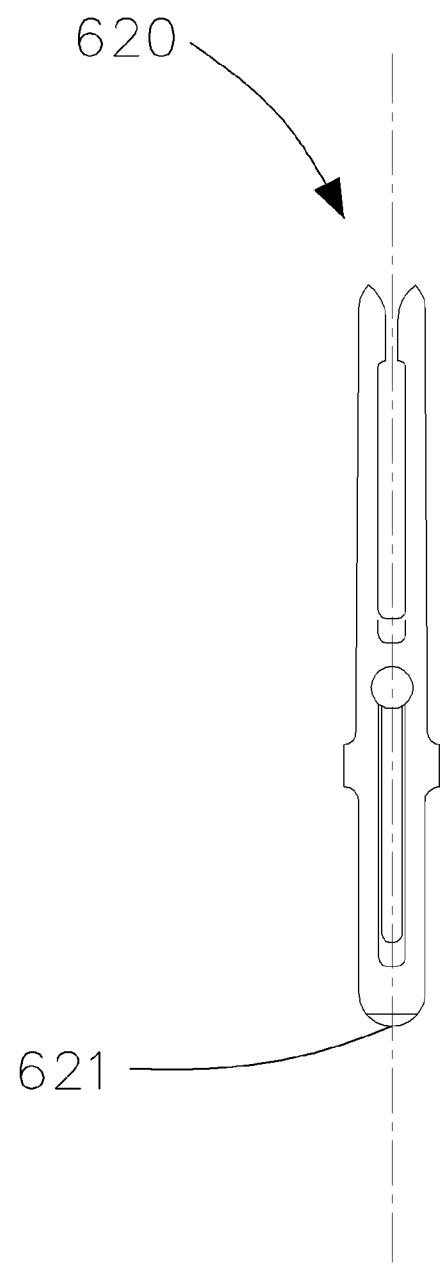
FIG. 19a is a plan view illustrating the construction of a lower contact pin of the second spring contact according to the present invention.
Figure 19B:
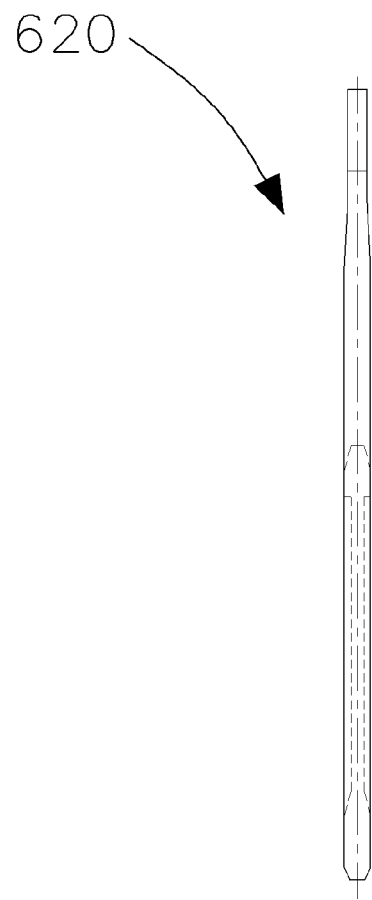
Figure 20A:
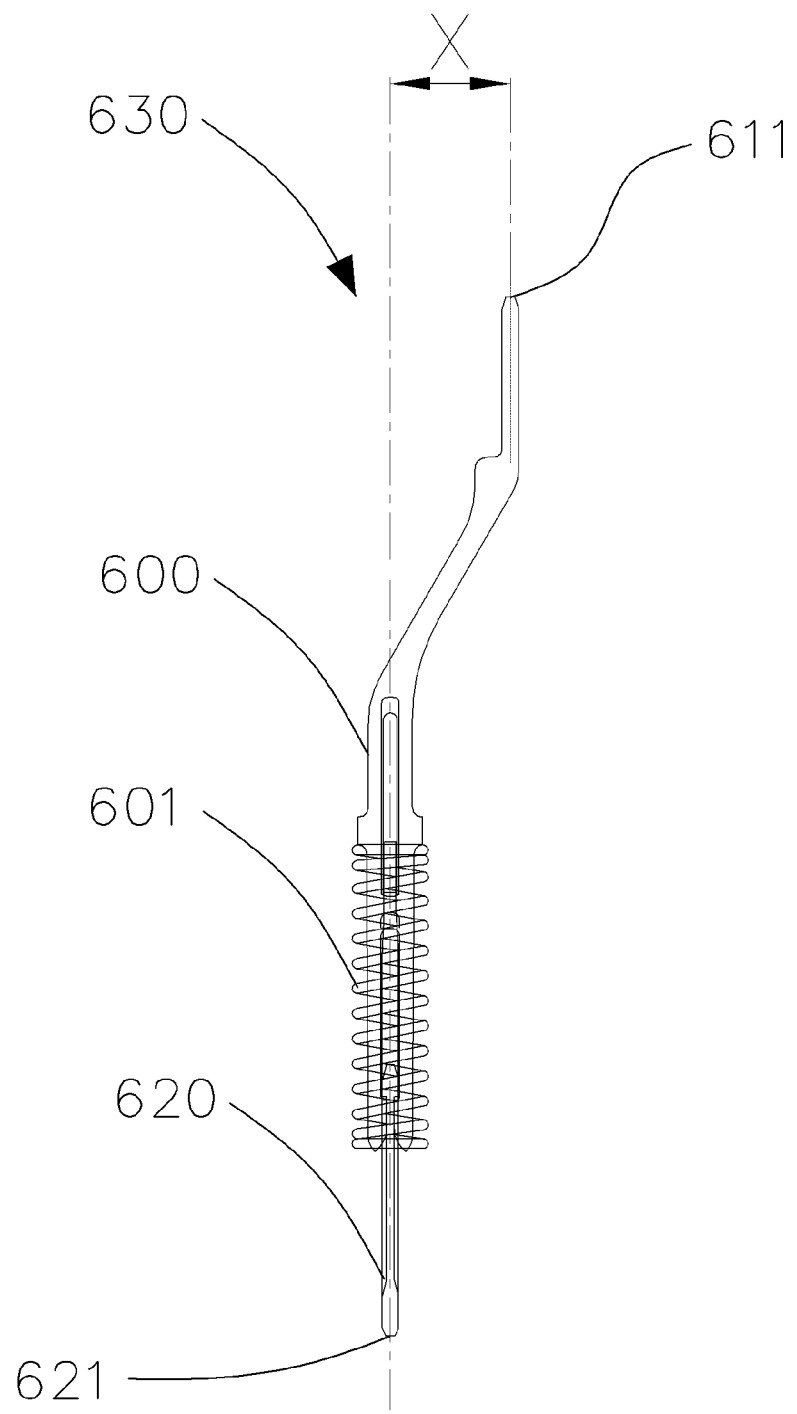
FIG. 20a is a plan view illustrating the eccentric structure of a second eccentric spring contact according to the present invention.
Figure 20B:
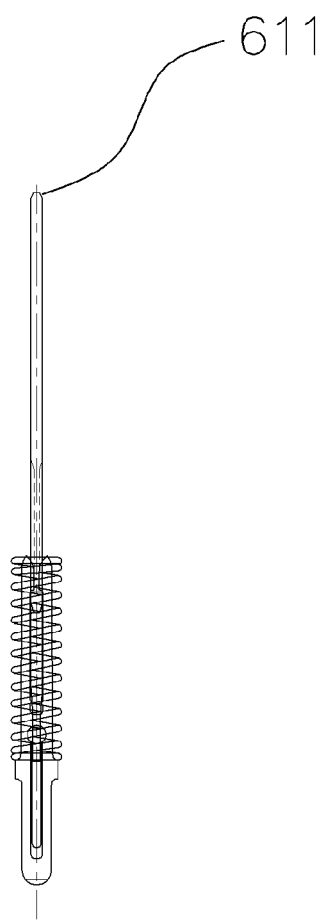
Figure 21A:
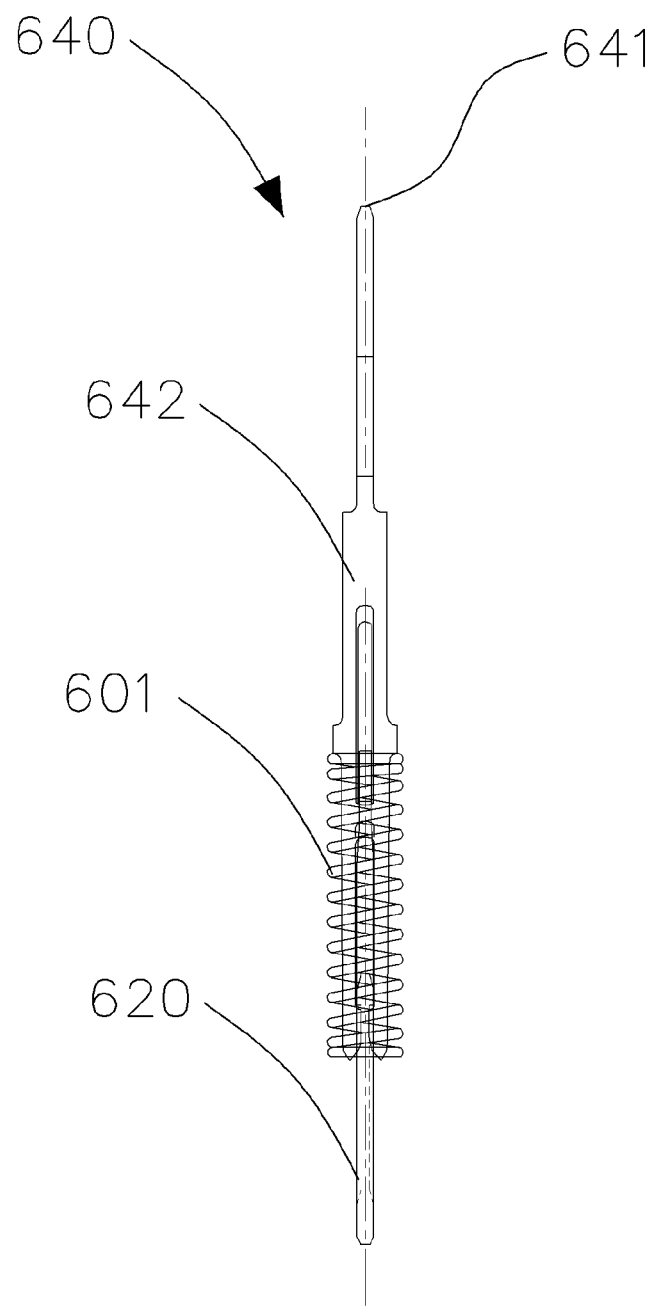
FIG. 21a is a plan view illustrating a different construction of a second eccentric spring contact according to the present invention.
Figure 21B:
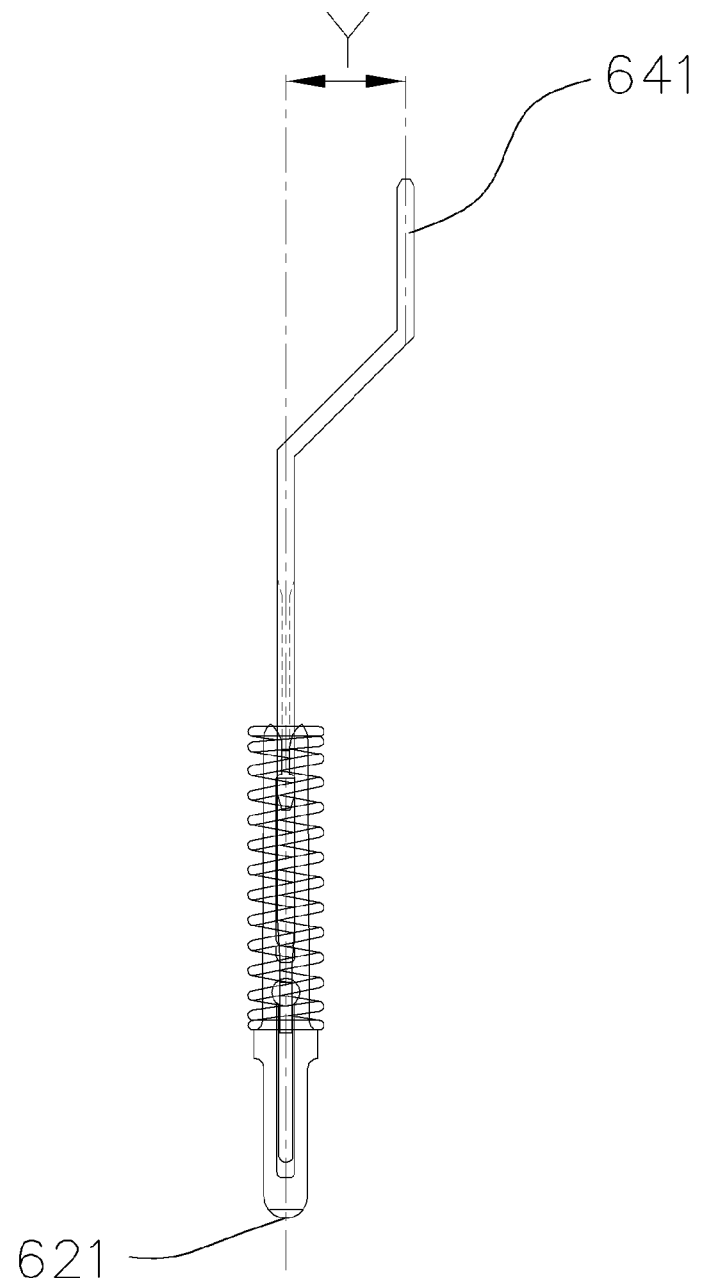

The construction of the first spring contact according to the present invention may be altered as shown in front and side sectional views of FIGS. 9a and 9b, in which the lower contact pin 510 has the same construction as that of the contact pin of FIGS. 5a and 5b and the upper contact pin 530 has the same construction of the contact pin of FIGS. 6a and 6b, and a spring 506 is fitted over the assembly of the upper and lower contact pins 530 and 510. FIG. 10 shows a state in which the upper contact pin 530 has been compressed against the lower contact pin 510 to the maximum. This spring contact is configured in such a way that the body end 549 of the upper contact pin 530 can be compressed against the contact portion 511 of the lower contact pin and, accordingly, the maximum compressed length is equal to the length of the upper contact pin 530.

The construction of the first spring contact according to the present invention may be further altered as follows.

In this spring contact 505, the upper contact pin 530 is configured to have the same construction as that of the lower contact pin 510, in which the moving grooves 536 extend in directions toward the contact portion 531 after passing the spring holding surfaces 534 of the two holding protrusions 532 and 533. Here, the second ends of the moving grooves 536 do not extend to the end of the contact portion 531.

Further, the moving grooves 516 of the lower contact pin 510 extend to the end of the contact portion 511 after passing the spring holding surfaces 514 of the holding protrusions 512 and 513 so that, when the upper contact pin 530 is compressed downward, a body end 549 of the body 538 of the upper contact pin 530 may reach the end of the contact portion 511 of the lower contact pin 510 or may pass by the end of the contact portion 511 of the lower contact pin 510.

The contact portions 511 of the upper and lower contact pins 530 and 510 may have an appropriate shape that are selected from a V-shape 951, a chamfered V-shape 952, a U-shape 953, a chamfered U-shape 954, a A-shape 955, a chamfered A-shape 956, a round shape 957 and a chamfered round shape 958 of FIGS. 39a through 39h depending on the characteristics of the target item they are to be placed in contact with. Of course, the shapes of the contact portions 511 may be variously changed according to the characteristics of the target item with which contact is to be made, without being limited to the shapes of FIGS. 39a through 39h.

Further, this first spring contact of the present invention is configured in such a way that the moving grooves 536 of the lower contact pin 510 extend to the end of the contact portion 511 after passing the spring holding surfaces 514 of the two spring holding protrusions 512 and 513.

When the spring contact 500, in which the upper contact pin 530 and the lower contact pin 510 are configured to have the same construction, is compressed to the maximum, the length of the spring contact is equal to the length of the upper or lower contact pin. However, when the spring contact 505, in which the length from the two spring holding protrusions 532 and 533 of the upper contact pin 530 to the contact portion 531 of the spring contact 505 is longer than that of the lower contact pin 510, is compressed to the maximum, the length of the spring contact 505 is equal to the length of the upper contact pin 530.

Accordingly, the present invention can provide the first spring contact in which the construction of the contact pin can minimize the compressed length of the spring contact 505 to 1 mm or less. Further, this invention can provide the spring contact 500, 505 that can efficiently perform superhigh-speed signal processing.

Hereinbelow, the construction of a first socket that is embedded with the first spring contacts according to the present invention will be described with reference to FIGS. 11a through 13c.

The socket 560 that is embedded with the spring contacts 505 includes an upper plate 561 and a lower plate 562 that are made of an engineering plastic material. In the socket 560, the spring contacts 505 are used to electrically connect the leads of an IC to corresponding pads of a PCB. Here, each of the upper plate 561 and the lower plate 562 includes one or a plurality of receiving holes 565, 566 for receiving a predetermined number of spring contacts 505 and the upper plate 561 and the lower plate 562 are assembled with each other. In a conventional socket, each of the upper plate 561 and the lower plate 562 typically has a thickness of 2 mm or more and the upper plate 561 and the lower plate 562 are typically assembled with each other using small locking bolts.

However, when the thickness of the upper plate 561 and the lower plate 562 is reduced to less than 2 mm or is reduced to 1 mm, it is impossible to assemble the upper and lower plates with each other using locking bolts due to the thin structures of the upper and lower plates.

That is, when the thickness of the upper plate 561 and the lower plate 562 is reduced to 1 mm, the length of locking bolts that are used to assemble the upper plate 561 and the lower plate 562 with each other should be reduced to 1 mm or less. However, because the height of the heads of the bolts is 0.4 mm, the effective length of the bolts is 0.5 mm or less so that the upper plate 561 and the lower plate 562 that have the total thickness of 2 mm or less may not be assembled with each other using bolts.

However, in the first socket that is embedded with the first spring contacts according to the present invention, the thin upper plate 561 and the thin lower plate 562 of the socket 560 can be assembled with each other without using bolts unlike the conventional socket.

The socket 560 that is embedded with the spring contacts 505 includes an upper plate 561 and a lower plate 562 that are made of an engineering plastic material. In the socket 560, the spring contacts 505 are used to electrically connect the leads of an IC to corresponding pads of a PCB. Here, each of the upper plate 561 and the lower plate 562 includes one or a plurality of receiving holes 565, 566 for receiving a predetermined number of spring contacts 505 and the upper plate 561 and the lower plate 562 are assembled with each other.

In the socket 560, a plurality of locking protrusions 564 are formed in an upper or lower part and corresponding stop bridges 563 are formed in the lower or upper part so that the locking protrusions 564 can be assembled with the stop bridges 563. Here, when the upper plate 561 and the lower plate 562 are assembled with or disassembled from each other, the locking protrusions 564 or the stop bridges 563 can be elastically deformed so that the locking protrusions 564 can be assembled with or disassembled from the corresponding stop bridges 563. To allow the locking protrusions 564 or the stop bridges 563 to be elastically deformed, a longitudinal hole 568 is formed in a side of each of the locking protrusions 564 or in a side of each of the stop bridges 563 so that thin elastic portions 569 can be formed in opposite sides of the locking protrusion 564 or in opposite sides of the stop bridge 563.

Accordingly, in the construction of the first socket that is embedded with the first spring contacts according to the present invention, the plurality of locking protrusions 564 or the stop bridges 563 are formed in the upper plate 561 and the corresponding stop bridges 563 or the corresponding locking protrusions 564 are formed in the lower plate 562 so that the upper and lower plates 561 and 562 can be assembled with each other without using bolts unlike the conventional socket. Here, when the stop bridges 563 and the locking protrusions 564 are assembled with or disassembled from each other, the stop bridges 563 and/or the locking protrusions 564 should be elastically deformed. To allow the locking protrusions 564 or the stop bridges 563 to be elastically deformed, a longitudinal hole 568 is formed in a side of each of the locking protrusions 564 or in a side of each of the stop bridges 563 so that thin elastic portions 569 can be formed in opposite sides of the locking protrusion 564 or in opposite sides of the stop bridge 563.

Therefore, the construction of the first socket that is embedded with the first spring contacts according to the present invention can provide an effective assembly structure for a socket that is embedded with short spring contacts.

Hereinbelow, the construction of an electromagnetic shielding first socket that is embedded with the first spring contacts according to the present invention will be described with reference to FIGS. 14a through 17. When an IC that typically outputs various kinds of signals is electrically connected to a PCB, the signals may interfere with each other or may be mixed with each other and, accordingly, it is required to efficiently transmit the signals without signal loss or signal distortion.

Therefore, in the construction of the electromagnetic shielding first socket that is embedded with the first spring contacts according to the present invention, the socket 580 that is embedded with one or a plurality of spring contacts 505 includes an upper plate 584, a lower plate 585 and the spring contacts 505, in which one or a plurality of receiving holes 586, 587 for receiving a predetermined number of spring contacts 505 are formed in each of the upper plate 584 and the lower plate 585. Here, the outside appearance of each of the receiving holes 586 that are formed on the upper plate 584 is shaped in the form of a column 581 so that a space 582 can be defined between the columns 581. Further, the upper plate 584 is covered with an electromagnetic shielding plate 570 that is provided with holes 571 at locations corresponding to the columns 581 so as to receive the respective columns 581. Therefore, when the socket 580 is assembled with a PCB, the electromagnetic shielding plate 570 is electrically connected to the ground of the PCB, thereby forming an electromagnetic shielding socket structure.

FIGS. 18a through 21b show a second spring contact according to the present invention, in which the spring contact 630, 640 includes a lower contact pin 620 having a contact portion 621, an upper contact pin 600, 642 and a spring 601. In the spring contact 630, 640, the contact pins 600, 642 are made of an electric conductive metal material. Generally, each of the upper and lower contact pins has a plate-shaped structure made of a copper alloy and having a body thickness t, and is preferably formed by plating nickel and by plating gold on the contact pin, thereby maximizing the electric conductivity of the contact pin. Here, the lower contact pin 620 has a contact portion 621 of a predetermined shape, two spring holding protrusions 612 that are provided in left and right sides of the contact pin so as to limit the length of an assembled spring and prevent the spring from being undesirably displaced, and a body 618. The upper contact pin 600 is coupled to the lower contact pin 620 in such a way that the two contact pins cross each other at right angles. Here, unlike the lower contact pin 620, the upper contact pin 600 has an eccentric contact portion 611, 641. The spring 601 is fitted over an assembly of the lower contact pin 620 and the upper contact pin 600 at a position between the upper and lower contact pins. Here, the body 618 of each of the lower contact pin 620 and the upper contact pin 600 has two symmetric elastic portions 619, an end of each of which has a thickness t1 that is less than the body thickness t, with an oblique surface 622, a locking protrusion 624 and a locking protrusion contact surface 623 being provided in the end of each of the two symmetric elastic portions 619. A moving slit 615 is defined between the two elastic portions 619 so as to form a moving space when the upper contact pin 600 and the lower contact pin 620 are assembled with each other. A stop surface 617 is formed on an end of the moving slit 615 and has left and right oblique surfaces 622 so that, when the upper contact pin 600 is compressed against the lower contact pin 620 to the maximum, the stop surfaces 617 of the two contact pins come into contact with each other and stop the compression. Moving grooves 616 are formed in each of the lower and upper contact pins 620 and 600 so that the locking protrusions 624 of the lower and upper contact pins 620 and 600 can be moved and stopped. The moving grooves 616 of the lower and upper contact pins 620 and 600 are brought into electric contact with the locking protrusion contact surfaces 623 of the lower and upper contact pins 620 and 600.

Here, as shown in FIGS. 18a through 19b, the moving grooves 616 are formed on upper and lower surfaces of each of the lower and upper contact pins, respectively. In each of the lower and upper contact pins, first ends of the moving grooves 616 have a stop hole 614-1 that forms a stop bridge 614 for stopping the locking protrusions 624 of an opposite contact pin, and second ends extend in directions toward the contact portion 621 after passing the spring holding surfaces 612-1 of the two spring holding protrusions 612 that function to limit the length of an assembled spring 601 and to prevent the spring from being undesirably displaced.

Further, each of the moving grooves 616 has a predetermined depth. Also, the distance between the bottoms of the opposite moving grooves 616 of each contact pin may be equal to, slightly longer than or slightly shorter than the distance between the contact surfaces 623 of the locking protrusions 624 of the two elastic portions 619.

Accordingly, the second spring contact of the present invention provides an eccentric spring contact 630, 640, in which the contact portion 611 of the upper contact pin 600 that has a predetermined shape eccentrically extends from the center of the body 618 so that the contact portion 621 of the lower contact pin 620 and the contact portion 611 of the upper contact pin 600 are offset from each other.

FIGS. 20a, 20b, 21a and 21b show that the contact portion 621 of the lower contact pin 620 of the second spring contact according to the present invention is offset from the contact portion 611 of the upper contact pin 600.

Further, the contact portions 611 and 621 of the upper and lower contact pins 600 and 620 may have an appropriate shape selected from the V-shape 951, the chamfered V-shape 952, the U-shape 953, the chamfered U-shape 954, the A-shape 955, the chamfered A-shape 956, the round shape 957 and the chamfered round shape 958 of FIGS. 39a through 39h according to the characteristics of the target item that they are to be put in contact with. Of course, the shapes of the contact portions may be variously changed according to the characteristics of the target item they will make contact with, without being limited to the shapes of FIGS. 39a through 39h.

Figure 22A:
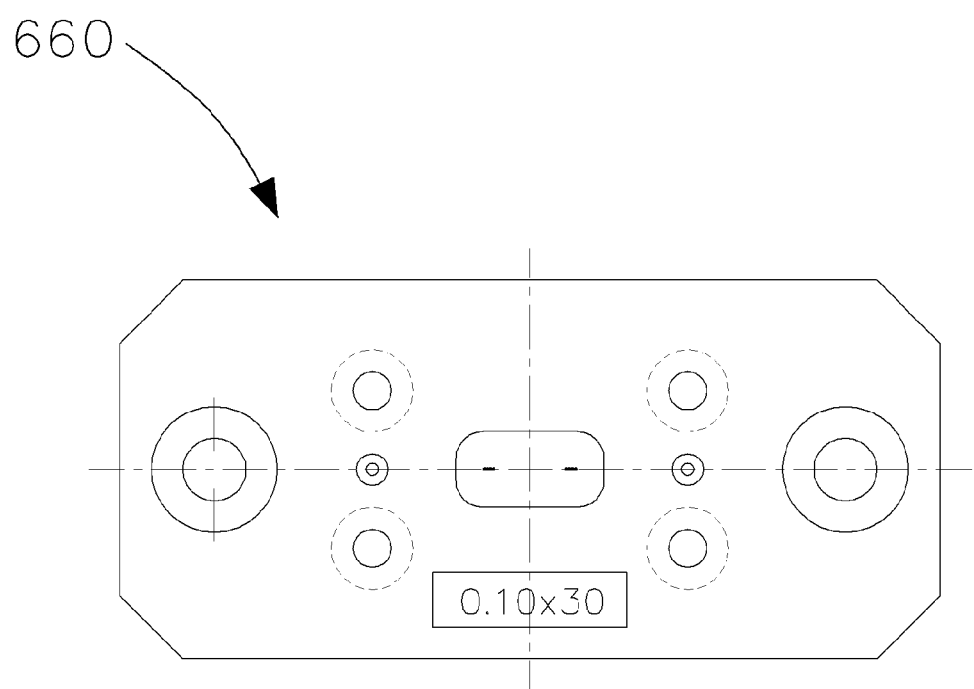
FIG. 22a is a plan view illustrating the construction of a third socket embedded with the second eccentric spring contact according to the present invention.
Figure 22B:
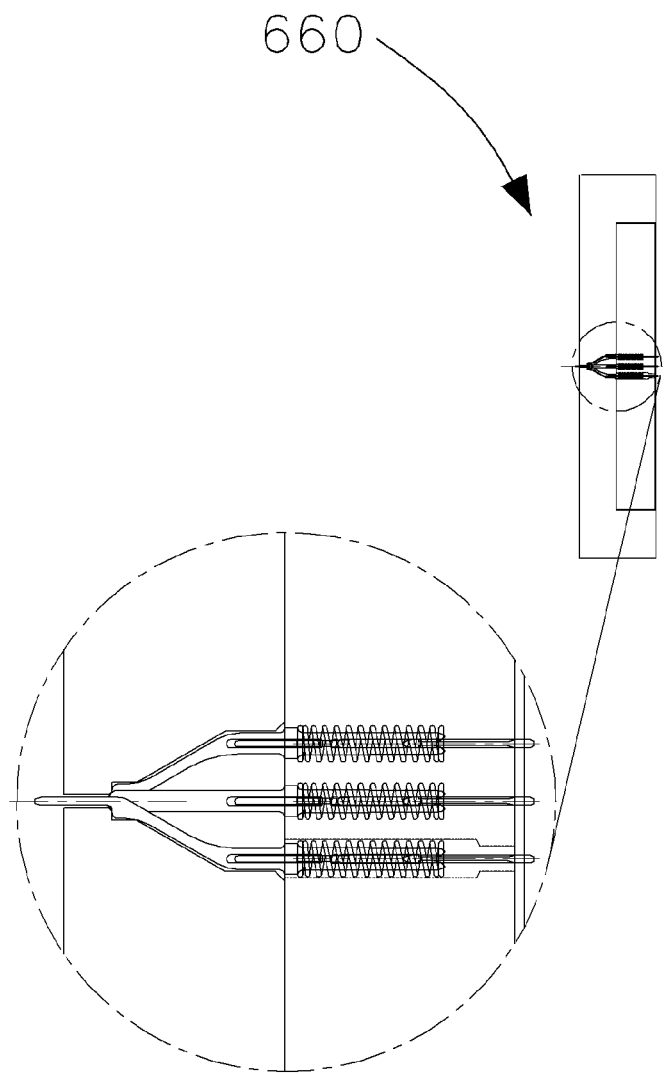
Figure 22C:
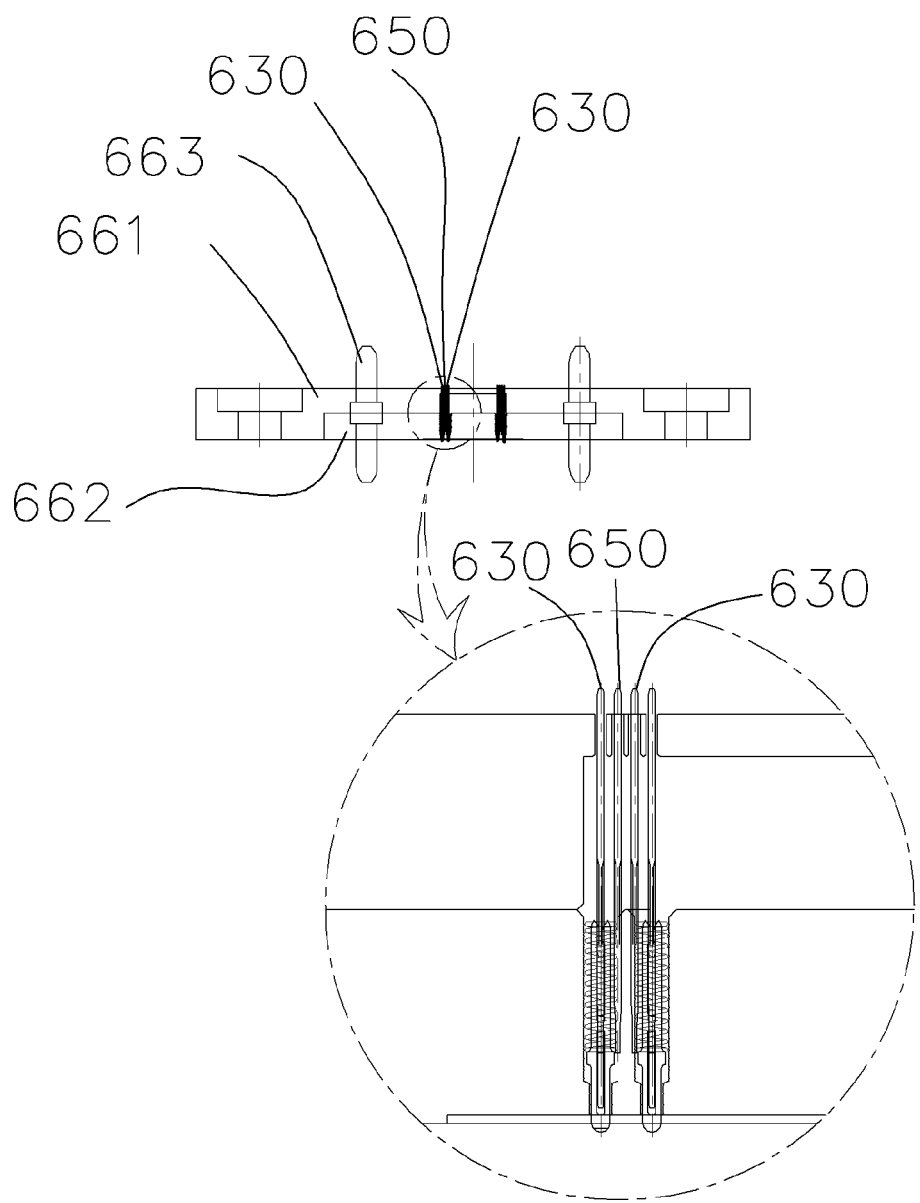
Figure 22D:
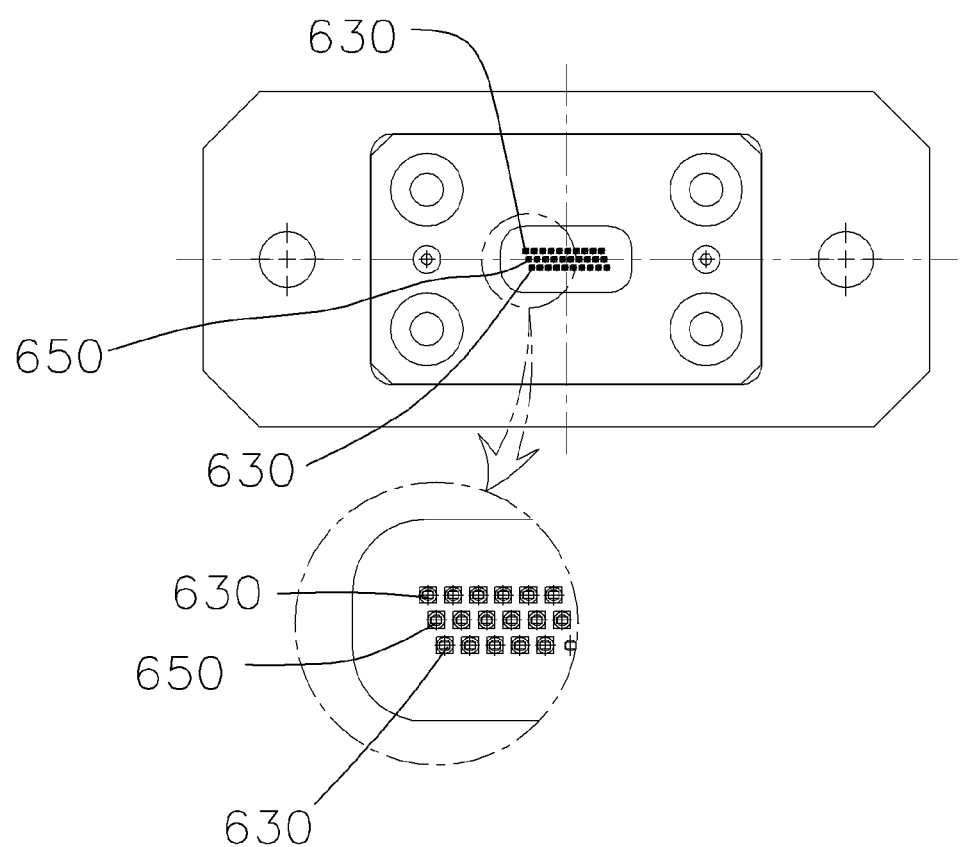
Figure 23A:
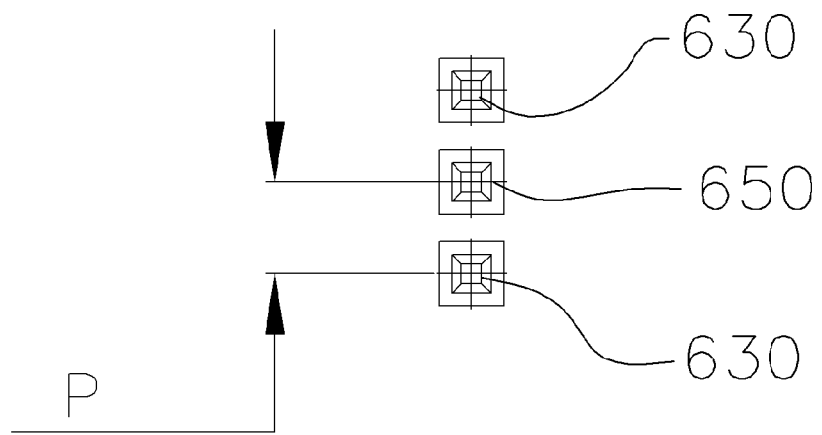
FIG. 23b is an enlarged view of FIG. 22b, and FIGS. 23a and 23c are a plan view and a bottom view, respectively.
Figure 23B:
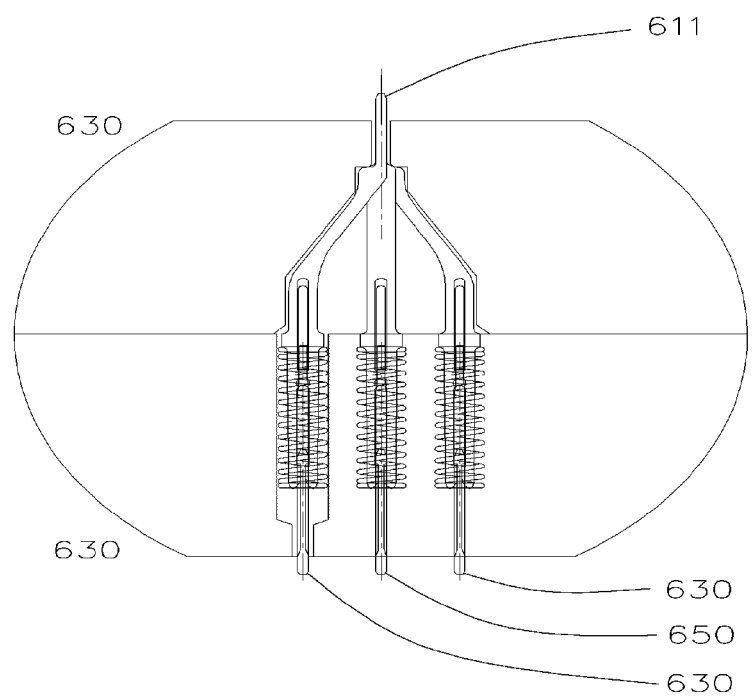
Figure 23C:
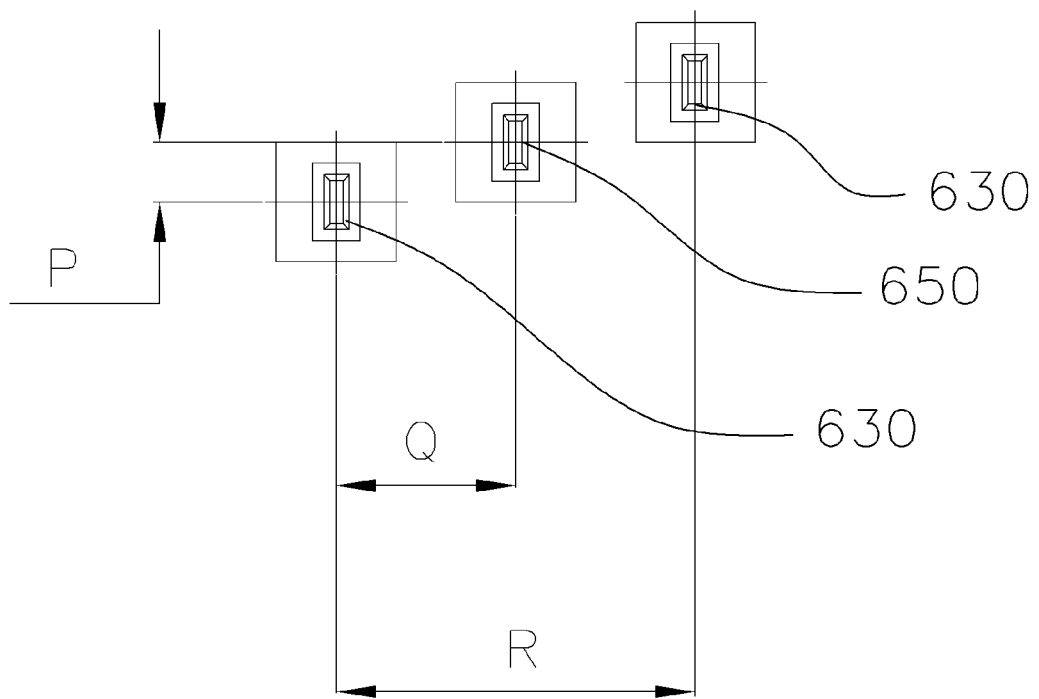

FIGS. 22a through 22c show the construction of a socket that is embedded with the eccentric second spring contacts according to the present invention.

The socket 660 includes an upper plate 661, a lower plate 662 and a plurality of guide pins 663, in which a plurality of spring contact receiving holes having predetermined shapes are formed in each of the upper plate 661 and the lower plate 662. In the socket, spring contacts 630 (tentatively named A), in which the contact portion 621 of each of the lower contact pins 620 is offset from the contact portion 611 of the upper contact pin 600, and spring contacts 650 (tentatively named B), in which the contact portion 611 of each of the lower contact pins 620 is concentric with the contact portion 621 of the upper contact pin 600, are arranged in order of A, B, A. Here, the upper contact pins 600 are arranged in a straight line, in which the pitch (tentatively named P) between the upper contact pins 600 can be reduced to ⅓ of the pitch between the spring contacts 650 that are arranged in a straight line and in which the contact portion 621 of each of the plurality of lower contact pins 620 is concentric with the contact portion 611 of the upper contact pin 600. Further, various kinds of eccentric spring contacts 650 (tentatively named C, A), which have different offset distances between the upper and lower contact portions 611 and 621, and the concentric spring contacts 650 (tentatively named B), in which the upper and lower contact portions 611 and 621 are concentric with each other, are arranged in a combinatory manner to form a straight arrangement of C, A, B, A, C, thereby forming an in-line fine pitch socket in which the pitch between the upper contact pins 600 is reduced to one of the plural number.

The construction of the socket that is embedded with the eccentric second spring contacts according to the present invention can provide a spring contact and a socket embedded with the spring contacts, which can efficiently test a target item that has a fine pitch lead array (0.4 mm pitch or less), for example, the leads of an LCD or ICs having a fine pitch lead array (0.4 mm pitch or less).

Hereinbelow, a third spring contact according to the present invention, a socket that is embedded with the third spring contacts and a variety of soldering structures of the third spring contacts will be described with reference to FIGS. 24a through 36c.

Here, the spring contact 700 includes an upper contact pin 705, a lower contact pin 710 and a spring 701.

Each of the upper and lower contact pins has a plate-shaped structure having a body thickness t and is preferably formed by plating nickel and by plating gold on the contact pin, thereby maximizing the electric conductivity of the contact pin. Here, the lower contact pin 710 has a contact portion 711 of a predetermined shape, two spring holding surfaces 714 that are provided in left and right sides of the contact pin so as to limit the length of an assembled spring and prevent the spring from being undesirably displaced, and a body 718. The upper contact pin 705 is coupled to the lower contact pin 710 in such a way that the two contact pins cross each other at right angles. The lower contact pin 705 has a contact portion 735 of a predetermined shape, two spring holding protrusions 732 and two spring holding surfaces 734 that are provided in left and right sides of the contact pin so as to limit the length of an assembled spring 701 and prevent the spring from being undesirably displaced, and a body 718. The spring 701 is fitted over an assembly of the lower contact pin 710 and the upper contact pin 705 at a position between the upper and lower contact pins. Here, the body 718 of each of the lower contact pin 710 and the upper contact pin 705 has two symmetric elastic portions 719, an end of each of which has a thickness t1 that is less than the body thickness t, with an oblique surface 722, a locking protrusion 721 and a locking protrusion contact surface 723 being provided in the end of each of the two symmetric elastic portions 719. A moving slit 720 is defined between the two elastic portions 719 so as to form a moving space when the upper contact pin 705 and the lower contact pin 710 are assembled with each other. A stop surface 725 is formed on an end of the moving slit 720 and has left and right oblique surfaces 726 so that, when the upper contact pin is compressed against the lower contact pin to the maximum, the stop surfaces 725 of the two contact pins come into contact with each other and stop the compression. Moving grooves 716 are formed in each of the lower and upper contact pins 710 and 705 so that the locking protrusions 721 of the lower and upper contact pins 710 and 705 can be moved and stopped. The moving grooves 716 of the lower and upper contact pins 710 and 705 are brought into electric contact with the locking protrusion contact surfaces 723 of the lower and upper contact pins 710 and 705. Here, the moving grooves 716 are formed on upper and lower surfaces of each of the lower and upper contact pins 710 and 705, respectively. In each of the lower and upper contact pins, first ends of the moving grooves 716 have a stop hole 727 that forms a stop bridge 717 for stopping the locking protrusions 721 of an opposite contact pin, and second ends extend in directions toward the contact portion 711, 735 after passing the spring holding surfaces 714, 734 that function to limit the length of an assembled spring 701 and to prevent the spring from being undesirably displaced. Further, a hole 728 is formed between the extended ends of the opposite moving grooves 716 of the lower contact pin 710.

Further, each of the moving grooves 716 has a predetermined depth. Also, the distance between the bottoms of the opposite moving grooves 716 of each contact pin may be equal to, slightly longer than or slightly shorter than the distance between the contact surfaces 723 of the locking protrusions 721 of the two elastic portions 719.

In the lower contact pin 710, the two spring holding surfaces 714 further extend so as to form an assembly stop surface 713 for inserting the lower contact pin 710 into a molded socket body 741 under pressure. Further, this contact pin 710 has spring holding protrusions 732 that further extend in opposite directions, with a pressure holding protrusion 730 being formed on an end surface 729 of each of the spring holding protrusions 732 so as to prevent the lower contact pin 710 from being undesirably displaced after the lower contact pin 710 has been inserted into the molded socket body 741. Therefore, a spring contact 700 in which the contact portion 711 of the lower contact pin 710 can be soldered to a PCB is provided.

Figure 24A:
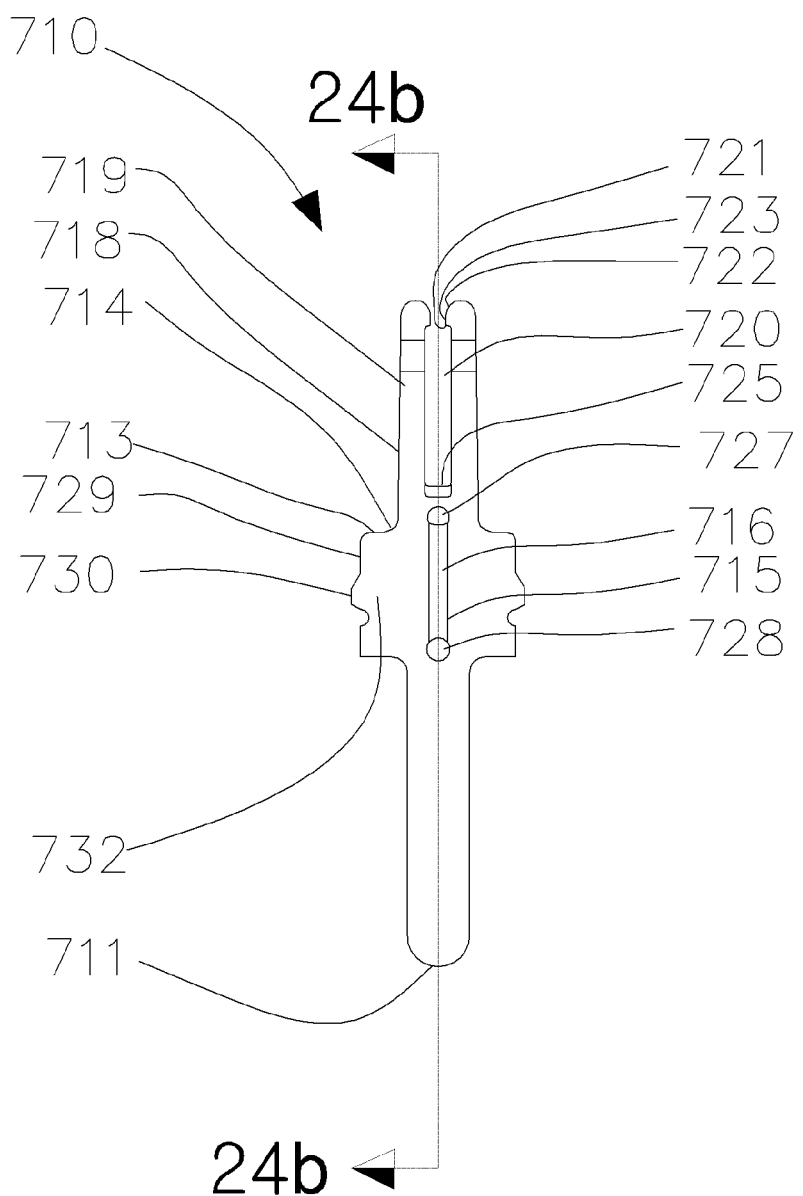
FIG. 24a is a view illustrating the construction of a lower contact pin of a third spring contact according to the present invention.
Figure 24B:
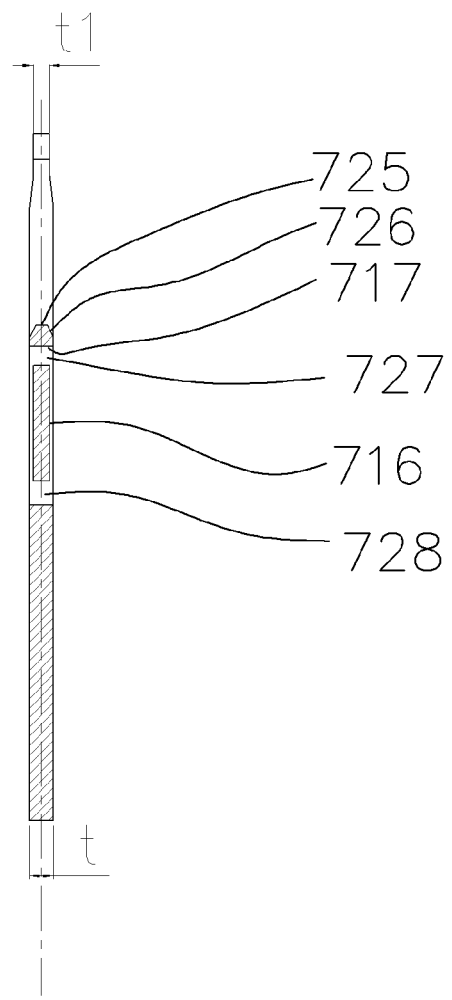
Figure 25A:
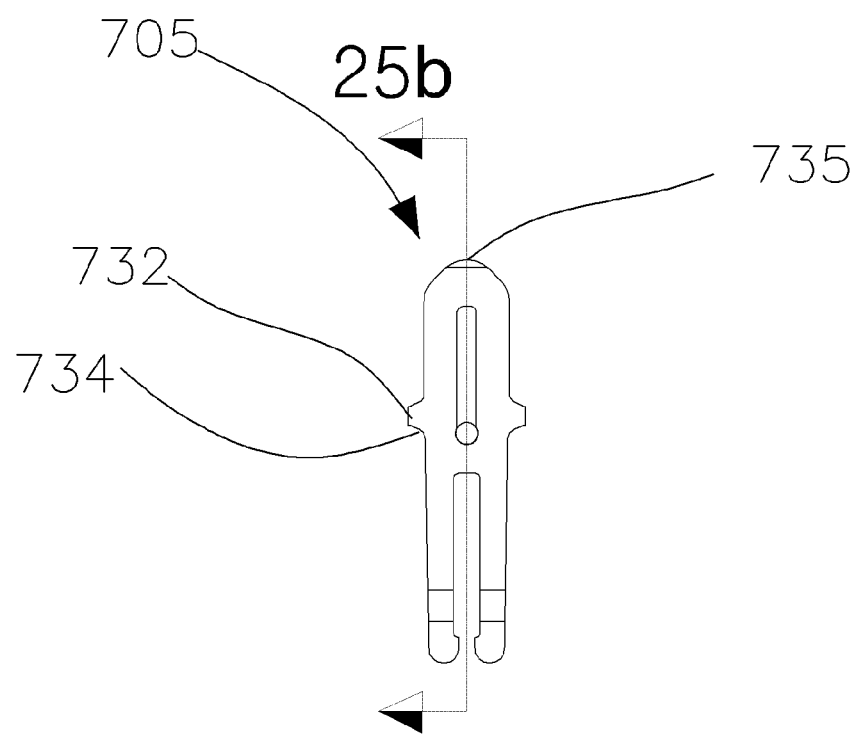
FIG. 25a is a view illustrating the construction of an upper contact pin of the third spring contact according to the present invention.
Figure 25B:
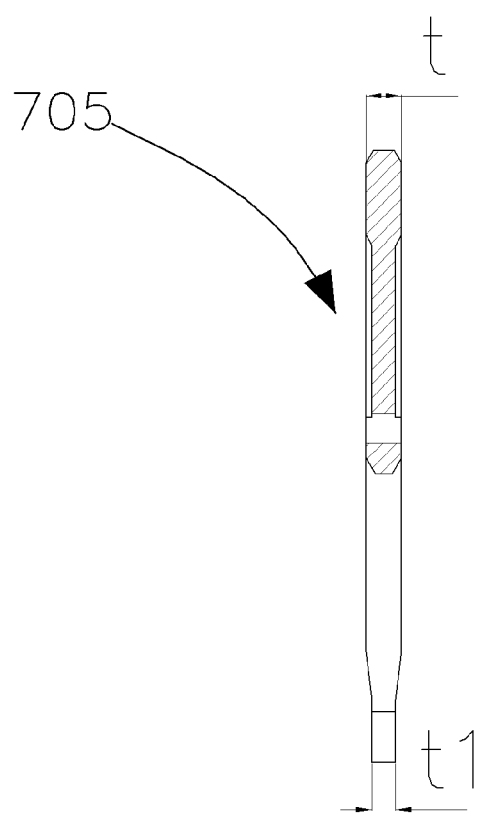
Figure 26A:
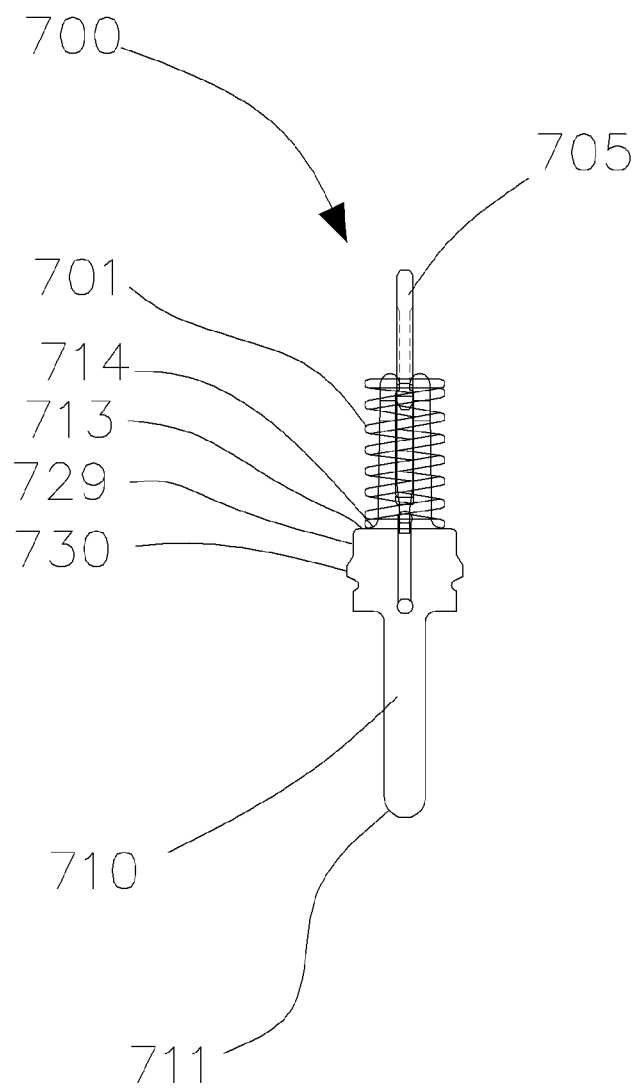
FIGS. 26a and 26b are views illustrating the construction of the third spring contact according to the present invention.
Figure 26B:
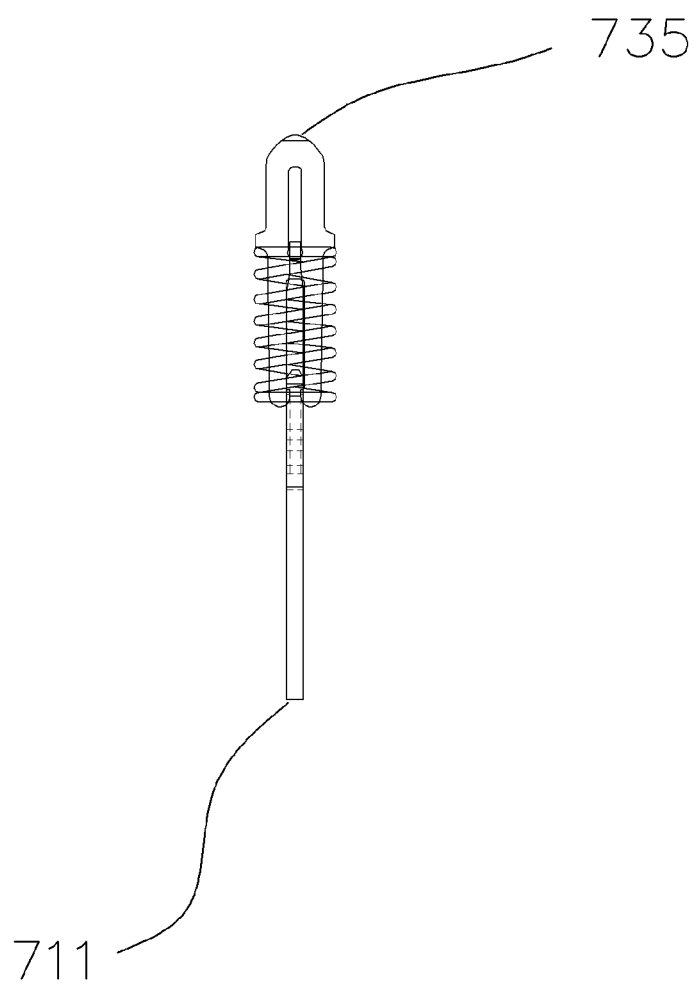
Figure 27A:
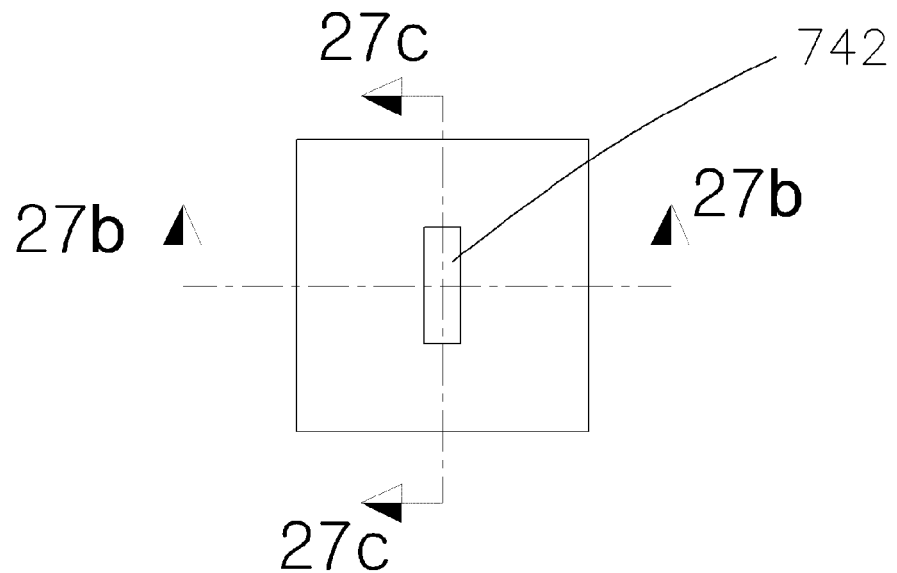
FIG. 27a is a view illustrating a housing structure of a fourth socket embedded with the third spring contact according to the present invention.
Figure 27B:
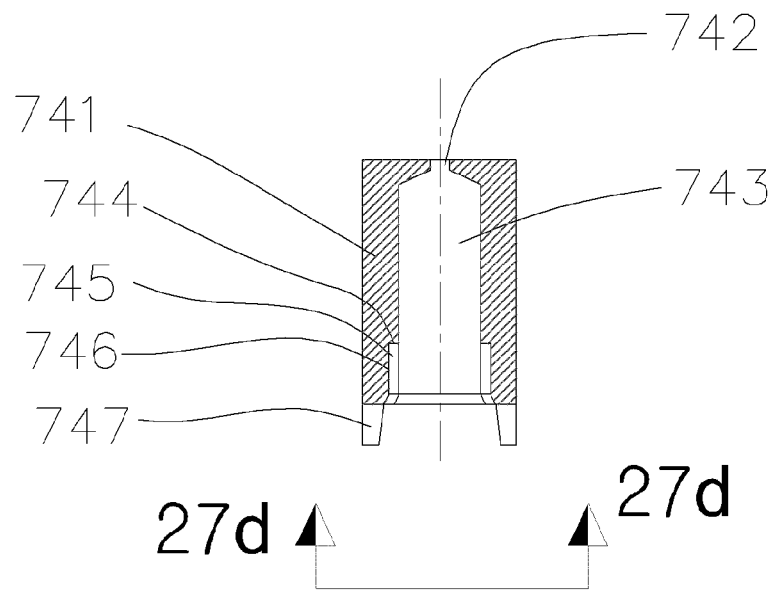
Figure 27C:
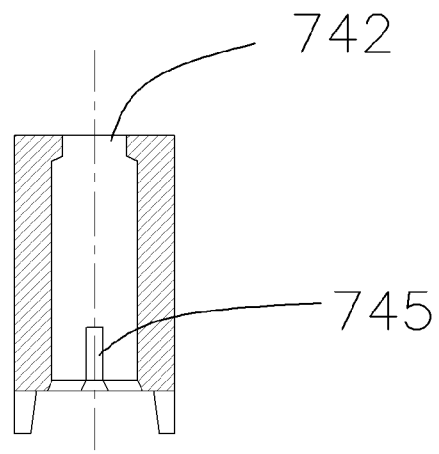
Figure 27D:
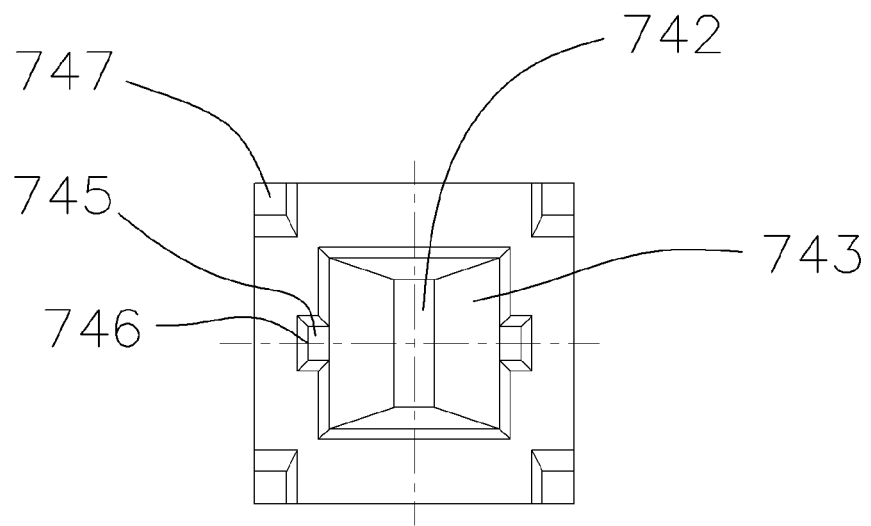
FIG. 27d is a sectional view taken along the arrow-line 27d in FIG. 25b.

FIGS. 24a and 24b show the lower contact pin of the third spring contact according to the present invention, FIGS. 25a and 25b show the upper contact pin, and FIGS. 26a and 26b show the third spring contact of the present invention.

Here, the contact portions 735 and 711 of the upper and lower contact pins 705 and 710 may have an appropriate shape that are selected from the V-shape 951, the chamfered V-shape 952, the U-shape 953, the chamfered U-shape 954, the A-shape 955, the chamfered A-shape 956, the round shape 957 and the chamfered round shape 958 of FIGS. 39a through 39h according to the characteristics of a target item to make contact with. Of course, the shapes of the contact portions may be variously changed according to the characteristics of the target item with which it will make contact, without being limited to the shapes of FIGS. 39a through 39h.

Hereinbelow, the construction of a third spring contact according to the present invention and a socket that is embedded with the third spring contacts will be described with reference to FIGS. 27a through 29c.

In a socket that is embedded with one or a plurality of spring contacts, each of the spring contacts 700 includes an upper contact pin 705, a lower contact pin 710 and a spring 701. Here, each of the upper and lower contact pins has a plate-shaped structure having a body thickness t and is preferably formed by plating nickel and by plating gold on the contact pin, thereby maximizing the electric conductivity of the contact pin. The lower contact pin 710 has a contact portion 711 of a predetermined shape, two spring holding surfaces 714 that are provided in left and right sides of the contact pin so as to limit the length of the assembled spring 701 and prevent the spring from being undesirably displaced, and a body 718. The upper contact pin 705 is coupled to the lower contact pin 710 in such a way that the two contact pins cross each other at right angles. The lower contact pin 705 has a contact portion 735 of a predetermined shape, two spring holding protrusions 732 and two spring holding surfaces 734 that are provided in left and right sides of the contact pin so as to limit the length of the spring 701 and prevent the spring from being undesirably displaced, and a body 718. The spring 701 is fitted over an assembly of the lower contact pin 710 and the upper contact pin 705 at a position between the upper and lower contact pins. Here, the body 718 of each of the lower contact pin 710 and the upper contact pin 705 has two symmetric elastic portions 719, an end of each of which has a thickness t1 that is less than the body thickness t, with an oblique surface 722, a locking protrusion 721 and a locking protrusion contact surface 723 being provided in the end of each of the two symmetric elastic portions 719. A moving slit 720 is defined between the two elastic portions 719 so as to form a moving space when the upper contact pin 705 and the lower contact pin 710 are assembled with each other. A stop surface 725 is formed on an end of the moving slit 720 and has left and right oblique surfaces 726 so that, when the upper contact pin is compressed against the lower contact pin to the maximum, the stop surfaces 725 of the two contact pins come into contact with each other and stop the compression. Moving grooves 716 are formed in each of the lower and upper contact pins 710 and 705 so that the locking protrusions 721 of the lower and upper contact pins 710 and 705 can be moved and stopped. The moving grooves 716 of the lower and upper contact pins 710 and 705 are brought into electric contact with the locking protrusion contact surfaces 723 of the lower and upper contact pins 710 and 705. Here, the moving grooves 716 are formed on upper and lower surfaces of each of the lower and upper contact pins 710 and 705, respectively. In each of the lower and upper contact pins, first ends of the moving grooves 716 have a stop hole 727 that forms a stop bridge 717 for stopping the locking protrusions 721 of an opposite contact pin, and second ends extend in directions toward the contact portion 711 after passing the spring holding surfaces 714, 734 that function to limit the length of the assembled spring 701 and to prevent the spring from being undesirably displaced. Further, a hole 728 is formed between the extended ends of the opposite moving grooves 716 of the lower contact pin 710.

Further, each of the moving grooves 716 has a predetermined depth. Also, the distance between the bottoms of the opposite moving grooves 716 of each contact pin may be equal to, slightly longer than or slightly shorter than the distance between the contact surfaces 723 of the locking protrusions 721 of the two elastic portions 719.

In the lower contact pin 710, the two spring holding surfaces 714 further extend so as to form an assembly stop surface 713 for inserting the lower contact pin 710 into a molded socket body 741 under pressure. Further, the spring holding protrusions 732 of this contact pin 710 further extend in opposite directions, with a pressure holding protrusion 730 being formed on an end surface 729 of each of the spring holding protrusions so as to prevent the lower contact pin 710 from being undesirably displaced after the lower contact pin 710 has been inserted into the molded socket body 741, so that the contact portion 711 of the lower contact pin 710 can be soldered to a PCB. The molded socket body 741 is provided with receiving holes 743 for receiving one or a plurality of spring contacts 700. A through hole 742 is formed in a first end of each of the receiving holes 743 so as to allow the contact portion 735 of the upper contact pin 705 to be exposed outside the receiving hole 743. Opposite fitting steps 745 are formed in a second end of the receiving hole 743 so as to exert pressure that holds the pressure holding protrusions 730 that are formed on the end surfaces of the two extended spring holding protrusions 732 of the lower contact pin 710. Here, both the distance between opposing side walls 746 of the two fitting steps 745 and the width of each of the two fitting steps 745 are determined according to both the distance between the opposite end surfaces 729 of the spring holding protrusions 732 of the spring contact 700 and the thickness of the lower contact pin 710. Pressure stop surfaces 744 are formed in the molded socket body 741 so as to stop the assembly stop surfaces 713 that are formed on the extended spring holding surfaces 714 of the lower contact pin 710. Further, socket stand-offs 747 are formed in the lower end of the molded socket body 741 so as to allow the socket to be soldered to a PCB in a state in which the socket is in close and horizontal contact with the PCB. Therefore, a socket, in which the lower contact pin 710 of the spring contact 700 that is received in the receiving hole 743 of the molded socket body 741 is held in the molded socket body 741 and the upper contact pin 705 can be vertically moved through the through hole 742, and the contact portion 711 of the lower contact pin 710 can be soldered to a PCB.

FIGS. 27a through 27d show the construction of a molded body of a third socket embedded with spring contacts according to the present invention. This molded body is preferably made of an engineering plastic material.

Figure 28A:
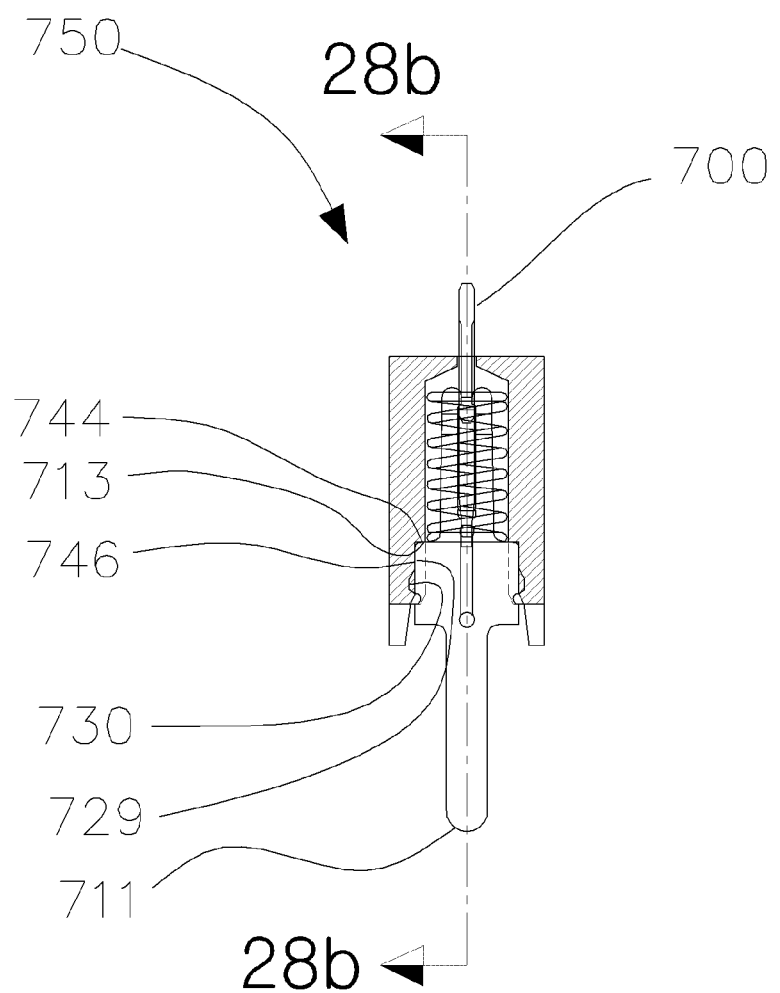
FIG. 28a is a view illustrating a vertical type fourth socket embedded with the third spring contact according to the present invention.
Figure 28B:
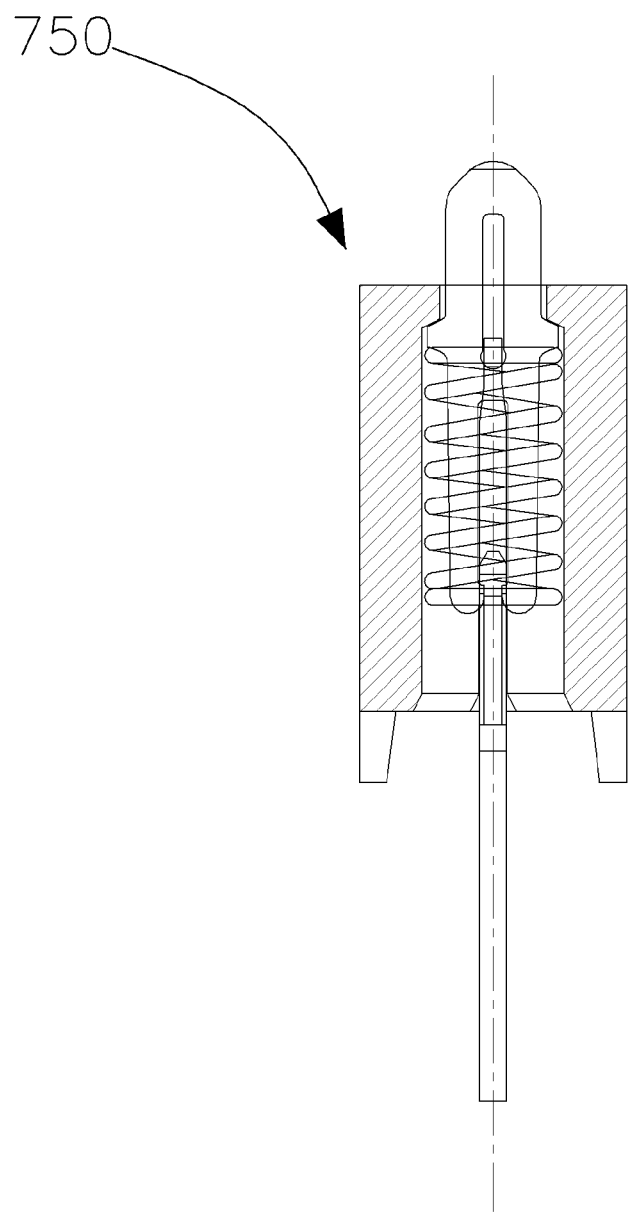
Figure 29A:
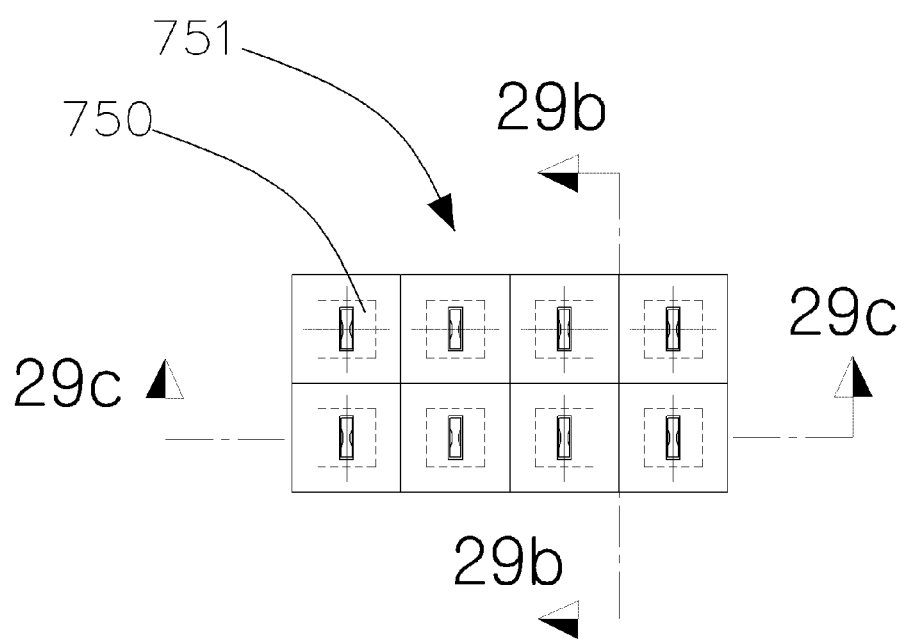
FIG. 29a is a view illustrating the construction of a vertical type fourth socket that is embedded with multi-arrayed third spring contacts according to the present invention.
Figure 29B:
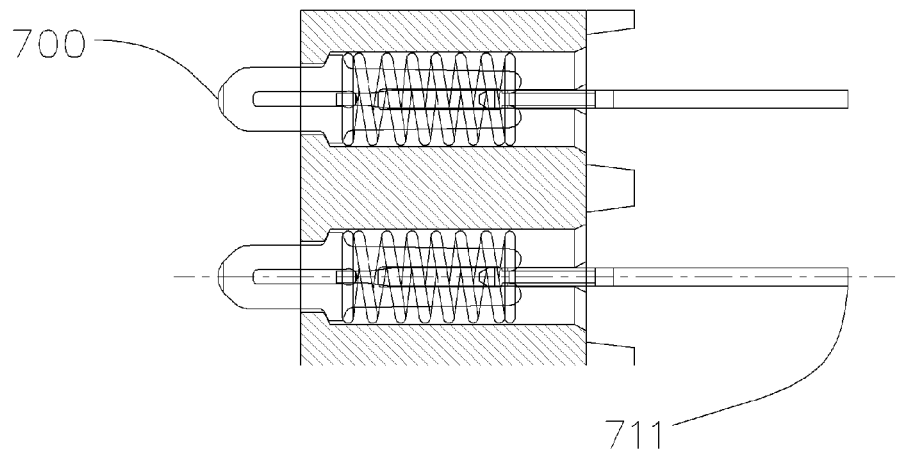
Figure 29C:
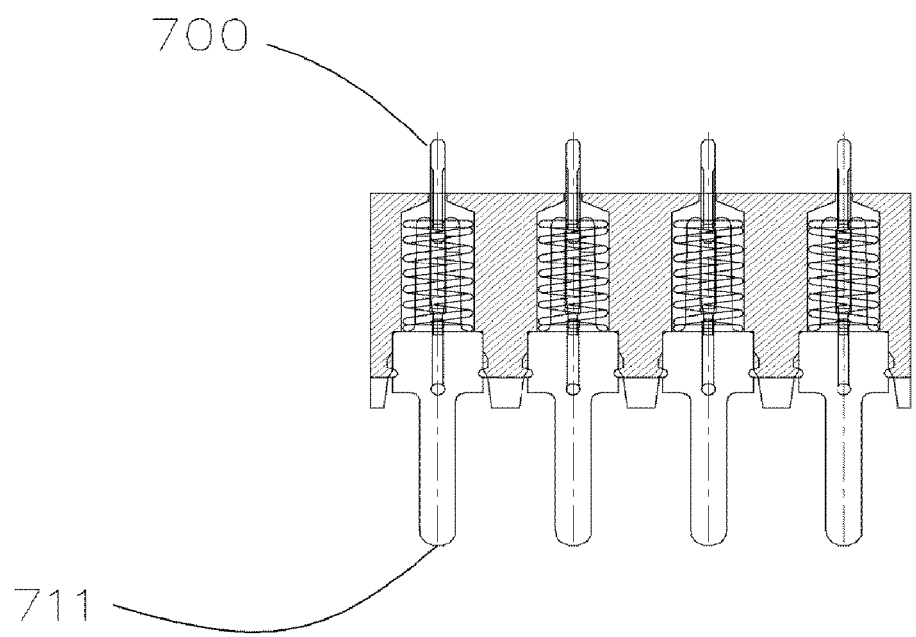

FIGS. 28a and 28b show the construction of the third socket embedded with spring contacts according to the present invention, and FIGS. 29a through 29c show a socket that is embedded with a plurality of third spring contacts according to the present invention.

The construction of the socket that is embedded with the third spring contacts according to the present invention can provide a spring contact 700 and a socket embedded with spring contacts 750, in which the spring contact can electrically connect IC leads of a CPU to a PCB that is installed in a personal computer (PC) or a mobile phone. The socket of this invention can further provide a socket embedded with spring contacts which can electrically connect a variety of battery connectors or a variety of ink cartridges of color printers. A broader use of the socket of this invention is to efficiently use it to electrically connect one side to another side.

Hereinbelow, a variety of constructions of the third spring contacts according to the present invention that can be practically used in a variety of applications and a variety of constructions of the socket that is embedded with the third spring contacts will be described with reference to FIGS. 30a through 36c.

FIGS. 28a and 28b are views illustrating a through hole soldered socket, in which the contact portion 711 of the lower contact pin 710 extends vertically and straight so that the socket can be soldered to a through hole of a PCB.

FIGS. 29a, 29b and 29c show the construction of a multi-arrayed vertical type socket 751 that is embedded with the third spring contacts according to the present invention.

Figure 30A:
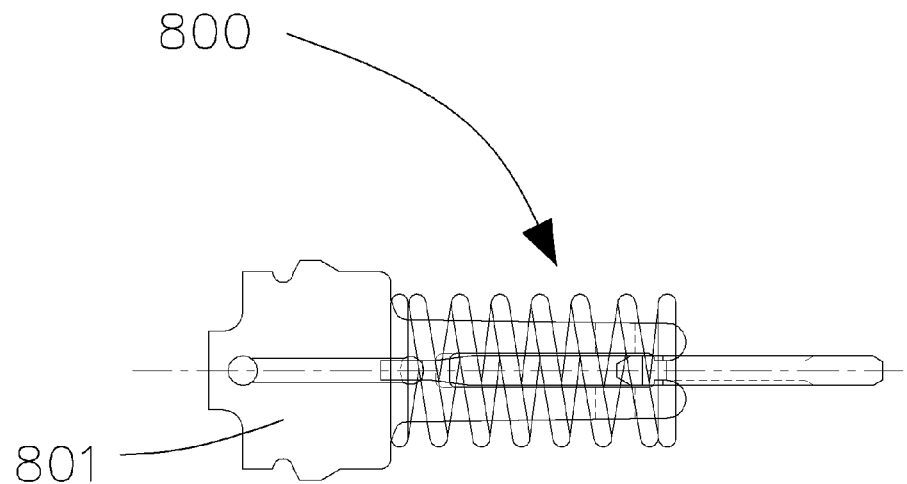
FIGS. 30a and 30b are a plan view and a front view illustrating an angle type through hole soldered spring contact in which the contact portion of the lower contact pin of the third spring contact according to the present invention is bent at an angle of 90 degrees.
Figure 30B:
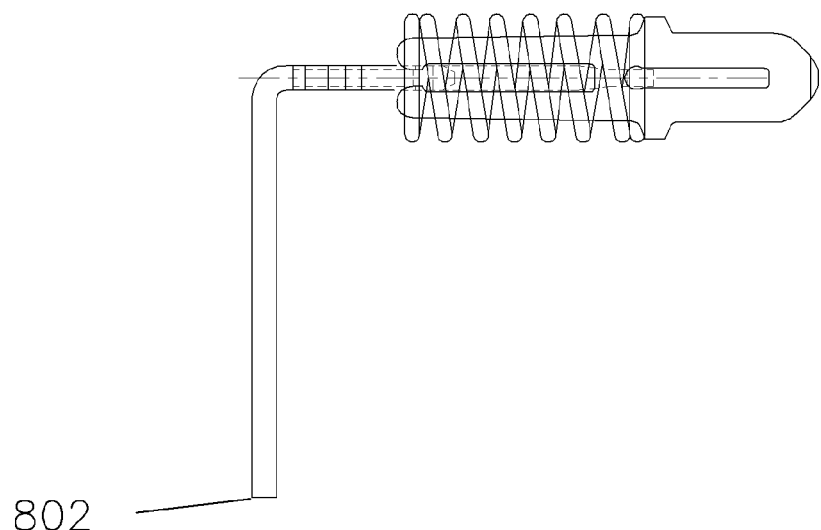
Figure 30C:
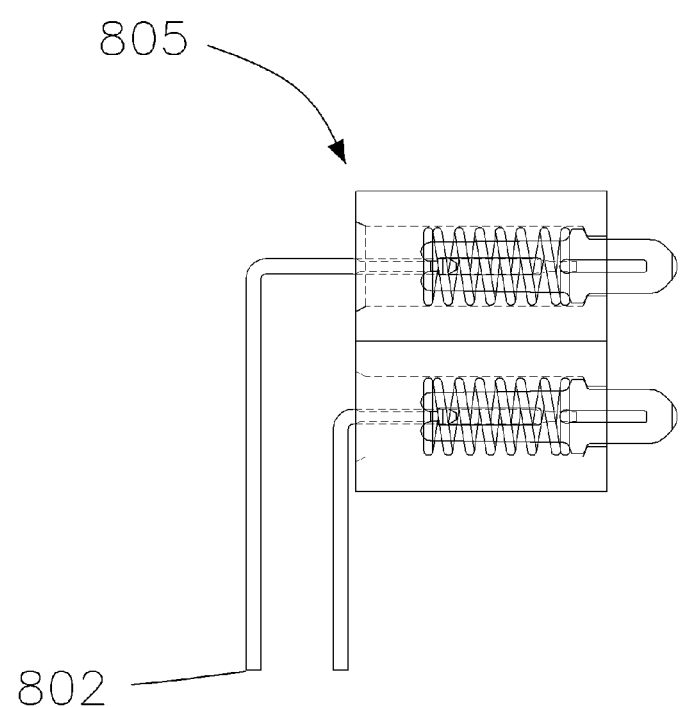
FIG. 30c is a front view illustrating an angle type through hole soldered socket that is embedded with multi-arrayed angle type through hole soldered spring contacts.

FIGS. 30a and 30b show a spring contact 800 in which the contact portion 802 of the lower contact pin 801 is bent at an angle of 90 degrees, and FIG. 30c shows an angle type through hole soldered socket 805 that can be soldered to a through hole of a PCB.

Figure 31A:
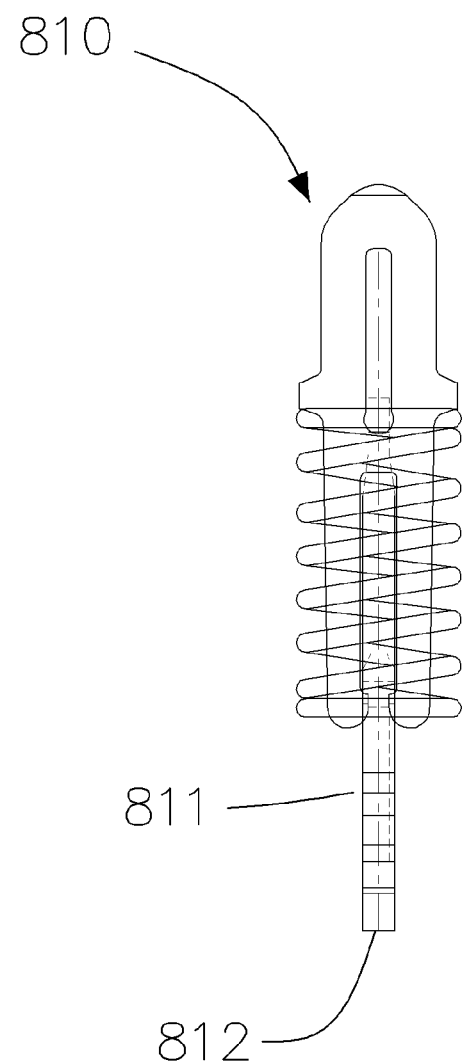
FIGS. 31a and 31b are a plan view and a side view illustrating a vertical surface-mount technology (SMT) type spring contact in which the contact portion of the lower contact pin of the third spring contact according to the present invention is to be vertically surface-mounted by soldering.
Figure 31B:
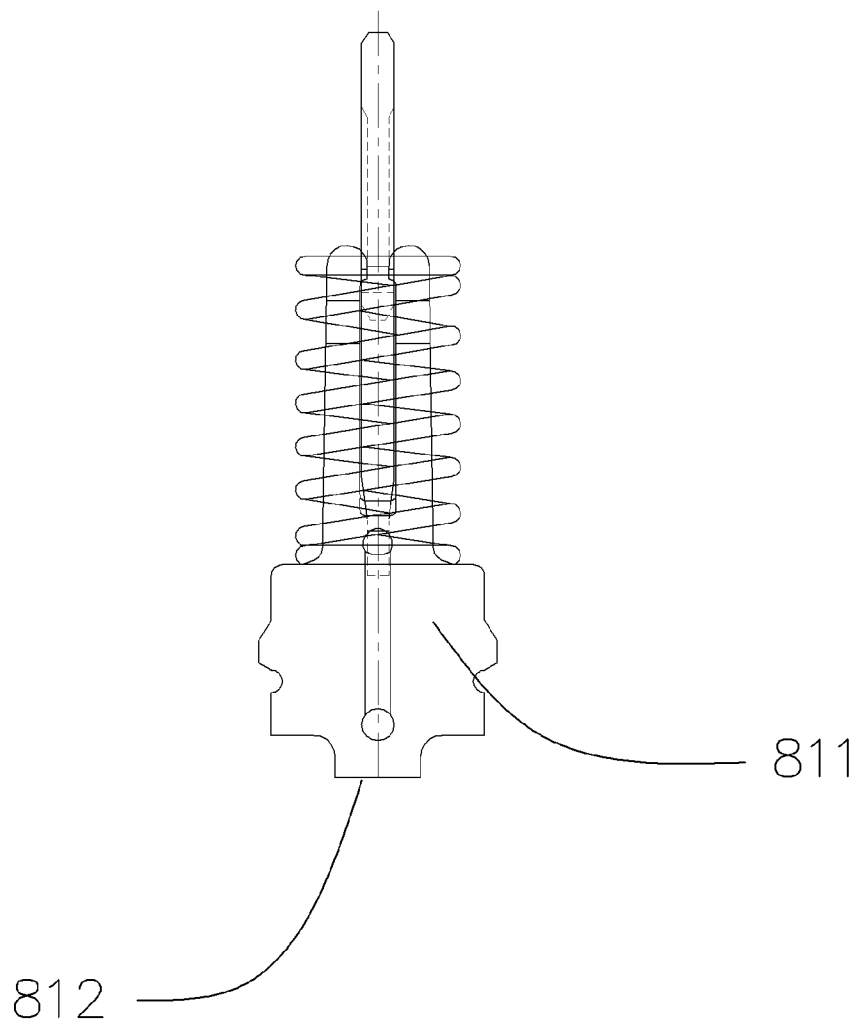
Figure 32A:
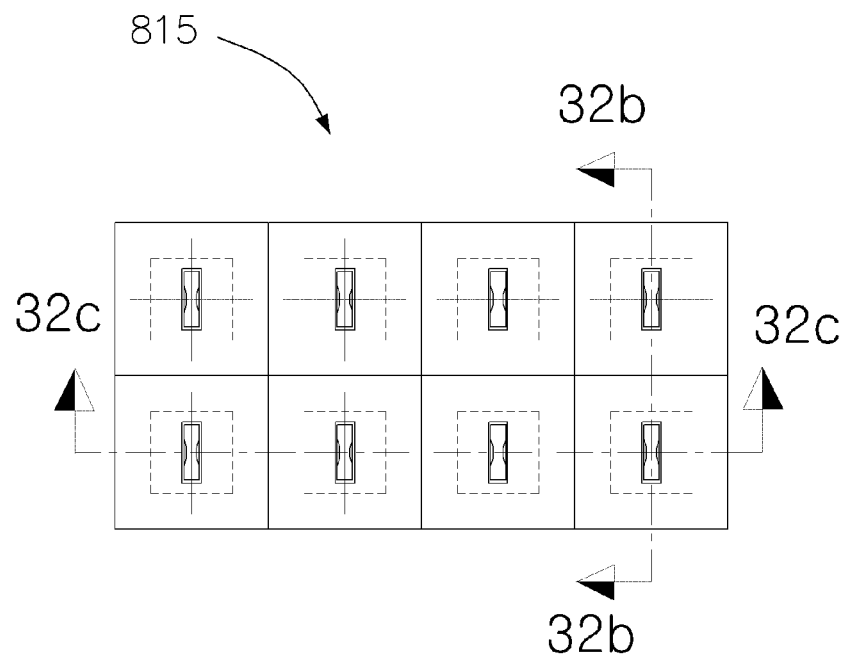
FIG. 32a is a plan view illustrating a vertical SMT type socket that is embedded with vertical SMT type spring contacts in which the contact portion of the lower contact pin of the third spring contact according to the present invention is to be vertically surface-mounted by soldering.
Figure 32B:
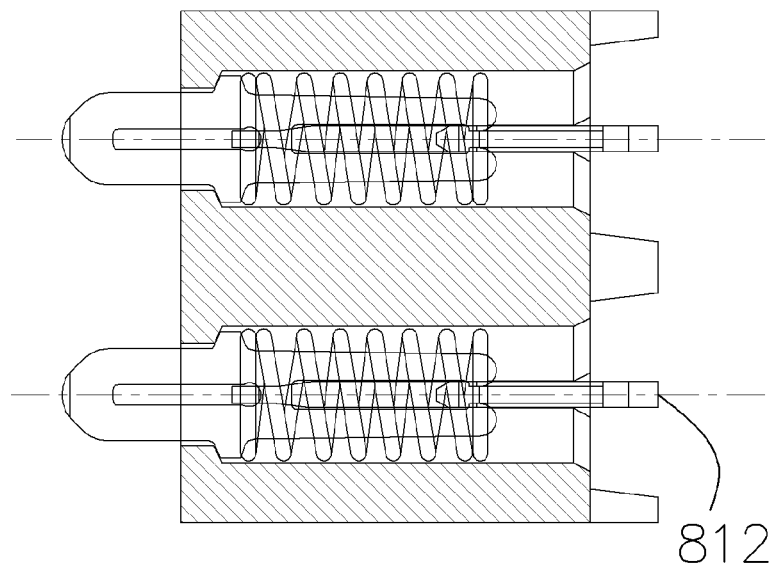
Figure 32C:
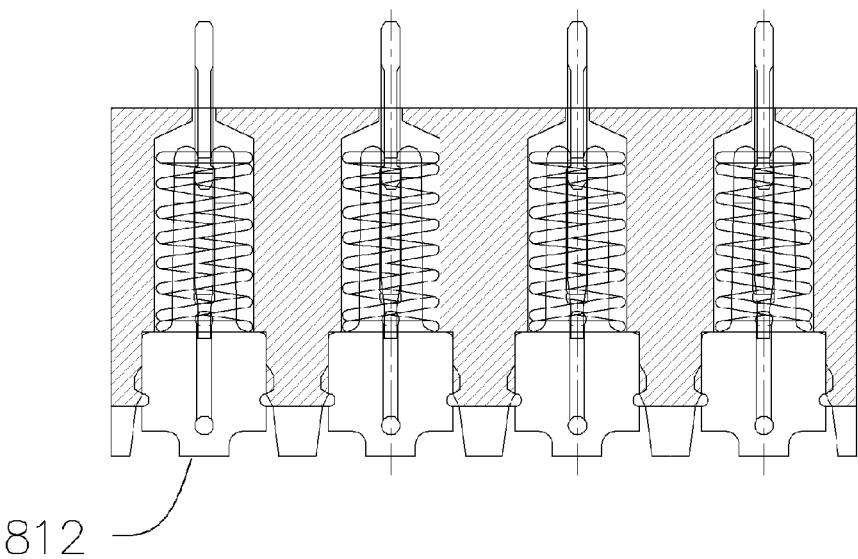

FIGS. 31a and 31b show a vertical SMT type spring contact 810 in which the contact portion 812 of the lower contact pin 811 is configured into a short straight contact portion and can be vertically surface-mounted to a PCB by soldering. FIGS. 32a through 32c show a socket 815 that is embedded with the vertical SMT type spring contacts.

Figure 33A:
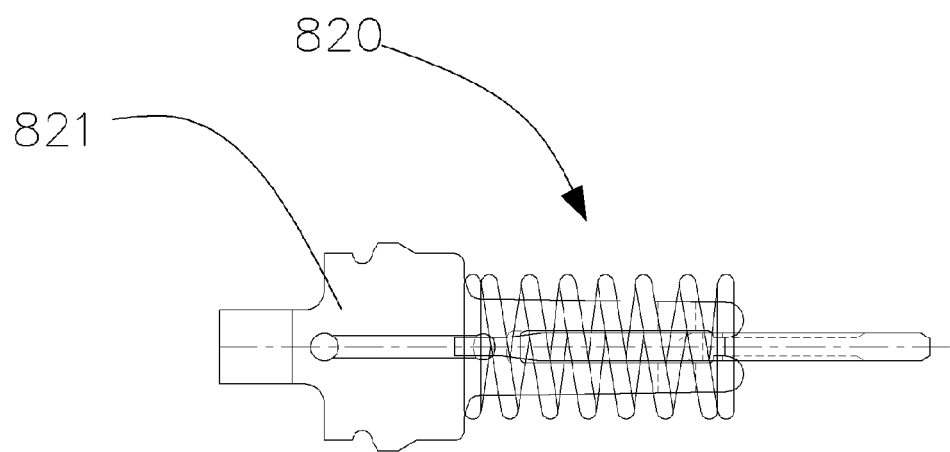
FIGS. 33a and 33b are a plan view and a front view illustrating an angle SMT type spring contact in which the contact portion of the lower contact pin of the third spring contact according to the present invention is bent twice at an angle of 90 degrees so as to form an S-shaped appearance.
Figure 33B:
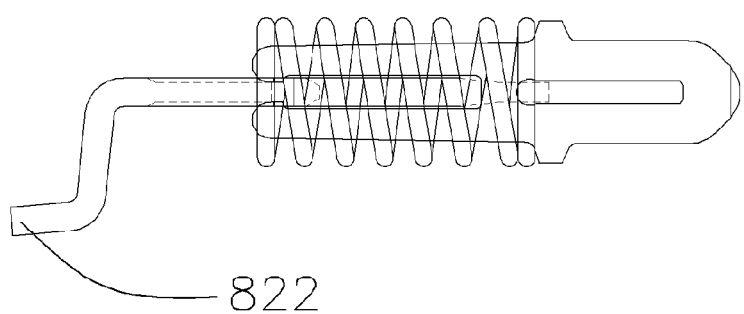
Figure 34A:
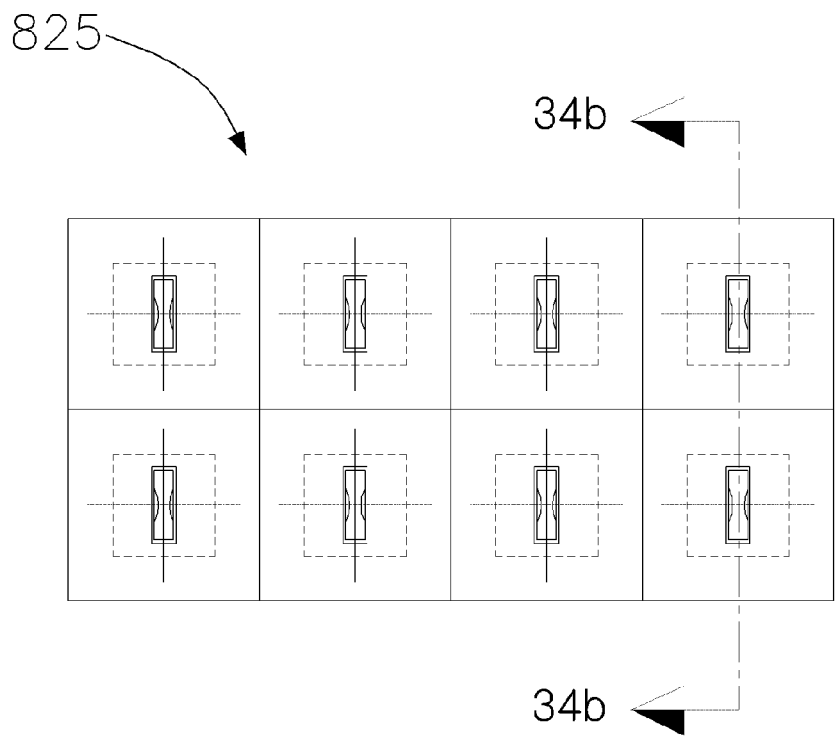
FIG. 34a is a plan view illustrating an angle SMT type socket that is embedded with multi-arrayed angle SMT type spring contacts in which the contact portion of the lower contact pin of the third spring contact according to the present invention is bent twice at the angle of 90 degrees so as to form the S-shaped appearance.
Figure 34B:
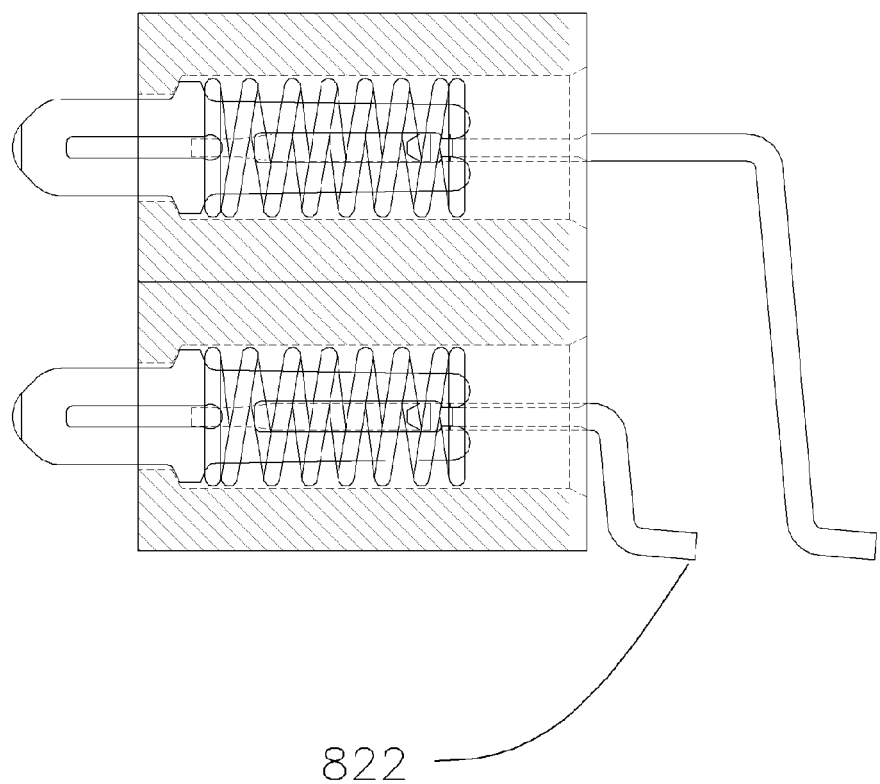
Figure 35A:
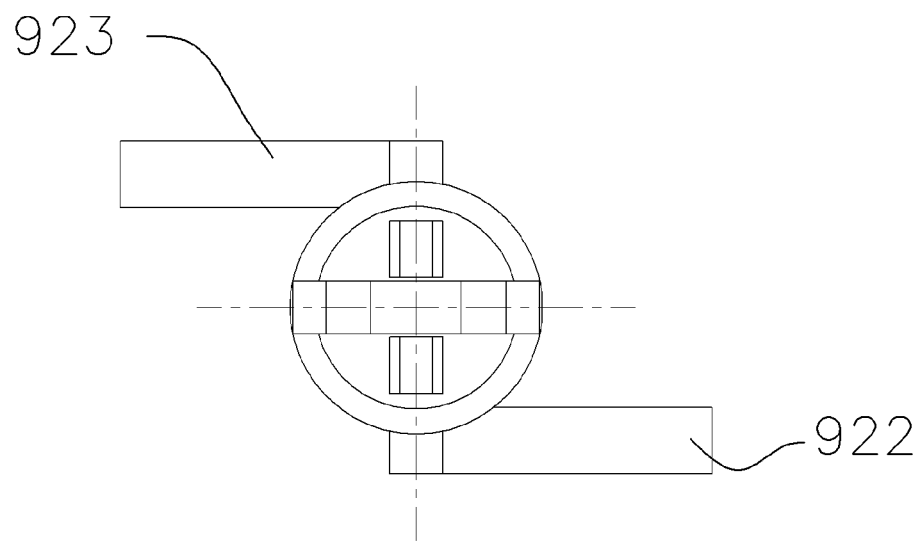
FIGS. 35a, 35b, 35c and 35d are a plan view, a front view, a right side view and a bottom view illustrating a vertical SMT type spring contact in which a pair of contact portions of the lower contact pin of the third spring contact according to the present invention are bent at angles of 90 degrees in opposite directions.
Figure 35B:
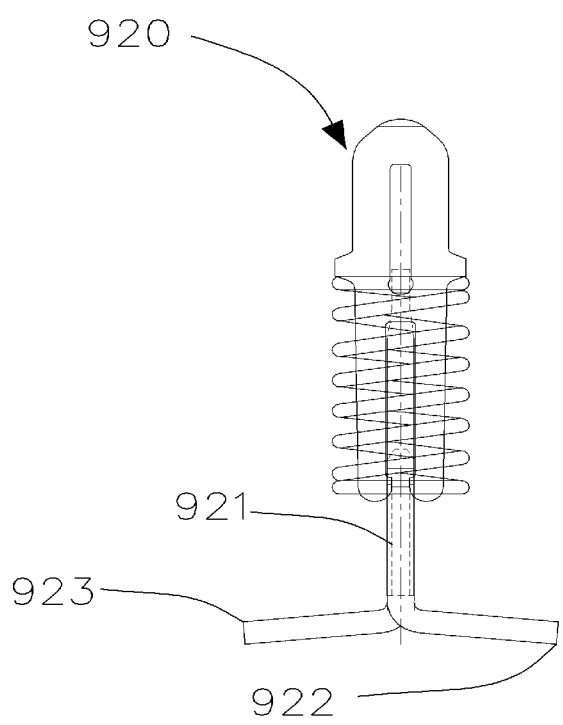
Figure 35C:
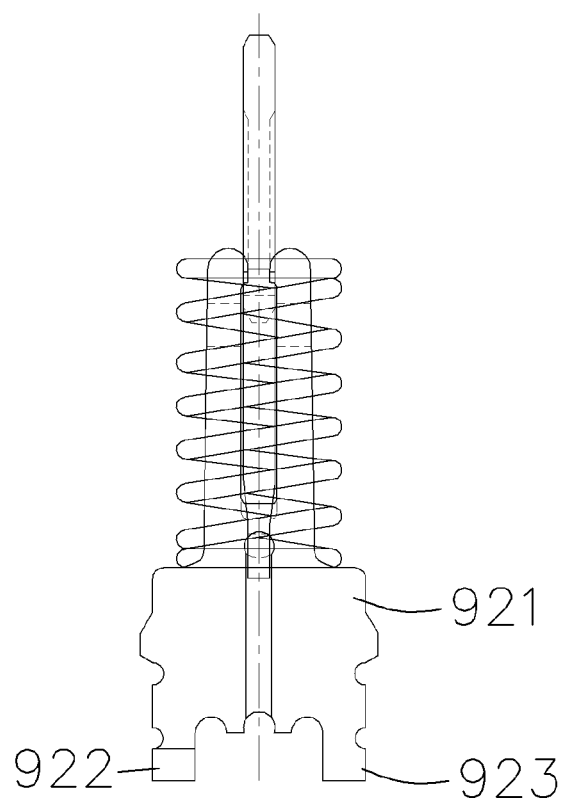
Figure 35D:
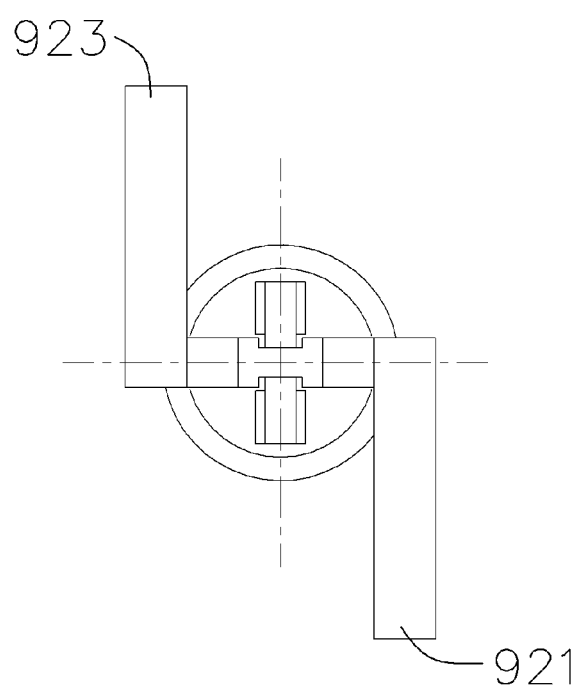

FIGS. 33a and 33b show a spring contact 820 in which the contact portion 822 of the lower contact pin 821 is bent twice at an angle of 90 degrees so as to form an S-shaped appearance. FIGS. 34a and 34b show an angle SMT type socket 825 that can be surface-mounted to a PCB by soldering.

Figure 36A:
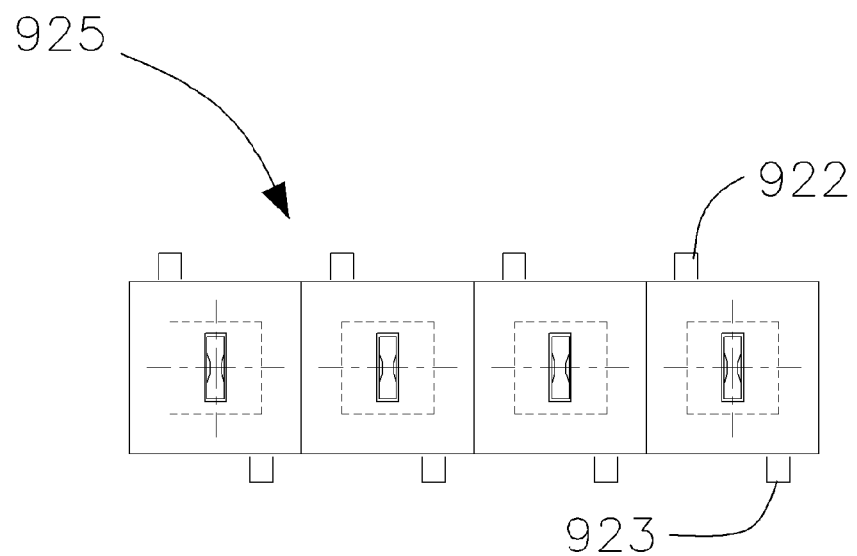
FIGS. 36a, 36b and 36c are a plan view, a front view and a right side view illustrating a socket that is embedded with vertical SMT type spring contacts in which the pair of contact portions of the lower contact pin of the third spring contact according to the present invention are bent at angles of 90 degrees in opposite directions.
Figure 36B:
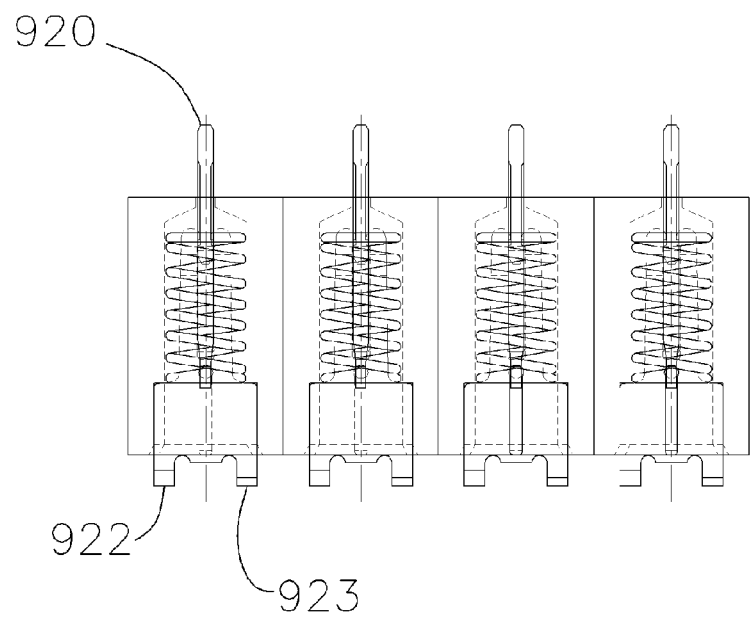
Figure 36C:
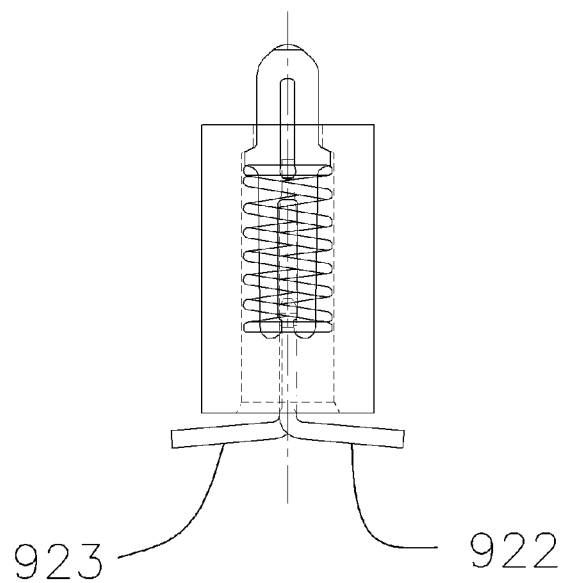

FIGS. 35a through 35d show a spring contact 920 in which the lower contact pin 921 has two contact portions 922 and 923 that are bent at angles of 90 degrees in opposite directions. FIGS. 36a through 36c show a vertical SMT type socket 925 that is embedded with spring contacts 920 and can be surface-mounted to a PCB by soldering, in which the lower contact pin 921 has two contact portions 922 and 923 that are bent at angles of 90 degrees in opposite directions.

Figure 37A:
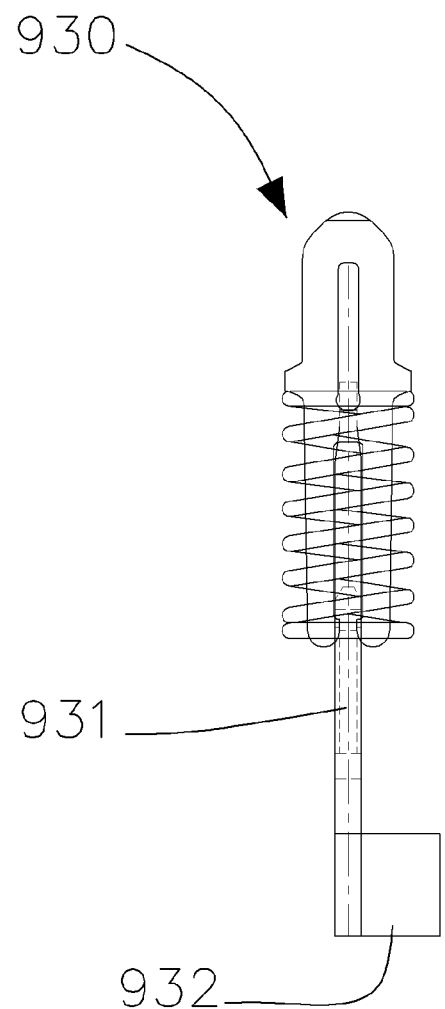
FIGS. 37a, 37b and 37c are a plan view and a right side view, the bottom view illustrating a wire type spring contact in which the contact portion of the lower contact pin of the third spring contact according to the present invention is bent so as to form a U-shaped appearance.
Figure 37B:
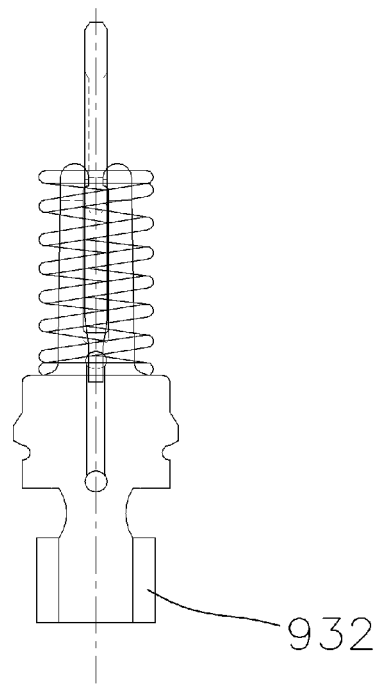
Figure 37C:
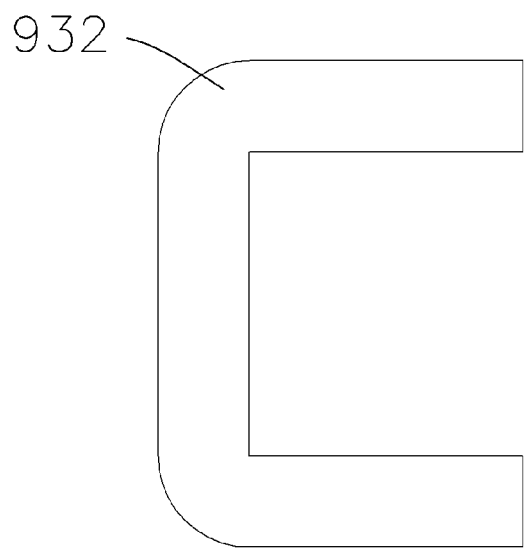
Figure 38:
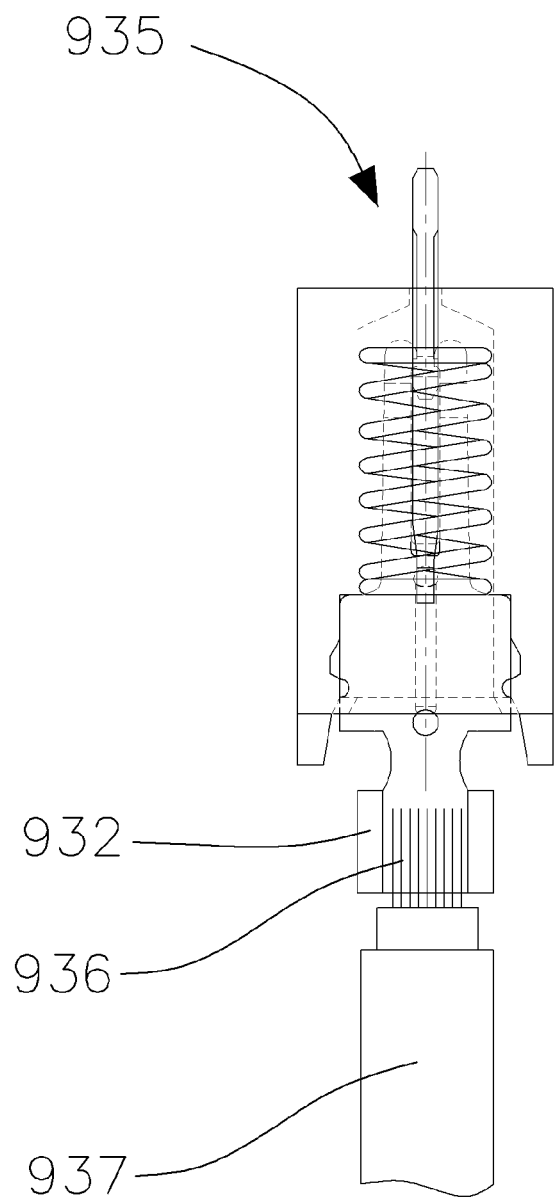
FIG. 38 is a plan view illustrating a socket that is embedded with spring contacts in which the contact portion of the lower contact pin of the third spring contact according to the present invention is bent so as to form the U-shaped appearance and is connected to a wire.

FIGS. 37a through 37c show a spring contact 930 in which the contact portion 932 of the lower contact pin 931 is bent so as to form a U-shaped appearance so that this spring contact can be connected to an electric cord 937 or a wire 936. FIG. 38 shows a socket 935 in which an electric cord 937 or a wire 936 can be connected to the U-shaped contact portion of the lower contact pin 931 by compressing or soldering.

Figure 39:
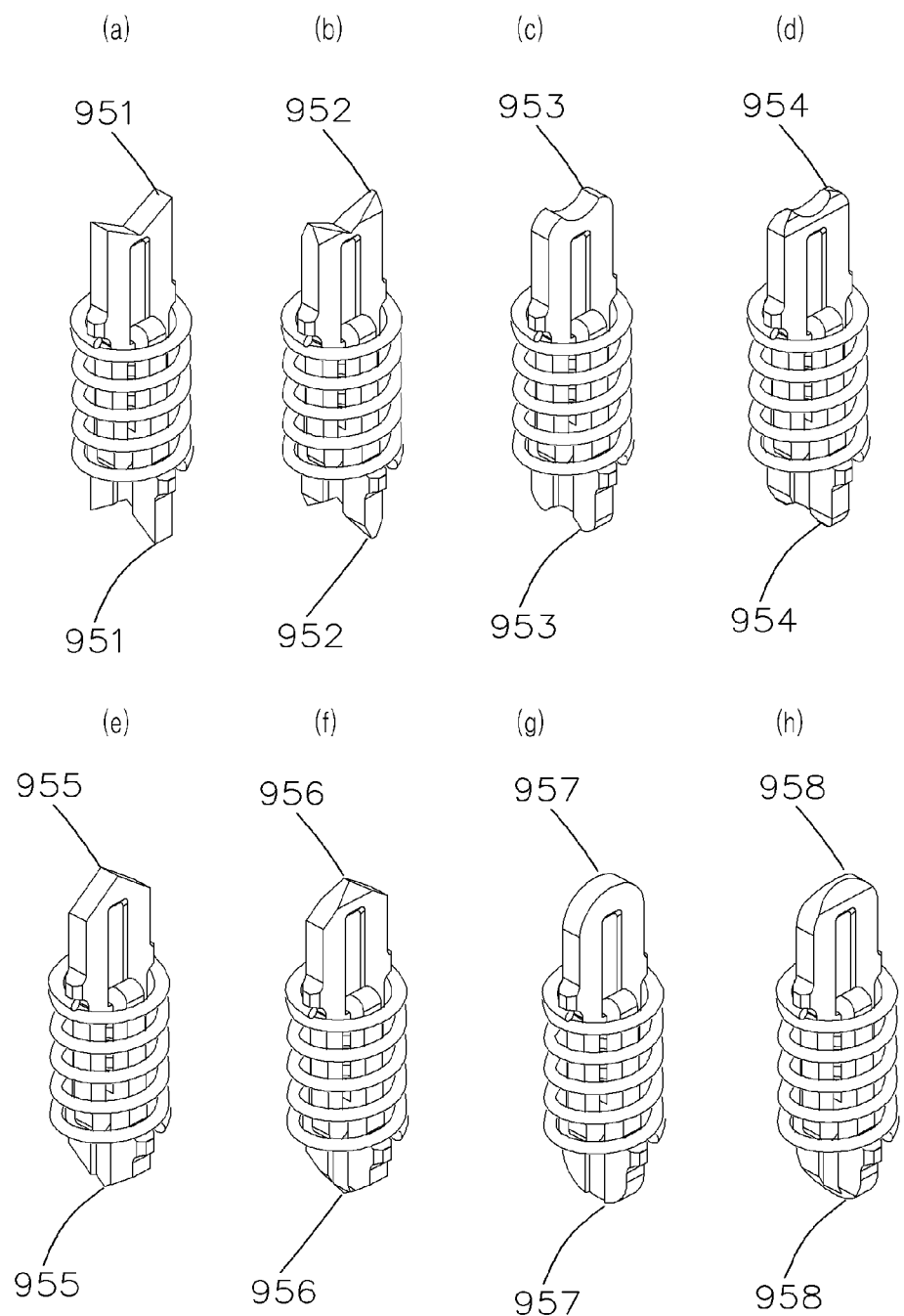
FIG. 39 is a view illustrating that the contact portions of the upper and lower contact pins according to the present invention may be configured into a variety of shapes, such as a V-shape, a chamfered V-shape, a U-shape, a chamfered U-shape, a A-shape, a chamfered A-shape, a round shape and a chamfered round shape.

Further, FIG. 39 show a variety of shapes of the contact portions 951, 952, 953, 954, 955, 956, 957, 958 of the upper and lower contact pins of the spring contact according to the present invention, which can be selected from a V-shape, a chamfered V-shape, a U-shape, a chamfered U-shape, a A-shape, a chamfered A-shape, a round shape and a chamfered round shape.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A spring contact, comprising:
a lower contact pin having a plate-shaped structure, the lower contact pin including
a body having a first thickness,
a contact portion having a predetermined shape, and
two spring holding protrusions provided in left and right sides of the lower contact pin;
an upper contact pin coupled to the lower contact pin in such a way that the lower contact in and the upper contact in cross each other at right angles, the upper contact pin having a same construction as that of the lower contact pin; and
a spring fitted over an assembly of the lower contact pin and the upper contact pin at a position between the upper and lower contact pins,
wherein the body of each of the lower contact pin and the upper contact pin has two symmetric elastic portions, an end of each of which has a second thickness that is less than the first thickness of the body, with an oblique surface, a locking protrusion and a locking protrusion contact surface being provided in the end of each of the two symmetric elastic portions, in which a moving slit is defined between the two elastic portions so as to form a moving space when the upper contact pin and the lower contact pin are assembled with each other, with a stop surface being formed on an end of the moving slit and having left and right oblique surfaces so that, when the upper contact pin is in contact with to the lower contact pin and compressed to a maximum, the stop surfaces of the two contact pins come into contact with each other and stop the compression, and moving grooves are formed in each of the lower and upper contact pins so that the locking protrusions of the lower and upper contact pins can be moved and stopped and the moving grooves of the lower and upper contact pins can be brought into electric contact with the locking protrusion contact surfaces of the lower and upper contact pins, in which the moving grooves are formed on upper and lower surfaces of each of the lower and upper contact pins, respectively, and first ends of the moving grooves of each of the lower and upper contact pins have a stop hole that forms a stop bridge for stopping the locking protrusions of an opposite contact pin, and second ends extend to an end of the contact portion after passing spring holding surfaces of the two spring holding pro- trusions that function to limit the length of the spring and to prevent the spring from being displaced.

2. The spring contact as set forth in claim 1, wherein the first ends of the moving grooves of each of the contact pins have a stop hole that forms a stop bridge for stopping the locking protrusions of the opposite contact pin, and the second ends extend in directions toward the contact portion after passing the spring holding surfaces of the two spring holding protrusions without reaching the end of the contact portion.

3. The spring contact as set forth in claim 1, wherein the first ends of the moving grooves are provided with a stop bridge for stopping the locking protrusions of the opposite contact pin without having the stop hole.

4. The spring contact as set forth in claim 1, wherein each of the moving grooves has a predetermined depth and a distance between bottoms of the opposite moving grooves of each contact pin is equal to, slightly longer than or slightly shorter than a distance between the contact surfaces of the locking protrusions of the two elastic portions.

5. The spring contact as set forth in claim 1, comprising a spring contact in which the upper contact pin has a plate-shaped structure similar to that of the lower contact pin, and the moving grooves of the upper contact pin further extend in the directions toward the contact portion after passing the spring holding surfaces of two spring holding protrusions without reaching the end of the contact portion, and the moving grooves of the lower contact pin extend to the end of the contact portion after passing the spring holding surfaces of the two spring holding protrusions so that, when the upper contact pin is compressed downward, a body end of the body of the upper contact pin reaches the end of the contact portion of the lower contact pin or pass by the end of the contact portion of the lower contact pin.

6. The spring contact as set forth in claim 5, wherein the upper contact pin and the lower contact pin have a same shape and a same size, in which the moving grooves extend to the end of the contact portion after passing the spring holding surfaces of the two holding protrusions, so that, when the upper contact pin is compressed downward, two body ends of the bodies of the upper contact pin and the lower contact pin reach the ends of the contact portions of the lower and upper contact pins or pass by the contact portions of the lower and upper contact pin and a maximum compressed length of the spring contact is equal to a length of the upper contact pin and the lower contact pin.

7. The spring contact as set forth in claim 1, wherein the contact portion of the lower contact pin has a shape different from that of the contact portion of the upper contact pin.

8. A socket embedded with spring contacts, comprising an upper plate, a lower plate and spring contacts, thereby forming the socket embedded with the spring contacts, wherein each of the upper plate and the lower plate includes one or a plurality of receiving holes for receiving a predetermined number of spring contacts, and the upper plate and the lower plate are assembled with each other, in which a plurality of locking protrusions is formed in the upper or lower plate and corresponding stop bridges are formed in the lower or upper plate so as to allow the locking protrusions to be assembled with the stop bridges so that, when the upper plate and the lower plate are assembled with each other, the locking protrusions can be assembled with the corresponding stop bridges, in which a longitudinal hole is formed in a side of each of the locking protrusions or in a side of each of the stop bridges so that thin elastic portions are formed in opposite sides of the locking protrusion or in opposite sides of the stop bridge, thereby allowing the locking protrusions or the stop bridges to be elastically deformed when the locking protrusions are assembled with or disassembled from the corresponding stop bridges.

9. A socket embedded with spring contacts, comprising an upper plate, a lower plate and spring contacts, thereby forming the socket embedded with the spring contacts, wherein each of the upper plate and the lower plate includes one or a plurality of contact receiving holes for receiving a predetermined number of the spring contacts, in which an outside appearance of each of the contact receiving holes that are formed on the upper plate is shaped in a form of a column so that a space is defined between the columns, in which the upper plate is covered with an electromagnetic shielding plate that is provided with holes at locations corresponding to the columns so as to receive the columns, thereby forming an electromagnetic shielding socket structure in which the electromagnetic shielding plate is electrically connected to a ground of a printed circuit board (PCB) when the socket is assembled with the PCB.

10. The spring contact as set forth in claim 1, wherein the contact portion of a predetermined shape of the upper contact pin or the lower contact pin eccentrically extends from a center of the body, thereby forming an eccentric spring contact in which the contact portion of the lower contact pin is offset from the contact portion of the upper contact pin.

11. A socket embedded with spring contacts, comprising:
an upper plate, a lower plate and a plurality of guide pins, thereby forming the socket in which a plurality of spring contact receiving holes having predetermined shapes is formed in each of the upper plate and the lower plate; and
the spring contacts including
a first spring contact, of which a contact portion of a lower contact pin is offset from a contact portion of an upper contact pin, and
a second spring contact, of which a contact portion of a lower contact pin is concentric with a contact portion of an upper contact pin; and
a third spring contact having an offset different from the offset of the first spring contact between an upper and lower contact portions,
wherein the spring contacts are arranged in the spring contact receiving holes in order of the third spring contact, the first spring contact, the second spring contact, the first spring contact and the third spring contact.

12. A spring contact, comprising:
a lower contact pin including
a contact portion having a plate-shaped structure,
a body having a first thickness, and
two spring holding surfaces provided in left and right sides of the lower contact pin;
an upper contact pin coupled to the lower contact pin in such a way that the lower contact pin and the upper contact pin cross each other at right angles, the upper contact pin having
a contact portion of a predetermined shape,
two spring holding protrusions and two spring holding surfaces that are provided in left and right sides of the contact pin, and
a body having the first thickness; and
a spring fitted over an assembly of the lower contact pin and the upper contact pin at a position between the upper and lower contact pins,
wherein the body of each of the lower contact pin and the upper contact pin has two symmetric elastic portions, an end of each of which has a second thickness that is less than the first thickness, with an oblique surface, a locking protrusion and a locking protrusion contact surface being provided in the end of each of the two symmetric elastic portions, in which a moving slit is defined between the two elastic portions so as to form a moving space when the upper contact pin and the lower contact pin are assembled with each other, with a stop surface being formed on an end of the moving slit and having left and right oblique surfaces so that, when the upper contact pin is compressed against the lower contact pin to a maximum, the stop surfaces of the two contact pins come into contact with each other and stop the compression, and moving grooves are formed in each of the lower and upper contact pins so that the locking protrusions of the lower and upper contact pins can be moved and stopped, and the moving grooves of the lower and upper contact pins are brought into electric contact with the locking protrusion contact surfaces of the lower and upper contact pins, in which the moving grooves are formed on upper and lower surfaces of each of the lower and upper contact pins, respectively, first ends of the moving grooves of each of the lower and upper contact pins have a stop hole that forms a stop bridge for stopping the locking protrusions of an opposite contact pin, and second ends extend in directions toward the contact portion after passing the spring holding surfaces that function to limit the length of the spring and to prevent the spring from being undesirably displaced; and the two spring holding surfaces of the lower contact pin further extend so as to form an assembly stop surface for inserting the lower contact pin into a molded socket body under pressure, in which the spring holding protrusions further extend in opposite directions, with a pressure holding protrusion being formed on an end surface of each of the spring holding protrusions so as to prevent the lower contact pin from being displaced after the lower contact pin has been inserted into the molded socket body, thereby forming a spring contact in which the contact portion of the lower contact pin can be soldered to a printed circuit board (PCB).

13. The spring contact as set forth in claim 12, wherein each of the moving grooves that are formed in the body of each of the lower contact pin and the upper contact pin has a predetermined depth and a distance between bottoms of the opposite moving grooves of each contact pin is equal to, slightly longer than or slightly shorter than a distance between the contact surfaces of the locking protrusions of the two elastic portions.

14. The spring contact as set forth in claim 13, wherein the first ends of the moving grooves of each of the lower and upper contact pins have the stop hole that forms the stop bridge for stopping the locking protrusions of the opposite contact pin, and the second ends extend in the directions toward the contact portion after passing the spring holding surfaces that function to limit the length of the spring and to prevent the spring from being undesirably displaced, with a hole being formed between the extended ends of the opposite moving grooves.

15. A socket embedded with spring contacts, comprising one or a plurality of spring contacts, each of the spring contacts including:
  a lower contact pin having
    a contact portion of a predetermined plate shape,
    a body having a first thickness, and
    two spring holding surfaces provided in left and right sides of the lower contact pin;
  an upper contact pin coupled to the lower contact pin in such a way that the lower contact in and the upper contact in cross each other at right angles, the upper contact pin having
    a contact portion of a predetermined plate shape,
    two spring holding protrusions and two spring holding surfaces that are provided in left and right sides of the contact pin, and
    a body; and
  a spring fitted over an assembly of the lower contact pin and the upper contact pin at a position between the upper and lower contact pins,
  wherein the body of each of the lower contact pin and the upper contact pin has two symmetric elastic portions, an end of each of which has a second thickness that is less than the first thickness, with an oblique surface, a locking protrusion and a locking protrusion contact surface being provided in the end of each of the two symmetric elastic portions, in which a moving slit is defined between the two elastic portions so as to form a moving space when the upper contact pin and the lower contact pin are assembled with each other, with a stop surface being formed on an end of the moving slit and having left and right oblique surfaces so that, when the upper contact pin is compressed against the lower contact pin to a maximum, the stop surfaces of the two contact pins come into contact with each other and stop the compression, in which moving grooves are formed in each of the lower and upper contact pins so that the locking protrusions of the lower and upper contact pins can be moved and stopped, and the moving grooves are brought into electric contact with the locking protrusion contact surfaces of the lower and upper contact pins, in which the moving grooves are formed on upper and lower surfaces of each of the lower and upper contact pins, respectively, first ends of the moving grooves of each of the lower and upper contact pins have a stop hole that forms a stop bridge for stopping the locking protrusions of an opposite contact pin, and second ends extend in directions toward the contact portion after passing the spring holding surfaces that function to limit the length of the spring and to prevent the spring from being undesirably displaced; and
  the two spring holding surfaces of the lower contact pin further extend so as to form an assembly stop surface, with spring holding protrusions further extending in opposite directions, with a pressure holding protrusion being formed on an end surface of each of the spring holding protrusions so as to insert the lower contact pin into a molded socket body, in which the contact portion of the lower contact pin can be soldered to a printed circuit board (PCB), the molded socket body is provided with receiving holes for receiving one or a plurality of spring contacts, a through hole is formed in a first end of each of the receiving holes so as to allow the contact portion of the upper contact pin to be exposed outside the receiving hole, opposite fitting steps are formed in a second end of the receiving hole so as to exert pressure that holds the pressure holding protrusions that are formed on the end surfaces of the two extended spring holding protrusions of the lower contact pin, in which both a distance between opposing side walls of the two fitting steps and a width of each of the two fitting steps are determined according to both a distance between the opposite end surfaces of the spring holding protrusions of the spring contact and a thickness of the lower contact pin, pressure stop surfaces are formed in the molded socket body so as to stop the assembly stop surfaces that are formed on the extended spring holding surfaces of the lower contact pin, and socket stand-offs are formed in a lower end of the molded socket body so as to allow the socket to be efficiently soldered to the PCB, so that the spring contact is received in the receiving hole of the molded socket body in a state in which the upper contact pin can be vertically moved through the through hole and the contact portion of the lower contact pin can be soldered to the PCB.

16. The spring contact as set forth in claim 12, wherein the contact portion of the lower contact pin extends vertically and straight so that the spring contact is used as a spring contact of a through hole soldered socket that can be soldered to a through hole of the PCB.

17. The spring contact as set forth in claim 12, wherein the contact portion of the lower contact pin to be soldered to the PCB is bent at an angle of 90 degrees so that the spring contact is used as a spring contact of an angle type through hole soldered socket that can be soldered to a through hole of the PCB.

18. The spring contact as set forth in claim 12, wherein the contact portion of the lower contact pin to be soldered to the PCB is configured into a short straight contact portion so that the spring contact is used as a spring contact of a vertical surface-mount technology (SMT) type socket that can be vertically surface-mounted to the PCB by soldering.

19. The spring contact as set forth in claim 12, wherein the contact portion of the lower contact pin to be soldered to the PCB is bent twice at an angle of 90 degrees so as to form an S-shaped appearance so that the spring contact is used as a spring contact of an angle surface-mount technology (SMT) type socket that can be surface-mounted to the PCB by soldering.

20. The spring contact as set forth in claim 12, wherein the lower contact pin to be soldered to the PCB has two contact portions that are bent at angles of 90 degrees in opposite directions so that the spring contact is used as a spring contact of a vertical SMT type socket that can be surface-mounted to the PCB by soldering.

21. The spring contact as set forth in claim 12, wherein the contact portion of the lower contact pin to be soldered to the PCB is bent so as to form a U-shaped appearance so that the spring contact can be connected to an electric cord or a wire.

22. The spring contact as set forth in claim 1, wherein the contact portion of the upper and lower contact pins has a shape of selected from a V-shape, a chamfered V-shape, a U-shape, a chamfered U-shape, a A-shape, a chamfered A-shape, a round shape and a chamfered round shape.

* * * * *